(12) United States Patent
Wang et al.

(10) Patent No.: US 11,930,681 B2
(45) Date of Patent: Mar. 12, 2024

(54) DISPLAY PANEL AND DISPLAY DEVICE

(71) Applicant: BOE TECHNOLOGY GROUP CO., LTD., Beijing (CN)

(72) Inventors: Hongli Wang, Beijing (CN); Chang Luo, Beijing (CN); Lei Chen, Beijing (CN); Kening Zheng, Beijing (CN); Chen Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 227 days.

(21) Appl. No.: 17/355,739

(22) Filed: Jun. 23, 2021

(65) Prior Publication Data

US 2022/0069027 A1   Mar. 3, 2022

(30) Foreign Application Priority Data

Sep. 1, 2020  (CN) .......................... 202010902686.9

(51) Int. Cl.
*H10K 59/35* (2023.01)
*G09G 3/20* (2006.01)
(Continued)

(52) U.S. Cl.
CPC ......... *H10K 59/353* (2023.02); *G09G 3/2003* (2013.01); *G09G 3/3225* (2013.01);
(Continued)

(58) Field of Classification Search
None
See application file for complete search history.

(56) References Cited

U.S. PATENT DOCUMENTS 10,777,621 B2   9/2020   Lee et al.
11,171,288 B2   11/2021  Jang et al.
(Continued)

FOREIGN PATENT DOCUMENTS

CN   109696986 A   4/2019
CN   208970513 U   6/2019
(Continued)

OTHER PUBLICATIONS

Machine Translation of Luo et al. CN 110416267, corresponding with US 2021/0036066 (Year: 2019).*
(Continued)

*Primary Examiner* — Erik T. K. Peterson
*Assistant Examiner* — Christopher A. Schodde
(74) *Attorney, Agent, or Firm* — Collard & Roe, P.C.; William Collard

(57) ABSTRACT

A display panel and a display device are provided. The display panel includes a first color sub-pixels and a second color sub-pixel. The first color sub-pixel includes a first effective light emitting region, the second color sub-pixel includes a second effective light emitting region, an area of the second effective light emitting region is smaller than that of the first effective light emitting region. The first color sub-pixel includes a first color light emitting layer, the second color sub-pixel includes a second color light emitting layer, an area ratio between orthographic projections of the first color light emitting layer and the first effective light emitting region on the base substrate is less than an area ratio between orthographic projections of the second color light emitting layer and the second effective light emitting region on the base substrate.

20 Claims, 19 Drawing Sheets

(51) Int. Cl.
| | |
|---|---|
| *G09G 3/3225* | (2016.01) |
| *H10K 50/813* | (2023.01) |
| *H10K 50/822* | (2023.01) |
| *H10K 50/84* | (2023.01) |
| *H10K 59/121* | (2023.01) |
| *H10K 59/122* | (2023.01) |
| *H10K 59/124* | (2023.01) |
| *H10K 59/131* | (2023.01) |
| *H10K 59/40* | (2023.01) |

(52) U.S. Cl.
CPC ......... *H10K 50/813* (2023.02); *H10K 50/822* (2023.02); *H10K 50/84* (2023.02); *H10K 59/121* (2023.02); *H10K 59/122* (2023.02); *H10K 59/124* (2023.02); *H10K 59/131* (2023.02); *H10K 59/352* (2023.02); *H10K 59/40* (2023.02); *G09G 2300/0452* (2013.01)

(56) References Cited

U.S. PATENT DOCUMENTS

| | | | |
|---|---|---|---|
| 2019/0179466 A1* | 6/2019 | Kim | ...................... G06F 3/0446 |
| 2019/0319076 A1 | 10/2019 | Lee et al. | |
| 2020/0119113 A1 | 4/2020 | Lee et al. | |
| 2020/0235172 A1 | 7/2020 | Lee et al. | |
| 2020/0273924 A1 | 8/2020 | Xiao et al. | |
| 2021/0036066 A1* | 2/2021 | Luo | ...................... H10K 71/166 |

FOREIGN PATENT DOCUMENTS

| | | | | |
|---|---|---|---|---|
| CN | 209312770 U | | 8/2019 | |
| CN | 110416267 A | * | 11/2019 | ........... G06F 30/392 |
| CN | 110416267 A | | 11/2019 | |
| CN | 110578112 A | | 12/2019 | |
| CN | 110607497 A | | 12/2019 | |
| CN | 111063706 A | | 4/2020 | |

OTHER PUBLICATIONS

Extended European Search Report dated Feb. 7, 2022 in European Application No. 21191964.2.

* cited by examiner

DISPLAY PANEL AND DISPLAY DEVICE

The present application claims priority of Chinese Patent Application No. 202010902686.9, filed on Sep. 1, 2020, and the entire content disclosed by the Chinese patent application is incorporated herein by reference as part of the present application for all purposes.

TECHNICAL FIELD

At least one embodiment of the present disclosure relates to a display panel and a display device.

BACKGROUND

Organic light emitting display devices are listed as a next generation display technology with great development prospects due to their advantages of light weight and thin thickness, being bendable, low power consumption, wide color gamut and high contrast, etc. At present, how to improve the display quality of organic light emitting display devices is the research focus of organic light emitting display devices.

SUMMARY

At least an embodiment of the present disclosure provides a display panel and a display device.

At least an embodiment of the present disclosure provides a display panel, comprising: a base substrate, comprising a display region and a peripheral region located at a periphery of the display region; a plurality of first color sub-pixels, located in the display region, the plurality of first color sub-pixels being arranged along a first direction to form a plurality of first color sub-pixel rows, the plurality of first color sub-pixel rows being arranged along a second direction, and adjacent first color sub-pixel rows in the plurality of first color sub-pixel rows are shifted with each other along the first direction; a plurality of second color sub-pixels, located in the display region, and arranged in an array along the first direction and the second direction, and four second color sub-pixels surrounding one first color sub-pixel; a pixel defining layer, located in the display region and the peripheral region, the pixel defining layer comprising a plurality of openings to define effective light emitting regions of a plurality of sub-pixels, the plurality of first color sub-pixels comprising a plurality of first effective light emitting regions, the plurality of second color sub-pixels comprising a plurality of second effective light emitting regions, and an area of one of the plurality of second effective light emitting regions being smaller than an area of one of the plurality of first effective light emitting regions. The plurality of first color sub-pixels comprise a plurality of first color light emitting layers located in corresponding openings and on the pixel defining layer surrounding the corresponding openings, the plurality of second color sub-pixels comprise a plurality of second color light emitting layers located in corresponding openings and on the pixel defining layer surrounding the corresponding openings, the plurality of first color light emitting layers included in the plurality of first color sub-pixels are spaced apart from each other, and the plurality of second color light emitting layers included in the plurality of second color sub-pixels are spaced apart from each other; an area ratio between orthographic projections of the first color light emitting layer and the first effective light emitting region corresponding to a same first color sub-pixel on the base substrate is a first area ratio, an area ratio between orthographic projections of the second color light emitting layer and the second effective light emitting region corresponding to a same second color sub-pixel on the base substrate is a second area ratio, and the first area ratio is less than the second area ratio.

For example, in an embodiment of the present disclosure, the first area ratio and the second area ratio are in a range from 1 to 15.

For example, in an embodiment of the present disclosure, the first area ratio is in a range from 2 to 6, and the second area ratio is in a range from 4 to 9.

For example, in an embodiment of the present disclosure, at least part of the plurality of second effective light emitting regions have a length direction and a width direction, the length direction is an extending direction of a connecting line between two points farthest from each other in one of the plurality of second effective light emitting regions, and the width direction is substantially perpendicular to the length direction of the one of the plurality of second effective light emitting regions; for one second effective light emitting region, along the length direction, a ratio of a maximum size of the second color light emitting layer corresponding to the second effective light emitting region to a maximum size of the second effective light emitting region is a first ratio, and along the width direction, a ratio of a maximum size of the second color light emitting layer corresponding to the second effective light emitting region to a maximum size of the second effective light emitting region is a second ratio, and the first ratio is less than the second ratio.

For example, in an embodiment of the present disclosure, for one second effective light emitting region, along the length direction, a difference between the maximum size of the second color light emitting layer and the maximum size of the second effective light emitting region is a first difference, and along the width direction, a difference between the maximum size of the second color light emitting layer and the maximum size of the second effective light emitting region is a second difference, and the first difference is less than the second difference.

For example, in an embodiment of the present disclosure, a ratio of the maximum size of the second color light emitting layer along the length direction of the corresponding second effective light emitting region to the maximum size of the second color light emitting layer along the width direction of the corresponding second effective light emitting region is less than a ratio of the maximum size of the second effective light emitting region along the length direction thereof to the maximum size of the second effective light emitting region along the width direction thereof.

For example, in an embodiment of the present disclosure, the display panel further comprises: a plurality of third color sub-pixels, located in the display region, the plurality of first color sub-pixels and the plurality of third color sub-pixels being alternately arranged along the first direction and the second direction, the plurality of first color sub-pixels and the plurality of second color sub-pixels being alternately arranged along a third direction as a first group, the plurality of third color sub-pixels and the plurality of second color sub-pixels being alternately arranged along the third direction as a second group, the first group and the second group being alternately arranged along a fourth direction, and the third direction and the fourth direction being intersected with both of the first direction and the second direction. The plurality of third color sub-pixels comprise a plurality of third light emitting regions, an area of one of the plurality of second effective light emitting regions being smaller than an area of one of the plurality of third effective light emitting regions, the plurality of third color sub-pixels comprise a plurality of third color light emitting layers located in corresponding openings and on the pixel defining layer surrounding the corresponding openings, and the plurality of third color light emitting layers included in the plurality of third color sub-pixels are spaced apart from each other, an area ratio between orthographic projections of the third color light emitting layer and the third effective light emitting region corresponding to a same third color sub-pixel on the base substrate is a third area ratio, and the third area ratio is less than the second area ratio.

For example, in an embodiment of the present disclosure, an area of the first effective light emitting region of one of the plurality of first color sub-pixels is smaller than an area of the third effective light emitting region of one of the plurality of third color sub-pixels, and the first area ratio is greater than the third area ratio.

For example, in an embodiment of the present disclosure, the third area ratio is in a range from 1 to 15.

For example, in an embodiment of the present disclosure, the third area ratio is in a range from 1.5 to 7.

For example, in an embodiment of the present disclosure, each of the plurality of sub-pixels further comprises a first electrode and a second electrode of an organic light emitting element, the second electrode of the organic light emitting element is located at one side of a light emitting layer of the organic light emitting element and the pixel defining layer facing the base substrate, the second electrode of an organic light emitting element in each of the plurality of sub-pixels comprises a main body electrode, and in a direction from a center of an effective light emitting region to an edge of the effective light emitting region, a size of an overlapping part between the main body electrode and the pixel defining layer is not greater than a size of an overlapping part between the light emitting layer and the pixel defining layer.

For example, in an embodiment of the present disclosure, the display panel further comprises: a plurality of third color sub-pixels, located in the display region, the plurality of first color sub-pixels and the plurality of third color sub-pixels being alternately arranged along the first direction and the second direction, the plurality of first color sub-pixels and the plurality of second color sub-pixels being alternately arranged along a third direction as a first group, the plurality of third color sub-pixels and the plurality of second color sub-pixels being alternately arranged along the third direction as a second group, the first group and the second group being alternately arranged along a fourth direction, and the third direction and the fourth direction being intersected with both of the first direction and the second direction. The plurality of third color sub-pixels comprise a plurality of third light emitting regions, the plurality of third color sub-pixels comprise a plurality of third color light emitting layers located in corresponding openings and on the pixel defining layer surrounding the corresponding openings, and the plurality of third color light emitting layers included in the plurality of third color sub-pixels are spaced apart from each other, the display panel further comprises: an encapsulation layer, located in the display region and the peripheral region; a first touch electrode layer, located at one side of the encapsulation layer away from the base substrate, the first touch electrode layer comprising a plurality of first touch electrodes extending along the first direction and a plurality of second touch electrodes extending along the second direction, each of the plurality of first touch electrodes comprising a plurality of first touch electrode units, each of the plurality of second touch electrodes comprising a plurality of second touch electrode units, the first touch electrode layer comprising a plurality of touch electrode lines, the plurality of touch electrode lines being intersected to form a plurality of first meshes, and both of each first touch electrode unit and each second touch electrode unit comprising a plurality of communicated first meshes; a second touch electrode layer, comprising a plurality of connection bridges, the second touch electrode layer comprising a plurality of bridge lines, the plurality of bridge lines being intersected to form a plurality of second meshes, each of the plurality of connection bridges comprising a plurality of communicated second meshes, and adjacent second touch electrode units being electrically connected through at least one connection bridge; a touch insulation layer, located between the first touch electrode layer and the second touch electrode layer, and the second touch electrode unit being electrically connected with the connection bridge through a via hole penetrating through the touch insulation layer, an orthographic projection of the plurality of touch electrode lines in the display region on the base substrate is located within an orthographic projection of the pixel defining layer on the base substrate.

For example, in an embodiment of the present disclosure, in the display region, an orthographic projection of an effective light emitting region of each of the plurality of sub-pixels on the base substrate is within an orthographic projection of each of the plurality of first meshes on the base substrate; a ratio of an opening area of the first mesh corresponding to the first color sub-pixel to an area of the first effective light emitting region, and a ratio of an opening area of the first mesh corresponding to the third color sub-pixel to an area of the third effective light emitting region, are both less than a ratio of an opening area of the first mesh corresponding to the second color sub-pixel to an area of the second effective light emitting region.

For example, in an embodiment of the present disclosure, each of the plurality of sub-pixels further comprises a first electrode and a second electrode of an organic light emitting element, the second electrode of the organic light emitting element is located at one side of a light emitting layer of the organic light emitting element and the pixel defining layer facing the base substrate, each of the plurality of sub-pixels further comprises a pixel circuit between the second electrode of the organic light emitting element and the base substrate, and the pixel circuit comprises a driving transistor; at least one selected from the group consisting of the second electrode of the organic light emitting element of the first color sub-pixel, the second electrode of the organic light emitting element of the second color sub-pixel and the second electrode of the organic light emitting element of the third color sub-pixel, is overlapped with the touch electrode line; and/or the driving transistor of at least one selected from the group consisting of the first color sub-pixel, the second color sub-pixel and the third color sub-pixel, is overlapped with the touch electrode line.

For example, in an embodiment of the present disclosure, the driving transistor in the second color sub-pixel is overlapped with the touch electrode line, and the second electrode of the organic light emitting element of the second color sub-pixel is substantially not overlapped with the touch electrode line; in the first color sub-pixel, the driving transistor is overlapped with the second electrode of the organic light emitting element, but substantially not overlapped with the touch electrode line, and the second electrode of the organic light emitting element is overlapped with the touch electrode line; in the third color sub-pixel, the driving transistor is overlapped with the second electrode of the organic light emitting element, but substantially not overlapped with the touch electrode line, and the second electrode of the organic light emitting element is overlapped with the touch electrode line.

For example, in an embodiment of the present disclosure, in the second color sub-pixel, both the second electrode of the organic light emitting element and the driving transistor are overlapped with the touch electrode line; in the first color sub-pixel, both the second electrode of the organic light emitting element and the driving transistor are substantially not overlapped with the touch electrode line; and in the third color sub-pixel, both the second electrode of the organic light emitting element and the driving transistor are substantially not overlapped with the touch electrode line.

For example, in an embodiment of the present disclosure, in the second color sub-pixel, both the second electrode of the organic light emitting element and the driving transistor are substantially not overlapped with the touch electrode line; in the first color sub-pixel, both the second electrode of the organic light emitting element and the driving transistor are overlapped with the touch electrode line; and in the third color sub-pixel, both the second electrode of the organic light emitting element and the driving transistor are overlapped with the touch electrode line.

For example, in an embodiment of the present disclosure, in the first color sub-pixel, the second electrode of the organic light emitting element is not overlapped with the driving transistor or the touch electrode line, and the driving transistor is overlapped with the touch electrode line; in the third color sub-pixel, the second electrode of the organic light emitting element is not overlapped with the driving transistor or the touch electrode line, and the driving transistor is overlapped with the touch electrode line; in the second color sub-pixel, the second electrode of the organic light emitting element is overlapped with the driving transistor and the touch electrode line, and the driving transistor is overlapped with the touch electrode line.

For example, in an embodiment of the present disclosure, the pixel circuit of each of the plurality of sub-pixels further comprises a data writing transistor and a threshold compensation transistor; a first electrode of the data writing transistor is electrically connected with a first electrode of the driving transistor, a second electrode of the data writing transistor is electrically connected with a data line to receive a data signal, and a gate electrode of the data writing transistor is electrically connected with a scan signal line to receive a scan signal; a first electrode of the threshold compensation transistor is electrically connected with a second electrode of the driving transistor, a second electrode of the threshold compensation transistor is electrically connected with a gate electrode of the driving transistor, and a gate electrode of the threshold compensation transistor is electrically connected with the scan signal line to receive a compensation control signal; the data writing transistor of the pixel circuit of at least one selected from the group consisting of the first color sub-pixel, the second color sub-pixel and the third color sub-pixel is overlapped with the touch electrode line, and/or, the threshold compensation transistor of the pixel circuit of at least one selected from the group consisting of the first color sub-pixel, the second color sub-pixel and the third color sub-pixel is overlapped with the touch electrode line.

For example, in an embodiment of the present disclosure, in the first color sub-pixel, the second electrode of the organic light emitting element is overlapped with at least one of the threshold compensation transistor and the data writing transistor, and neither of threshold compensation transistor and the data writing transistor and the data writing transistor is overlapped with the touch electrode line; in the third color sub-pixel, the second electrode of the organic light emitting element is overlapped with at least one of the threshold compensation transistor and the data writing transistor, and neither of threshold compensation transistor and the data writing transistor is overlapped with the touch electrode line; and in the second color sub-pixel, the second electrode of the organic light emitting element is not overlapped with the threshold compensation transistor or the data writing transistor, and at least one of the threshold compensation transistor and the data writing transistor is overlapped with the touch electrode line.

For example, in an embodiment of the present disclosure, in the first color sub-pixel, the second electrode of the organic light emitting element is overlapped with at least one of the threshold compensation transistor and the data writing transistor; in the third color sub-pixel, the second electrode of the organic light emitting element is overlapped with at least one of the threshold compensation transistor and the data writing transistor; and in the second color sub-pixel, the second electrode of the organic light emitting element is overlapped with the threshold compensation transistor, and the data writing transistor is overlapped with the touch electrode line.

At least an embodiment of the present disclosure provides a display device, comprising the display panel as mentioned above.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1A:
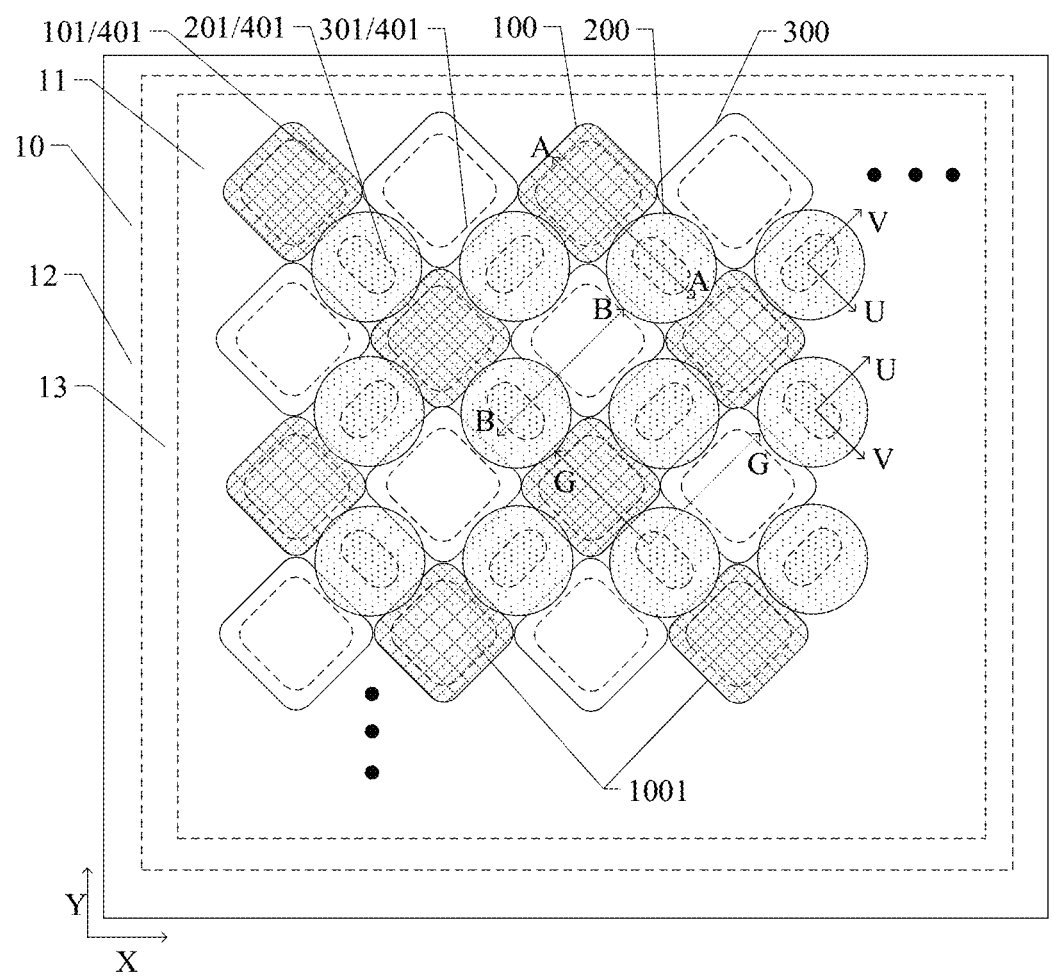
FIG. 1A is a partial planar structural view of a display panel provided by an example of an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

In research, the inventors of the present application have found that: with the continuous development of display technology, people have higher and higher requirements for the resolution of display devices, and the application range from high-resolution display devices having advantages of high display quality, etc., is becoming wider and wider. Generally, the resolution of a display device can be improved by reducing the size of the pixel and reducing the spacing between pixels. However, the reduction of the size of the pixel and the reduction of the spacing between pixels require higher and higher requirements for the precision of the manufacturing process, which leads to the difficulty of the manufacturing process and the increase of the manufacturing cost of the display device.

The embodiments of the present disclosure provide a display panel and a display device. The display panel includes: a base substrate, including a display region and a peripheral region located at the periphery of the display region; a plurality of first color sub-pixels, located in the display region, the plurality of first color sub-pixels being arranged along a first direction to form a plurality of first color sub-pixel rows, the plurality of first color sub-pixel rows being arranged along a second direction, and adjacent first color sub-pixel rows in the plurality of first color sub-pixel rows are shifted with each other along the first direction; a plurality of second color sub-pixels, located in the display region, and arrayed along the first direction and the second direction, and four second color sub-pixels surrounding one first color sub-pixel; a pixel defining layer, located in the display region and the peripheral region, the pixel defining layer including a plurality of openings to define effective light emitting regions of sub-pixels, each first color sub-pixel including a first effective light emitting region, each second color sub-pixel including a second effective light emitting region, and an area of the second effective light emitting region being smaller than an area of the first effective light emitting region.

In some embodiments, one first color sub-pixel includes one first effective light emitting region, one second color sub-pixel includes one second effective light emitting region, and the area of one second effective light emitting region is smaller than the area of one first effective light emitting region. In some embodiments, one first color sub-pixel includes at least two first effective light emitting regions, or one second color sub-pixel includes at least two second effective light emitting regions, and a total area of all second effective light emitting regions included in one second color sub-pixel is smaller than a total area of all first effective light emitting regions included in one first color sub-pixel. In some embodiments, the first effective light emitting regions and the second effective light emitting regions are separated. In some embodiments, the first effective light emitting regions and the second effective light emitting regions are defined by a plurality of separated openings formed in the pixel defining layer. In some embodiments, each first effective light emitting region is defined by a light emitting layer which is located between an anode and a cathode opposite to each other in a direction perpendicular to the base substrate and driven to emit light in a corresponding first color sub-pixel. In some embodiments, each second effective light emitting region is defined by a light emitting layer which is located between an anode and a cathode opposite to each other in the direction perpendicular to the base substrate and driven to emit light in a corresponding second color sub-pixel. In some embodiments, each first effective light emitting region and each second effective light emitting region are defined by a corresponding light emitting layer and an electrode (anode or cathode) or a part of the electrode which has carrier (hole or electron) transmission with the corresponding light emitting layer. In some embodiments, each first effective light emitting region and each second effective light emitting region are defined by at least part of a cathode and at least part of an anode, of which the orthographic projections on the base substrate are overlapped, the orthographic projections of the at least part of the cathode and the at least part of the anode on the base substrate are not overlapped with the orthographic projection of a first insulating layer on the base substrate, and the first insulating layer is located between the cathode and the anode in the direction perpendicular to the base substrate. For example, the first insulating layer includes a pixel defining layer. In some embodiments, each first color sub-pixel and each second color sub-pixel respectively includes: a first electrode, a light emitting layer at one side of the first electrode close to the base substrate, and a second electrode at one side of the light emitting layer away from the first electrode; in the direction perpendicular to the base substrate, a second insulating layer is also arranged between the first electrode and the light emitting layer and/or between the second electrode and the light emitting layer, the orthographic projection of the second insulating layer on the base substrate is overlapped with the orthographic projection of the first electrode or the second electrode, and the second insulating layer has an opening; the opening of the second insulating layer at one side facing the light emitting layer can expose at least part of the first electrode or at least part of the second electrode, so that the at least part of the first electrode or the at least part of the second electrode can be in contact with the light emitting layer or a functional layer for auxiliary emitting light. In some embodiments, the second insulating layer includes a pixel defining layer. In some embodiments, the functional layer for auxiliary emitting light can be any one or more layers selected from the group consisting of a hole injection layer, a hole transport layer, an electron transport layer, a hole blocking layer, an electron blocking layer, an electron injection layer, an auxiliary light emitting layer, an interface improvement layer, a transmission enhanced layer, etc. In some embodiments, the first electrode can be an anode and the second electrode can be a cathode. In some embodiments, the first electrode can include a laminate which includes at least two layers of indium tin oxide (ITO) and silver (Ag), such as a laminate of ITO, Ag, and ITO triple layers. In some embodiments, a material of the second electrode can include any one or more selected from the group consisting of magnesium (Mg), Ag, ITO and indium zinc oxide (IZO), such as, a mixed layer or an alloy layer of Mg and Ag.

Each sub-pixel includes a light emitting layer, each first color sub-pixel includes a first color light emitting layer located in the opening and on the pixel defining layer, each second color sub-pixel includes a second color light emitting layer located in the opening and on the pixel defining layer, and an area ratio between orthographic projections of the first color light emitting layer and the first effective light emitting region of each first color sub-pixel on the base substrate is smaller than an area ratio between orthographic projections of the second color light emitting layer and the second effective light emitting region of each second color sub-pixel on the base substrate.

Generally, the quality of the light emitting layer located in the effective light emitting region has a great influence on the display effect of the sub-pixel. In the case where an evaporation process such as an FMM process (described later) is adopted for evaporation, in the display region, a plurality of effective light emitting regions are in one-to-one correspondence with a plurality of light emitting layer patterns in the display region, while the light emitting layer patterns are in one-to-one correspondence with the openings of the FMM (Fine Metal Mask). Assuming that the alignment between the FMM and the display panel is deviated, or when problems such as uneven material caused by evaporation occur, the smaller the area of the effective light emitting region of the sub-pixel, the more likely it is that the poor quality of the light emitting layer in the effective light emitting region will occur; even if the deviation is too large, the case of the poor quality of the light emitting layer in the effective light emitting region occurs to all color sub-pixels, the greatest influence will be on the sub-pixel with the effective light emitting region having the smallest area. If the sub-pixel with the effective light emitting region of the smallest area happens to be a certain color sub-pixel which has the greatest influence on display brightness, display uniformity or other display parameters, such as a green sub-pixel, the display panel will have some display problems such as dark spots, jaggies, uneven brightness and color deviation, etc. In the embodiments of the present disclosure, the area ratio between the second color light emitting layer and the second effective light emitting region of the second color sub-pixel is set to be greater than the area ratio between the first color light emitting layer and the first effective light emitting region of the first color sub-pixel, so that the precision margin of the evaporation process for the second color sub-pixel with the effective light emitting region having a relatively smaller area can be set to be relatively larger, and thus, the quality of the second color light emitting layer formed in the second effective light emitting region is more stable, thereby reducing the influence of deviation or fluctuation brought by the evaporation process on the display quality of each sub-pixel.

The area of each light emitting layer, for example, can be measured by the following test means. For example, the area of the light emitting layer can be measured by taking pictures with a fluorescence microscope, and for example, the boundary of the light emitting layer can be obtained by photoluminescence when the electroluminescent (EL) material is excited by ultraviolet rays. For example, time of flight secondary ion mass spectrometry (TOF-SIMS) can be used for testing, TOF-SIMS is a measurement technology with an extremely high resolution, which uses primary ions to excite the surface of a sample, ejects extremely small amount of secondary ions, and determines the ion mass according to the different time of the secondary ions flying to the detector due to different masses. Of course, the area and boundary of each light emitting layer can also be measured by other existing test means.

The display panel and the display device provided by the embodiments of the present disclosure will be described below with reference to the accompanying drawings.

Figure 2:
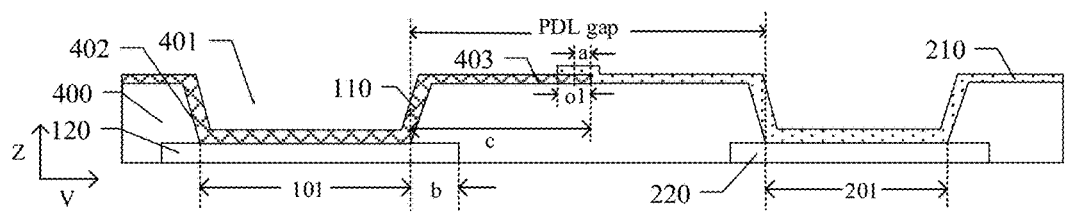
FIG. 2 is a partial cross-sectional structural view taken along line AA shown in FIG. 1A.

FIG. 1A is a partial planar structural view of a display panel provided by an embodiment of the present disclosure, and FIG. 2 is a partial cross-sectional structural view taken along line AA shown in FIG. 1A. As shown in FIG. 1A and FIG. 2, the display panel includes a base substrate 10, and the display panel includes a display region 11 and a peripheral region 12 located at the periphery of the display region 11. For example, the display region 11 is a region for display, such as a region including illuminable pixels. The boundaries of the display region can be defined by the first and last rows of illuminable pixels and the first and last columns of illuminable pixels. The peripheral region 12 is a region surrounding the display region 11 and not used for display. For example, in some embodiments, the display region can also include dummy pixels, such as pixels formed with a light emitting layer but not used for display. The display panel includes a plurality of first color sub-pixels 100 and a plurality of second color sub-pixels 200 located in the display region 11 of the base substrate 10, the plurality of first color sub-pixels 100 are arranged along a first direction (i.e., X direction) to form a plurality of first color sub-pixel rows 1001, the plurality of first color sub-pixel rows 1001 are arranged along a second direction (i.e., Y direction), and adjacent first color sub-pixel rows 1001 in the plurality of first color sub-pixel rows 1001 are shifted with each other along the first direction. That is, the adjacent first color sub-pixel rows 1001 have a certain shift along the first direction, so the first color sub-pixels 100 in the adjacent first color sub-pixel rows 1001 are not aligned in the second direction. For example, the pixel arrangement manners in first color sub-pixel rows 1001 which are odd rows are the same, and the pixel arrangement manners in first color sub-pixel rows 1001 which are even rows are the same. For example, the shift between adjacent first color sub-pixel rows 1001 in the first direction is approximately one pitch. In some embodiments, the pitch is, for example, half of the distance between the centers of the effective light emitting regions in two adjacent first color sub-pixels 100 along the first direction, where the center of the effective light emitting region refers to a geometric center of the planar shape of the effective light emitting region. In some embodiments, the pitch is, for example, about the size of the pixel driving circuits of 2 sub-pixels in the row direction. In some embodiments, the pitch is about the size of the pixel driving circuit of 1 sub-pixel in the column direction. In some embodiments, the pitch is approximately equal to the size of the display region in the row direction divided by the number of pixels in the row direction, or equal to the size of the display region in the column direction divided by the number of pixels in the column direction. For example, for QHD (Quarter High Definition) products, the resolution is 960*540, and the pitch is approximately equal to the size of the display region in the row direction divided by 960, or equal to the size of the display region in the column direction divided by 540; for HD (High Definition) products, the pitch is approximately equal to the size of the display region in the row direction divided by 1280, or equal to the size of the display region in the column direction divided by 720; for FHD (Full High Definition) products, the pitch is approximately equal to the size of the display region in the row direction divided by 1920, or equal to the size of the display region in the column direction divided by 1080; for QHD (Quad High Definition) products, the pitch is approximately equal to the size of the display region in the row direction divided by 2560, or equal to the size of the display region in the column direction divided by 1440; for UHD (Ultra High Definition) products, the pitch is approximately equal to the size of the display region in the row direction divided by 3840, or equal to the size of the display region in the column direction divided by 2160; and so on. The adjacent first color sub-pixel rows described above refer to two first color sub-pixel rows without any other first color sub-pixel row therebetween.

As shown in FIG. 1A, the plurality of second color sub-pixels 200 are arrayed along the first direction and the second direction, and four second color sub-pixels 200 surround one first color sub-pixel 100. That is, the second color sub-pixel 200 is in a different row and in a different column from the first color sub-pixels 100, and one row of second color sub-pixels 200 (i.e., one second color sub-pixel row) arranged along the first direction is arranged between adjacent first color sub-pixel rows 1001, and the first color sub-pixel row 1001 and the second color sub-pixel row are alternately arranged. Similarly, one column of second color sub-pixels 200 (i.e., one second color sub-pixel column) arranged along the second direction is arranged between adjacent first color sub-pixel columns, and the first color sub-pixel column and the second color sub-pixel column are alternately arranged.

For example, the distances from the centers of the four second color sub-pixels to the center of the first color sub-pixel are approximately the same. For example, among the second color sub-pixels surrounding the first color sub-pixel, there are only four second color sub-pixels closest to the first color sub-pixel, and the distances from the centers of these four second color sub-pixels to the center of the first color sub-pixel are approximately the same. "Closest to" means that a line connecting a center of the first color sub-pixel and a center of the second color sub-pixel does not pass through any other first color sub-pixel or second color sub-pixel.

For example, the arrangement of four second color sub-pixels surrounding one first color sub-pixel can be the arrangement manner at the inner side of the display region, and the arrangement manner at the edge of the display region can be different from the arrangement manner at the inner side of the display region. For example, in the case where the first row or the first column of sub-pixels, or the last row or the last column of sub-pixel, are the first color sub-pixels, only two second color sub-pixels surround the first color sub-pixel at the edge of the display region. For example, the shape of the edge of the display region can have a rounded corner, or the shape of the display region is a special-shaped display region, such as a non-rectangular display region including a circular display region, etc., or a rectangular display region having a hole-digging region close to a certain edge of the rectangular display region, and the first color sub-pixel can be surrounded by one, two or three second color sub-pixels at the edge of the display region.

The embodiment of the present disclosure is described by taking the above arrangement structure as an example, but is not limited to this pixel structure, and the number of sub-pixels is not limited, either. For example, a stripe arrangement structure, or a triangle arrangement structure, or a mosaic arrangement structure, or a triangle arrangement structure, or an arrangement structure having any other combination of different sizes, shapes and positions, can be adopted. For example, RGB (that is R sub-pixel, G sub-pixel and B sub-pixel) may be equal in size, or may not be equal in size. For example, as to the size of the opening in the pixel defining layer for defining a single sub-pixel, it can be that B is greater than R, and B is greater than G. For example, as to the size of the opening in the pixel defining layer for defining a single sub-pixel, it can be that B is greater than R, and R is greater than G. For example, as to the size of the opening in the pixel defining layer for defining a single sub-pixel, it can be that B is greater than R, and R is equal to G. For example, as to the size of the opening in the pixel defining layer for defining a single sub-pixel, it can be that B is equal to R, and R is greater than G. For example, as to the size of the opening in the pixel defining layer for defining a single sub-pixel, it can be that R is greater than G. For example, as to the size of the opening in the pixel defining layer for defining a single sub-pixel, it can be that G is greater than R. For example, as to the size of the opening in the pixel defining layer for defining a single sub-pixel, it can be that G is greater than B. For example, the number of sub-pixels included in each repeating unit or pixel unit can be any one or a combination of two or more selected from the group consisting of 2, 3, 4, 5, 6, 7, 8, 9, 10, etc. For example, the number proportion of sub-pixels included in each repeating unit or pixel unit, for example, R:G:B, can be any one or a combination of two or more selected from the group consisting of 1:2:1, 1:1:2, 1:1:1, 1:2:2, 2:2:1, 1:2:3, 3:3:2, 1:3:2, 2:3:1, 3:2:3, 2:3:3, etc. The color types of sub-pixels can include any one selected from the group consisting of two, three, four, five and six. For example, the color of sub-pixels can be one or a combination of more selected from the group consisting of red, green, blue, white, yellow, cyan, magenta, orange, etc.

As shown in FIG. 1A and FIG. 2, the display panel further includes a pixel defining layer 400 located in the display region 11 and the peripheral region 12, an opening 401 corresponding to each sub-pixel can be formed in the pixel defining layer 400 according to the arrangement structure of sub-pixels, that is, the pixel defining layer 400 includes a plurality of openings 401 to define effective light emitting regions of the plurality of sub-pixels, and the shape of the effective light emitting region of each sub-pixel can be defined by the opening 401 of the pixel defining layer 400. The plurality of first color sub-pixels 100 include a plurality of first effective light emitting regions 101, and the plurality of second color sub-pixels 200 include a plurality of second effective light emitting regions 201, and the area of one second effective light emitting region 201 is smaller than the area of one first effective light emitting region 101.

In some embodiments, the effective light emitting region of each sub-pixel may not be defined by the opening of the pixel defining layer, and for example, it may be directly defined by an actual light emitting region of each sub-pixel.

For example, one sub-pixel corresponds to one effective light emitting region, that is, each sub-pixel includes only one effective light emitting region. The embodiment of the present disclosure is not limited thereto, and for example, one sub-pixel may also correspond to a plurality of effective light emitting regions which are driven by one common pixel circuit or receive the same driving signal.

For example, the area of each second effective light emitting region is greater than the area of each first effective light emitting region. In some embodiments, the area of each of the second effective light emitting regions is approximately the same, and the area of each of the first effective light emitting regions is approximately the same. Here, "approximately the same" means that the error is within the range from plus or minus 10%.

In some embodiments, some sub-pixels with the same color may have effective light emitting regions of different areas. For example, in some embodiments, sub-pixels included in one repeating unit or one pixel unit include two green sub-pixels, two red sub-pixels, two blue sub-pixels, or two pairs of sub-pixels in which each pair of sub-pixels are of the same color (e.g., two green sub-pixels and two red sub-pixels), and the areas of the effective light emitting regions of the sub-pixels with the same color can be different. In some embodiments, in the case where sub-pixels with the same color are located at an edge position, at a special-shaped region or at a foldable region, etc., and the effective light emitting regions thereof can have different areas or shapes from the effective light emitting regions of sub-pixels with the same color in other regions.

As shown in FIG. 1A and FIG. 2, each sub-pixel includes a light emitting layer, each first color sub-pixel 100 includes a first color light emitting layer 110 located in the opening 401 and on the pixel defining layer 400, and each second color sub-pixel 200 includes a second color light emitting layer 210 located in the opening 401 and on the pixel defining layer 400. The plurality of first color light emitting layers 110 included in the plurality of first color sub-pixels 100 are spaced apart from each other, and the plurality of second color light emitting layers 210 included in the plurality of second color sub-pixels 200 are spaced apart from each other.

Figure 1B:
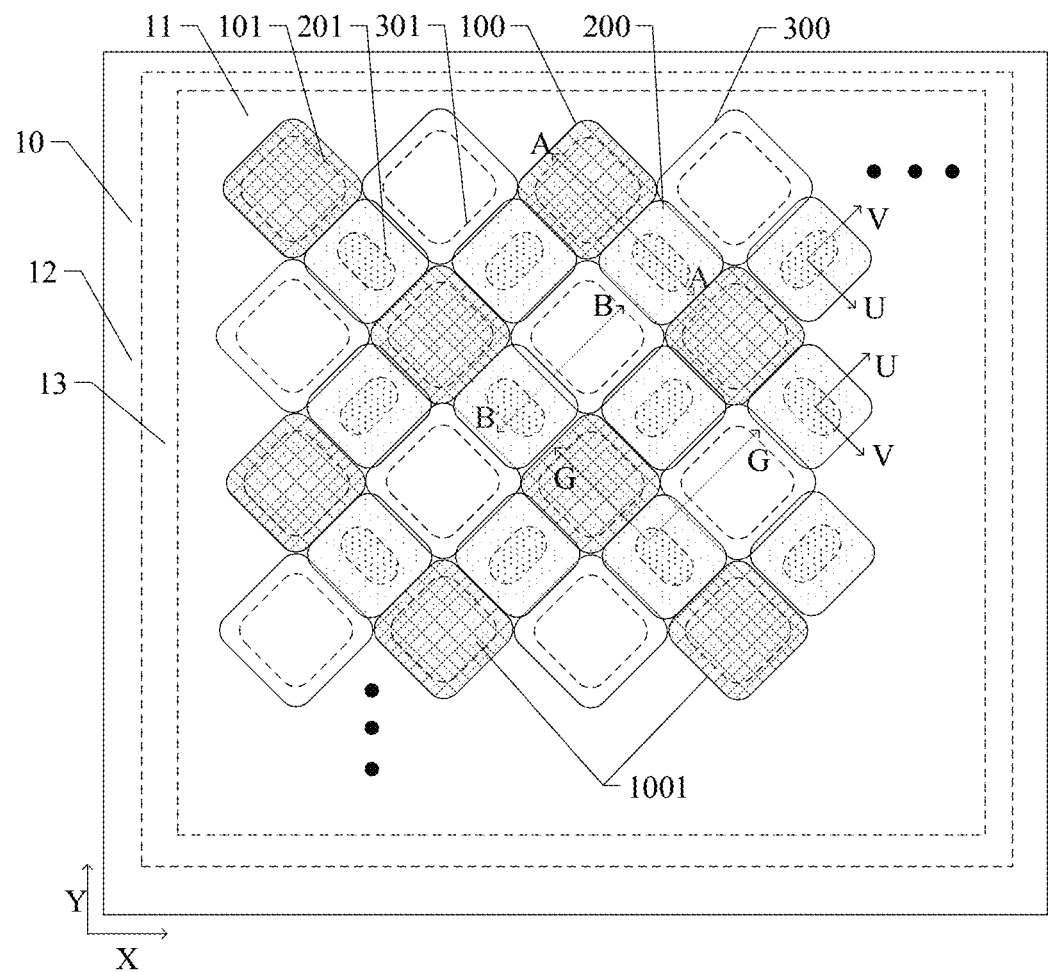
FIG. 1B is a partial planar structural view of a display panel provided by another example of an embodiment of the present disclosure.

In some embodiments, some light emitting layers may not be spaced apart. For example, two light emitting layers with the same color manufactured by 2 in 1 process (two light emitting layers are manufactured by using one evaporation opening) can be continuous, the two light emitting layers are integrated (the orthographic projections thereof on the base substrate are continuous, but may not be actually connected due to segment difference between film layers under the two light emitting layers in the process), and corresponding to two sub-pixels, and the light emitting layers of different pair of sub-pixels are spaced apart from each other. Accordingly, the light emitting layers manufactured by 3 in 1 process (three light emitting layers are manufactured by using one evaporation opening) correspond to three sub-pixels, and the light emitting layers manufactured by 4 in 1 process (four light emitting layers are manufactured by using one evaporation opening) correspond to four sub-pixels. For example, as shown in FIG. 1D, as to two light emitting layers with the same color manufactured by 2 in 1 process (two light emitting layers are manufactured by using one evaporation opening), such as the light emitting layers of the second color sub-pixels 200, the ratio of the light emitting layer and the opening in the pixel defining layer (or the effective light emitting region) of the corresponding two sub-pixels can be calculated by using half of the area of the light emitting layer and the area of one opening in the pixel defining layer of a corresponding sub-pixel in the case where the sizes of the openings in the pixel defining layer of the two sub-pixels are approximately the same.

For example, as shown in FIG. 1A and FIG. 2, the plurality of first color sub-pixels 100 include a plurality of first color light emitting layers 110 which are located in corresponding openings 401 and on the pixel defining layer 100 surrounding the corresponding openings 401, and the plurality of second color sub-pixels 200 include a plurality of second color light emitting layers 210 which are located in corresponding openings 401 and on the pixel defining layer 400 surrounding the corresponding openings. For example, as shown in FIG. 1A and FIG. 2, the light emitting layer of each color sub-pixel is provided in a whole circle around the opening of the pixel defining layer, and for example, the part of the light emitting layer of each color sub-pixel at the outer side of the opening and on the pixel defining layer has an integral ring shape. For example, the pixel defining layer structure for forming the opening corresponding to each sub pixel can be separated or formed into an integral network structure. For example, a pixel defining layer part for forming the openings in the outermost line (row or column) and on a side of the openings away from the center of the display region is integrated with a pixel defining layer structure on the peripheral of the display region, or the pixel defining layer part for forming the openings in the outermost line (row or column) serves as a peripheral pixel defining layer structure around the display region. For example, the pixel defining layer part for forming the openings in the outermost line (row or column) and on a side of the openings away from the center of the display region has a size in a direction perpendicular to an extending direction of an edge of the display panel corresponding to the pixel defining layer part greater than the size of a pixel defining layer part between adjacent openings in the pixel defining layer in the display region. For example, as shown in FIG. 1A and FIG. 2, the light emitting layer located on the pixel defining layer and the light emitting layer located in the opening are integrated. The embodiment of the present disclosure is not limited thereto, and the light emitting layer in the opening and the light emitting layer on the pixel defining layer may be disconnected, that is, the light emitting layer in the opening and the light emitting layer on the pixel defining layer are discontinuous film layers. For example, the light emitting layer is broken or discontinuous due to a large segment difference between film layers below the light emitting layer. In some embodiments, the orthographic projections of the light emitting layer located on the pixel defining layer and the light emitting layer located in the opening of each sub-pixel on the base substrate are substantially continuous.

The area ratio between the orthographic projections of the first color light emitting layer 110 and the first effective light emitting region 101 of each first color sub-pixel 100 on the base substrate 10 is smaller than the area ratio between the orthographic projections of the second color light emitting layer 210 and the second effective light emitting region 201 of each second color sub-pixel 200 on the base substrate 10. For example, the area of the orthographic projection of the first color light emitting layer 110 on the base substrate 10 is greater than the area of the orthographic projection of the second color light emitting layer 210 on the base substrate 10.

For example, the area ratio between the orthographic projections of the first color light emitting layer 110 and the first effective light emitting region 101 corresponding to the same first color sub-pixel 100 on the base substrate is a first area ratio, the area ratio between the orthographic projections of the second color light emitting layer 210 and the second effective light emitting region 201 corresponding to the same second color sub-pixel 200 on the base substrate is a second area ratio, and the first area ratio is less than the second area ratio.

For example, the first area ratio is an area ratio of one first color light emitting layer to one first effective light emitting region, i.e., a ratio of the area of one first color light emitting layer to the area of one first effective light emitting region; and the second area ratio is an area ratio of one second color light emitting layer to one second effective light emitting region, i.e., a ratio of the area of one second color light emitting layer to the area of one second effective light emitting region. For example, both the first area ratio and the second area ratio are greater than 1. For example, the first area ratio and the second area ratio can be in the range from 1 to 15. For example, the first area ratio and the second area ratio can be in the range from 1 to 10. For example, the first area ratio and the second area ratio can be in the range from 3 to 12. For example, the first area ratio and the second area ratio can be in the range from 2 to 8. For example, the first area ratio and the second area ratio can be in the range from 4 to 6. For example, the first area ratio and the second area ratio can be in the range from 3 to 7. For example, the first area ratio and the second area ratio can be in the range from 6 to 8. For example, the first area ratio can be about in the range from 3 to 5. For example, the first area ratio is in the range from 1.5 to 3. For example, the first area ratio can be about in the range from 3 to 4. For example, the first area ratio can be about in the range from 4 to 5. For example, the first area ratio can be about in the range from 4 to 6. For example, the second area ratio can be about in the range from 5 to 7. For example, the second area ratio can be about in the range from 6 to 7. For example, the second area ratio can be about in the range from 3 to 5. For example, the second area ratio can be about in the range from 3 to 6. For example, the second area ratio can be about in the range from 5 to 8. For example, the second area ratio can be about in the range from 4 to 9. For example, the second area ratio is in the range from 6.5 to 8.

For example, the area of the first color light emitting layer of one first color sub-pixel is greater than the area of the second color light emitting layer of one second color sub-pixel.

For example, the first color sub-pixel 100 can be a red sub-pixel or a blue sub-pixel, and the second color sub-pixel 200 can be a green sub-pixel.

For example, the luminous efficiency of the first color sub-pixel is less than the luminous efficiency of the second color sub-pixel. For example, the first area ratio corresponding to the first color sub-pixel is smaller than the second area ratio corresponding to the second color sub-pixel.

For example, the magnitude of the luminous efficiency of a sub-pixel refers to the magnitude the intensity of light emitted from a light emitting element of the sub-pixel under the same electrical signal condition. For example, if the light intensity of a sub-pixel is large, the luminous efficiency is considered to be large. For example, the same electrical signal condition means that the voltages written to the data lines are the same. For example, the same electrical signal condition means that the current written into the light emitting element has the same magnitude. For example, the luminous efficiency of a sub-pixel refers to the current density flowing through a light emitting element under the same electrical signal condition.

For example, an aperture ratio of the first color sub-pixel is greater than an aperture ratio of the second color sub-pixel.

For example, the aperture ratio of the first color sub-pixel refers to the area ratio of the region of the first color sub-pixel actually used for emitting light to the display region. For example, the aperture ratio of the second color sub-pixel refers to the area ratio of the region of the second color sub-pixel actually used for emitting light to the display region.

For example, the embodiment of the present disclosure illustratively shows that the first direction is perpendicular to the second direction, but is not limited thereto, and the first direction may not be perpendicular to the second direction.

For example, the light emitting layer of each sub-pixel can be manufactured by an evaporation process. The evaporation process needs to align an evaporation mask plate with the display panel, and an evaporation source is used to heat the material of the light emitting layer, so that the material of the light emitting layer is deposited on the corresponding positions of the display panel. The evaporation mask can include a fine metal mask (FMM) with sub-pixel pattern openings corresponding to the sub-pixels, and a plurality of independent patterns can be formed on the FMM according to the structures of different color sub-pixels, so that patterns with different materials and/or different thicknesses can be formed in different sub-pixels.

For each sub-pixel, the effective light emitting region is substantially located within the opening of the pixel defining layer, and for example, the effective light emitting region has substantially the same area as the corresponding opening. The luminous area of each sub-pixel determines the aperture ratio of the sub-pixel, which further affects the display brightness of the sub-pixel in the display panel. In order to improve the aperture ratio and display quality of each sub-pixel, it is necessary to ensure the quality of the film layers inside the opening of the pixel defining layer as much as possible in the evaporation process. Therefore, in the evaporation process of each light emitting layer by using the FMM, the openings of the mask plate for forming sub-pixel patterns with different colors is usually set larger than the openings of the pixel defining layer, so that the light emitting layer evaporated by the opening of the mask plate can completely cover the opening of the pixel defining layer. Therefore, the light emitting layer of each sub-pixel includes a part located in the opening of the pixel defining layer and another part located on the surface of the pixel defining layer.

Due to the precision deviation of the alignment of the mask plate and the display panel to be evaporated, as well as the diffusion property of the material of the evaporation source, the process precision (process margin, that is, the allowable shift between the opening of the fine metal mask plate and the opening of the pixel defining layer during evaporation) of different sub-pixels will also be different. The lifetime and luminous efficiency of luminescent materials in the light emitting layers of sub-pixels with different colors on an organic light emitting diode (OLED) display panel are different, and therefore, the luminous areas of different color sub-pixels can be set differently. For example, the luminous area of the first color sub-pixel (e.g., blue sub-pixel) can be set to the maximum and the luminous area of the second color sub-pixel (e.g., green sub-pixel) can be set to the minimum. The difference between the luminous areas of sub-pixels with different colors results in different requirements for process margin. When forming the light emitting layer of a sub-pixels having a smaller luminous area, the fluctuation of process margin is more likely to influence the stability of the quality of the film layers inside the opening of pixel defining layer, and therefore, the process margin of sub-pixels with different colors can be adjusted according to the luminous area of the sub-pixel, such as the area of the opening of pixel defining layer. In the embodiment of the present disclosure, the area ratio between the second color light emitting layer and the second effective light emitting region of the second color sub-pixel is set to be greater than the area ratio between the first color light emitting layer and the first effective light emitting region of the first color sub-pixel, so that the evaporation process margin of the second color sub-pixel having a smaller effective light emitting region can be set relatively larger, thus ensuring that the deviation caused by the evaporation process is more balanced for respective sub-pixels.

For example, each sub-pixel further includes a first electrode, such as a cathode (to be described later), located at one side of the light emitting layer away from the base substrate, and a second electrode, such as an anode (to be described later), located at one side of the light emitting layer facing the base substrate. For example, the first color sub-pixel 100 includes a second electrode 120 located at one side of the first color light emitting layer 110 facing the base substrate, and the second color sub-pixel 200 includes a second electrode 220 located at one side of the second color light emitting layer 210 facing the base substrate. For example, an inclined slope 402 can be provided at the position where the pixel defining layer 400 defines the opening 401, and the opening 401 is a region surrounded by the intersection line between the slope 402 and the second electrode, or the opening is a partial region of the second electrode exposed by the pixel defining layer 400. Taking the first color sub-pixel 100 as an example, the second electrode 120 of the first color sub-pixel 100 can be disposed between the pixel defining layer 400 and the base substrate 10, and the pixel defining layer 400 includes an opening 401 exposing a part of the second electrode 120 to define the sub-pixel. In the case where the first color light emitting layer 110 is formed in the opening 401 of the pixel defining layer 400, the upper and lower sides of a whole structure formed of the first color light emitting layer 110 and other functional film layers which are auxiliary for emitting light (such as one or more selected from the group consisting of an electron injection layer, an electron transport layer, a hole injection layer, a hole transport layer, an auxiliary light emitting layer, an electron blocking layer and a hole blocking layer) are in contact with the first electrode and the second electrode 120, respectively. The first electrode and the second electrode can drive the first color light emitting layer 110 inside the opening 401 of the pixel defining layer 400 to emit light, and the opening 401 of the pixel defining layer 400 defines the shape of the first effective light emitting region 101 of the first color light emitting layer 110.

For example, as shown in FIGS. 1A and 2, at least part of the second effective light emitting regions 201 have a length direction and a width direction, the length direction is an extending direction of the connecting line between two points farthest from each other in one second effective light emitting region 201 (V direction as shown in FIG. 1A), and the width direction (U direction as shown in FIG. 1A) is substantially perpendicular to the length direction of the same second effective light emitting region 201. For example, for one second effective light emitting region 201, along the length direction, the ratio of the maximum size of the second color light emitting layer 210 corresponding to the second effective light emitting region 201 to the maximum size of the second effective light emitting region 201 is a first ratio (the maximum size of the second color light emitting layer 210 corresponding to the second effective light emitting region 201 is divided by the maximum size of the second effective light emitting region 201); along the width direction, the ratio of the maximum size of the second color light emitting layer 210 corresponding to the second effective light emitting region 201 to the maximum size of the second effective light emitting region 201 is a second ratio (the maximum size of the second color light emitting layer 210 corresponding to the second effective light emitting region 201 is divided by the maximum size of the second effective light emitting region 201); and the first ratio is less than the second ratio. The length direction described above can be a third direction, and the width direction described above can be a fourth direction.

For example, the plurality of second effective light emitting regions included in the plurality of second color sub-pixels are substantially the same in shape and area.

For example, the length direction of each second effective light emitting region has an included angle with the row direction. For example, the included angle between the length direction of each second effective light emitting region and the row direction can be 15-75 degrees. For example, the included angle between the length direction of each second effective light emitting region and the row direction can be 30-60 degrees. For example, the included angle between the length direction of each second effective light emitting region and the row direction can be 40-50 degrees.

For example, as shown in FIG. 1A and FIG. 2, the shape of the second effective light emitting region 201 is a long strip, such as a hexagon, an octagon, a trapezoid, an ellipse or a rectangle, etc. The long strip in the embodiment of the present disclosure can be a regular pattern, such as, a symmetrical pattern, an extending direction of the symmetrical pattern being the length direction thereof and a direction perpendicular to the extending direction being the width direction thereof. The long strip in the embodiment of the present disclosure can also be an irregular pattern, the extending direction of the irregular pattern is the length direction thereof, and the direction perpendicular to the extending direction is the width direction thereof. For example, the extending direction (i.e., the length direction) of the effective light emitting region having the long strip shape is the third direction (i.e., the V direction), and the direction perpendicular to the third direction is the fourth direction (i.e., the width direction). For example, the shape of the opening 401 of the pixel defining layer 400 corresponding to the second color sub-pixel 200 is a long hexagon or an ellipse, and the opening 401 can have a first axis of symmetry parallel to the third direction and a second axis of symmetry parallel to the fourth direction. For example, along the third direction, the first color sub-pixels 100 and the second color sub-pixels 200 are alternately arranged.

In the embodiment of the present disclosure, the extending direction of the second effective light emitting region having a long strip shape is defined as the third direction, and in the case where the extending directions of different second effective light emitting regions are different, the third directions vary with the extending directions of different second effective light emitting regions. For example, in the case where the extending directions of two adjacent second effective light emitting regions are intersected, the third directions corresponding to the two adjacent second effective light emitting regions are also intersected. Similarly, the fourth directions vary with the extending directions of different second effective light emitting regions.

For example, as shown in FIG. 1A and FIG. 2, along the third direction, the ratio of the maximum size of the second color light emitting layer 210 to the maximum size of the second effective light emitting region 201 is a first ratio; along the fourth direction, the ratio of the maximum size of the second color light emitting layer 210 to the maximum size of the second effective light emitting region 201 is a second ratio; and the first ratio is less than the second ratio. In the embodiment of the present disclosure, the maximum size of the second color light emitting layer along a certain direction refers to the maximum size of the orthographic projection of the second color light emitting layer on the base substrate along this direction. For example, the ratio of the maximum size of the second color light emitting layer 210 to the maximum size of the second effective light emitting region 201 along a long axis direction of the opening 401 is less than the ratio of the maximum size of the second color light emitting layer 210 to the maximum size of the second effective light emitting region 201 along a short axis direction of the opening 401, so as to avoid affecting the position of the second color light emitting layer formed in the opening of the pixel defining layer in the case where the opening of the mask plate deviates greatly from the opening of the pixel defining layer, and further reduce the influence of process margin on the second color sub-pixel in the short axis direction of the corresponding opening of the pixel defining layer.

For example, for the same second effective light emitting region 201, along the length direction of the second effective light emitting region 201, the difference between the maximum size of the corresponding second color light emitting layer 210 and the maximum size of the second effective light emitting region 201 is a first difference; along the width direction of the second effective light emitting region 201, the difference between the maximum size of the second color light emitting layer 210 and the maximum size of the second effective light emitting region 201 is a second difference; and the first difference is less than the second difference.

For example, the first difference can be in the range from 5 to 15 microns. For example, the first difference can be in the range from 6 to 14 microns. For example, the first difference can be in the range from 7 to 12 microns. For example, the first difference can be in the range from 8 to 11 microns. For example, the second difference can be in the range from 8 to 30 microns. For example, the second difference can be in the range from 9 to 20 microns. For example, the second difference can be in the range from 10 to 18 microns.

For example, both the first difference and the second difference are greater than a pixel position accuracy (ppa) deviation (to be described later).

For example, the minimum values of the size difference between the light emitting layers and the corresponding effective light emitting regions of sub-pixels at different positions are approximately the same, and for example, the minimum values of the size difference can be in the range from 7 to 9 microns, and for example, the minimum values of the size difference can be in the range from 6 to 8 microns.

For example, as shown in FIG. 1A and FIG. 2, along the third direction, the difference between the maximum size of the second color light emitting layer 210 and the maximum size of the second effective light emitting region 201 is a first difference; along the fourth direction, the difference between the maximum size of the second color light emitting layer 210 and the maximum size of the second effective light emitting region 201 is a second difference; and the first difference is less than the second difference, so as to reduce the influence of process margin on the second color sub-pixel in the width direction of the second effective light emitting region.

For example, as shown in FIG. 1A and FIG. 2, in the second color sub-pixel 200, the ratio of the maximum size of the second color light emitting layer 210 along the third direction to the maximum size of the second color light emitting layer 210 along the fourth direction is less than the ratio of the maximum size of the second effective light emitting region 201 along the third direction to the maximum size of the second effective light emitting region 201 along the fourth direction, so as to reduce the influence of process margin on the second color sub-pixel in the width direction of the second effective light emitting region. That is, the ratio of the maximum size of the second color light emitting layer along the length direction of the second effective light emitting region to the maximum size of the second color light emitting layer along the width direction of the second effective light emitting region is less than the ratio of the maximum size of the second effective light emitting region along the length direction of the second effective light emitting region to the maximum size of the second effective light emitting region along the width direction of the second effective light emitting region. In some embodiments, the ratio of the maximum size of the second color light emitting layer 210 along the third direction to the maximum size of the second color light emitting layer 210 along the fourth direction, i.e., the ratio of the size of the second color light emitting layer 210 in the length direction to the size of the second color light emitting layer 210 in the width direction, is approximately in the range from 0.8 to 1.2, and for example, in the range from 0.9-1.1, and for example, it can be 1. The size of the second color light emitting layer 210 in the length direction and the size of the second color light emitting layer 210 in the width direction are approximately the same, so that the symmetry of the pattern of the second color light emitting layer 210 is better, and during the FMM process, the opening on the FMM corresponding to the pattern of the second color light emitting layer 210 is deformed better, and the formed pattern of the second color light emitting layer 210 is more accurate.

For example, as shown in FIG. 1A, the planar shape (i.e., the shape of the orthographic projection on the base substrate) of the second color light emitting layer 210 of the second color sub-pixel 200 can be substantially circular, but is not limited to thereto, and the planar shape can also be oval or polygonal, such as quadrilateral, pentagonal, hexagonal, octagonal, etc. For example, FIG. 1B is a partial planar structural view of a display panel in another example of the embodiment of the present disclosure. As shown in FIG. 1B, the display panel in the present example differs from the display panel shown in FIG. 1A in that the shape of the second color light emitting layer of the second color sub-pixel can be approximately a rounded rectangle or a rounded square. The shape of the second color light emitting layer of the second color sub-pixel can also be any other shape, such as a triangle, a quadrilateral, a pentagon, a hexagon, an octagon, etc., and it can be a symmetrical pattern, can be a centrosymmetric pattern, and can also be any other irregular pattern. It can be designed according to the layout space of the display panel and the opening distribution on FMM, so as to improve the aperture ratio, match the alignment accuracy, or to reduce the deformation of the opening pattern on FMM.

For example, taking that the shape of the second color light emitting layer 210 of the second color sub-pixel 200 is circular as an example, because the opening 401 of the pixel defining layer 400 defining the second effective light emitting region 201 of the second color sub-pixel 200 has a long axis and a short axis, the second color light emitting layer 210 having a circular shape covers the opening 401 of the pixel defining layer 400, and in the long axis direction and the short axis direction corresponding to the opening 401 of the pixel defining layer 40, the second color light emitting layer 210 includes portions located at the outer side of the opening 401 of the pixel defining layer 400, that is, portions covering the surface of the pixel defining layer 400 away from the base substrate 10. The maximum size and coverage area of the second color light emitting layer 210 covering the pixel defining layer 400 in the fourth direction (i.e., the short axis direction) are both greater than the maximum size and coverage area of the second color light emitting layer 210 covering the pixel defining layer 400 in the third direction (i.e., the long axis direction). Taking that the shape of the second color light emitting layer 210 of the second color sub-pixel 200 is oval or hexagonal as an example, the second color light emitting layer 210 covers the opening 401 of the pixel defining layer 400, in the long axis direction and the short axis direction of the opening 401 in the pixel defining layer 400 corresponding to the second color light emitting layer, the second color light emitting layer 210 includes portions located at the outer side of the opening 401 of the pixel defining layer 400, that is, portions covering the surface of the pixel defining layer 400 away from the base substrate 10. The maximum size and coverage area of the second color light emitting layer 210 covering the pixel defining layer 400 at a first set of opposite sides which are opposite to each other in the fourth direction (i.e., the short axis direction) are both greater than the maximum size and coverage area of the second color light emitting layer 210 covering the pixel defining layer 400 at a second set of opposite sides which are opposite to each other in the third direction (i.e., the long axis direction), that is, the ratio of the long axis to the short axis of the second color light emitting layer 210 is less than the ratio of the long axis to the short axis of the opening 401 of the second effective light emitting region 201. The maximum size of the second color light emitting layer 210 in the third direction is the length of the second color light emitting layer 210 along the long axis direction, and the maximum size of the second color light emitting layer 210 in the fourth direction is the length of the second color light emitting layer 210 along the short axis direction.

Figure 3:
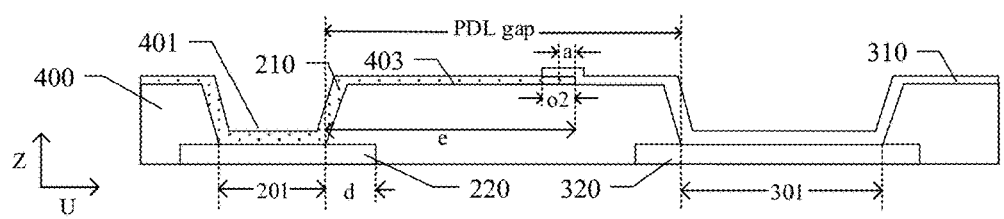
FIG. 3 is a partial cross-sectional structural view taken along line BB shown in FIG. 1A.

For example, FIG. 3 is a partial cross-sectional structural view taken along line BB shown in FIG. 1A. As shown in FIG. 1A and FIG. 3, the display panel further includes a plurality of third color sub-pixels 300 located in the display region 11 on the base substrate 10, the plurality of first color sub-pixels 100 and the plurality of third color sub-pixels 300 are alternately arranged along the first direction and the second direction, and the plurality of third color sub-pixels 300 and the plurality of second color sub-pixels 200 are alternately arranged along the short axis direction of the second color sub-pixel 200. Therefore, in the pixel arrangement structure adopted by the embodiment of the present disclosure, the second color sub-pixels are arranged in a matrix along row direction and column direction, the first color sub-pixels and third color sub-pixels are alternately arranged in rows and columns, second color sub-pixel rows and first color sub-pixel rows are alternately arranged in the column direction, and second color sub-pixel columns and first color sub-pixel columns are alternately arranged in the row direction. And each second color sub-pixel is surrounded by two first color sub-pixels and two third color sub-pixels. For one second color sub-pixel, two first color sub-pixels are located on both sides of the second color sub-pixel in the third direction, and two third color sub-pixels are located on both sides of the second color sub-pixel in the fourth direction; alternatively, two first color sub-pixels are located on both sides of the second color sub-pixel in the fourth direction, and two third color sub-pixels are located on both sides of the second color sub-pixel in the third direction. The third direction, for example, is the first direction (e.g., row direction) rotated counterclockwise by an acute angle, such as 45 degrees, and the fourth direction, for example, is the first direction rotated clockwise by an acute angle, such as 45 degrees. The third direction and the fourth direction can also be interchanged. The third direction and the fourth direction are intersected with both the first direction and the second direction.

For example, a plurality of first color sub-pixels and a plurality of second color sub-pixels are alternately arranged along the third direction to form a first group, a plurality of third color sub-pixels and a plurality of second color sub-pixels are alternately arranged along the third direction to form a second group, and the first group and the second group are alternately distributed along the fourth direction. The second color sub-pixels in the second group and the first color sub-pixels in the first group are alternately arranged in the fourth direction, and the second color sub-pixels in the first group and the third color sub-pixels in the second group are alternately arranged in the fourth direction. The above mentioned U direction corresponds to each second color sub-pixel, the U direction corresponding to some second color sub-pixels is the fourth direction, and the U direction corresponding to some other second color sub-pixels is the third direction.

In some embodiments, the first color sub-pixel, the second color sub-pixel and the third color sub-pixel can also have the same color. For example, the first color sub-pixel and the second color sub-pixel emit light with the same color (for example, the light emitting layers of the first color sub-pixel and the second color sub-pixel may have the same material or the first color sub-pixel and the second color sub-pixel have the same light emitting element structure). In some embodiments, for example, the first color sub-pixel and the third color sub-pixel emit light with the same color. For example, a fourth color sub-pixel can be included, and light emitted by the fourth color sub-pixel may have different color from light emitted by any one of the first color sub-pixels, the second color sub-pixels and the third color sub-pixels, or light emitted by the fourth color sub-pixels may have the same color as light emitted by one of the first color sub-pixels, the second color sub-pixels and the third color sub-pixels.

In the above embodiments, the luminous color, size, shape and position distribution of respective sub-pixels can be freely combined. For example, the size and shape of the sub-pixels can be partly the same and partly different; or totally the same; or completely different. For example, some sub-pixels have the same size but different shapes. For example, some sub-pixels have substantially the same shape and outline, but different areas. For example, there may be different numbers of second color sub-pixels around different first color sub-pixels, and the number may be 2, 3, 4, 5, 6, 7, 8, etc. These second color sub-pixels may have approximately the same distance from the first color sub-pixel, or some of these second color sub-pixels have the same distance from the first color sub-pixel and some of these second color sub-pixels have different distances from the first color sub-pixel. For example, there may be different numbers of third color sub-pixels around different second color sub-pixels, and the number may be 2, 3, 4, 5, 6, 7, 8, etc. These third color sub-pixels may have approximately the same distance from the second color sub-pixel, or some of these third color sub-pixels have the same distance from the second color sub-pixel and some of these third color sub-pixels have different distances from the second color sub-pixel. For example, there may be different numbers of second color sub-pixels around different third color sub-pixels, and the number may be 2, 3, 4, 5, 6, 7, 8, etc. These second color sub-pixels may have approximately the same distance from the third color sub-pixel, or some of these second color sub-pixels have the same distance from the third color sub-pixel and some of these second color sub-pixels have different distances from the third color sub-pixel.

For example, as shown in FIG. 1A and FIG. 2, the plurality of third color sub-pixels 300 include a plurality of third effective light emitting regions 301, the area of one second effective light emitting region 201 is smaller than the area of one third effective light emitting region 301, and the plurality of third color sub-pixels 300 include a plurality of third color light emitting layers 310 located in corresponding openings 401 and on the pixel defining layer 400 surrounding the corresponding openings 401, the plurality of third color light emitting layers 310 included in the plurality of third color sub-pixels 300 are spaced apart from each other, the area ratio between the orthographic projections of the third color light emitting layer 310 and the third effective light emitting region 301 corresponding to the same third color sub-pixel 300 on the base substrate is a third area ratio, and the third area ratio is less than the second area ratio.

For example, the third area ratio is greater than 1. For example, the third area ratio can be in the range from 1 to 10. For example, the third area ratio can be in the range from 2 to 8. For example, the third area ratio can be in the range from 3 to 7. For example, the first area ratio can be in the range from 3 to 5. For example, the third area ratio can be in the range from 3 to 5. For example, the second area ratio can be about in the range from 5 to 7. For example, the first area ratio can be about in the range from 4 to 5. For example, the second area ratio can be about in the range from 6 to 7. For example, the third area ratio can be about in the range from 3 to 4. For example, the third area ratio can be in the range from 1.5 to 7. For example, the third area ratio can be in the range from 2 to 3. For example, the third area ratio can be in the range from 3 to 4.

For example, the first color sub-pixel 100 is a red sub-pixel, the second color sub-pixel 200 is a green sub-pixel, and the third color sub-pixel 300 is a blue sub-pixel.

For example, the luminous efficiency of the third color sub-pixel is less than the luminous efficiency of the second color sub-pixel.

For example, the luminous efficiency of the third color sub-pixel is less than the luminous efficiency of the first color sub-pixel.

For example, the ratio of the luminous efficiency of the third color sub-pixel to the luminous efficiency of the second color sub-pixel is in the range from 0.3 to 1. For example, the ratio of the luminous efficiency of the third color sub-pixel to the luminous efficiency of the second color sub-pixel is in the range from 0.4 to 1. For example, the ratio of the luminous efficiency of the third color sub-pixel to the luminous efficiency of the second color sub-pixel is in the range from 0.5 to 1. For example, the ratio of the luminous efficiency of the third color sub-pixel to the luminous efficiency of the second color sub-pixel is in the range from 0.6 to 1. For example, the ratio of the luminous efficiency of the third color sub-pixel to the luminous efficiency of the second color sub-pixel is in the range from 0.7 to 1. For example, the ratio of the luminous efficiency of the third color sub-pixel to the luminous efficiency of the second color sub-pixel is in the range from 0.8 to 1. For example, the ratio of the luminous efficiency of the third color sub-pixel to the luminous efficiency of the second color sub-pixel is in the range from 0.9 to 1.

For example, the ratio of the luminous efficiency of the third color sub-pixel to the luminous efficiency of the first color sub-pixel is in the range from 0.5 to 1. For example, the ratio of the luminous efficiency of the third color sub-pixel to the luminous efficiency of the first color sub-pixel is in the range from 0.6 to 1. For example, the ratio of the luminous efficiency of the third color sub-pixel to the luminous efficiency of the first color sub-pixel is in the range from 0.7 to 1. For example, the ratio of the luminous efficiency of the third color sub-pixel to the luminous efficiency of the first color sub-pixel is in the range from 0.8 to 1. For example, the ratio of the luminous efficiency of the third color sub-pixel to the luminous efficiency of the first color sub-pixel is in the range from 0.9 to 1.

For example, the third area ratio corresponding to the third color sub-pixel is less than the second area ratio corresponding to the second color sub-pixel.

For example, the third area ratio corresponding to the third color sub-pixel is less than the first area ratio corresponding to the first color sub-pixel.

For example, the magnitude of the luminous efficiency of a sub-pixel refers to the intensity of light emitted from a light emitting element of the sub-pixel under the same electrical signal condition. If the light intensity of a sub-pixel is large, the luminous efficiency is considered to be large. For example, the same electrical signal condition means that the voltage written to the data line is the same. For example, the same electrical signal condition means that the current written into the light emitting element has the same magnitude. For example, the luminous efficiency of a sub-pixel refers to the current density flowing through a light emitting element under the same electrical signal condition.

For example, the aperture ratio of one third color sub-pixel is greater than the aperture ratio of one second color sub-pixel.

For example, the aperture ratio of one third color sub-pixel is greater than the aperture ratio of one first color sub-pixel.

For example, the aperture ratio of the third color sub-pixel refers to the area ratio of the region of the third color sub-pixel actually used for emitting light to the display region.

For example, the ratio of the aperture ratio of the first color sub-pixel to the aperture ratio of the third color sub-pixel is approximately 1:(1.1~1.9). For example, the ratio of the aperture ratio of the first color sub-pixel to the aperture ratio of the third color sub-pixel is approximately 1:(1.2~1.8). For example, the ratio of the aperture ratio of the first color sub-pixel to the aperture ratio of the third color sub-pixel is approximately 1:(1.3~1.7). For example, the ratio of the aperture ratio of the first color sub-pixel to the aperture ratio of the third color sub-pixel is approximately 1:(1.4~1.6). For example, the ratio of the aperture ratio of the first color sub-pixel to the aperture ratio of the third color sub-pixel is approximately 1:(1.2~1.5).

For example, the ratio of the aperture ratio of the second color sub-pixel to the aperture ratio of the third color sub-pixel is approximately 1:(1.1~1.9). For example, the ratio of the aperture ratio of the second color sub-pixel to the aperture ratio of the third color sub-pixel is approximately 1:(1.2~1.8). For example, the ratio of the aperture ratio of the second color sub-pixel to the aperture ratio of the third color sub-pixel is approximately 1:(1.3~1.7). For example, the ratio of the aperture ratio of the second color sub-pixel to the aperture ratio of the third color sub-pixel is approximately 1:(1.4~1.6). For example, the ratio of the aperture ratio of the second color sub-pixel to the aperture ratio of the third color sub-pixel is approximately 1:(1.2~1.5).

For example, in the display region, the number of second color sub-pixels is greater than the number of first color sub-pixels.

For example, in the display region, the ratio of the number of the second color sub-pixels to the number of first color sub-pixels is about 2.

For example, the ratio of the aperture ratio of the first color sub-pixel to the aperture ratio of the second color sub-pixel is in the range from 0.5 to 1.6. For example, the ratio of the aperture ratio of the first color sub-pixel to the aperture ratio of the second color sub-pixel is in the range from 0.5 to 1. For example, the ratio of the aperture ratio of the first color sub-pixel to the aperture ratio of the second color sub-pixel is in the range from 0.6 to 1. For example, the ratio of the aperture ratio of the first color sub-pixel to the aperture ratio of the second color sub-pixel is in the range from 0.7 to 1. For example, the ratio of the aperture ratio of the first color sub-pixel to the aperture ratio of the second color sub-pixel is in the range from 0.8 to 1. For example, the ratio of the aperture ratio of the first color sub-pixel to the aperture ratio of the second color sub-pixel is in the range from 0.9 to 1. For example, the ratio of the aperture ratio of the first color sub-pixel to the aperture ratio of the second color sub-pixel is in the range from 1 to 1.1. For example, the ratio of the aperture ratio of the first color sub-pixel to the aperture ratio of the second color sub-pixel is in the range from 1 to 1.2. For example, the ratio of the aperture ratio of the first color sub-pixel to the aperture ratio of the second color sub-pixel is in the range from 1 to 1.3. For example, the ratio of the aperture ratio of the first color sub-pixel to the aperture ratio of the second color sub-pixel is in the range from 1 to 1.4. For example, the ratio of the aperture ratio of the first color sub-pixel to the aperture ratio of the second color sub-pixel is in the range from 1 to 1.5.

For example, as shown in FIG. 1A and FIG. 3, the third color sub-pixel 300 includes a third effective light emitting region 301, and the area of the second effective light emitting region 201 is smaller than the area of the third effective light emitting region 301. Each third color sub-pixel 300 includes a third color light emitting layer 310 located in the opening 401 of the pixel defining layer 400 and on the pixel defining layer 400, and the plurality of third color light emitting layers 310 included in the plurality of third color sub-pixels 300 are spaced apart from each other. The area ratio between the orthographic projections of the third color light emitting layer 310 and the third effective light emitting region 301 of each first color sub-pixel 300 on the base substrate 10 is smaller than the area ratio between the orthographic projections of the second color light emitting layer 210 and the second effective light emitting region 201 of each second color sub-pixel 200 on the base substrate 10. In the embodiment of the present disclosure, the area ratio between the second color light emitting layer and the second effective light emitting region of the second color sub-pixel is set to be greater than the area ratio between the third color light emitting layer and the third effective light emitting region of the third color sub-pixel, so that the precision margin of the evaporation process of the second color sub-pixel with the effective light emitting region having a relatively smaller area can be set to be relatively larger, and thus, the quality of the second color light emitting layer formed in the second effective light emitting region is more stable, thereby reducing the influence of deviation or fluctuation brought by the evaporation process on the display quality of each sub-pixel.

In some embodiments, the magnitude of the area of the first effective light emitting region of the first color sub-pixel, the magnitude of the area of the second effective light emitting region of the second color sub-pixel and the magnitude of the area of the third effective light emitting region of the third color sub-pixel do not meet the requirements of the above embodiments (for example, the area of the second effective light emitting region 201 is not smaller than the area of the third effective light emitting area 301, and for example, the area of the second effective light emitting region 201 is not smaller than the area of the first effective light emitting region 101). However, due to the high requirement of process margin for the light emitting layer of a certain color, or due to some characteristics (such as diffusivity, volatility, adhesion, etc.) of the material of the light emitting layer of a certain color, the area ratio between the light emitting layer and the effective light emitting region of the sub-pixel with the certain color can set to be greater or less than the area ratio between the light emitting layer and the effective light emitting region of the sub-pixel with another color. In some embodiments, due to different application scenarios or different display conditions or different display regions, the area ratio between the light emitting layer and the effective light emitting region of a certain sub-pixel can be set to be greater or less than the area ratio between the light emitting layer and the effective light emitting region of another sub-pixel, which does not necessarily satisfy the magnitude relationship of the corresponding effective light emitting region, or the magnitude relationship of the corresponding luminous efficiency or the magnitude relationship of the corresponding aperture ratio. That is, the magnitude relationship of the effective light emitting region, or the magnitude relationship of the luminous efficiency, or the magnitude relationship of the aperture ratio, is not a necessary requirement for the area ratio between the light emitting layer and the effective light emitting region, and factors affecting the area ratio between the light emitting layer and the effective light emitting region may also include process, materials, specific applications, formation, etc. For example, as shown in FIG. 1A to FIG. 3, the area of the first effective light emitting region 101 of each first color sub-pixel 100 is smaller than the area of the third effective light emitting region 301 of each third color sub-pixel 300. Considering the different lifetime and luminous efficiency of luminescent materials of the light emitting layers of different color sub-pixels, the area of the effective light emitting region of each red sub-pixel is set smaller than the area of the effective light emitting region of each blue sub-pixel.

For example, the area ratio between the orthographic projections of the first color light emitting layer 110 and the first effective light emitting region 101 of each first color sub-pixel 100 on the base substrate 10 is greater than the area ratio between the orthographic projections of the third color light emitting layer 310 and the third effective light emitting region 301 of each third color sub-pixel 300 on the base substrate 10. In the embodiment of the present disclosure, the area ratio between the first color light emitting layer and the first effective light emitting region of the first color sub-pixel is set to be greater than the area ratio between the third color light emitting layer and the third effective light emitting region of the third color sub-pixel, so that the precision margin of the evaporation process of the second color sub-pixel having the effective light emitting region of a relatively smaller area can be set to be relatively larger, and thus, the quality of the second color light emitting layer formed in the second effective light emitting region is more stable, thereby reducing the influence of deviation or fluctuation brought by the evaporation process on the display quality of each sub-pixel. An overlapping part between the first color light emitting layer of one first color sub-pixel and the light emitting layers of other sub-pixels is a first overlapping part, an overlapping part between the third color light emitting layer of one third color sub-pixel and the light emitting layers of other sub-pixels is a second overlapping part, and an overlapping part between the second color light emitting layer of one second color sub-pixel and the light emitting layers of other sub-pixels is a third overlapping part. The area ratio between the orthographic projections of the first overlapping part and the first color light emitting layer on the base substrate, and the area ratio between the orthographic projections of the second overlapping part and the third color light emitting layer on the base substrate are both smaller than the area ratio between the orthographic projections of the third overlapping part and the second color light emitting layer on the base substrate.

Figure 1C:
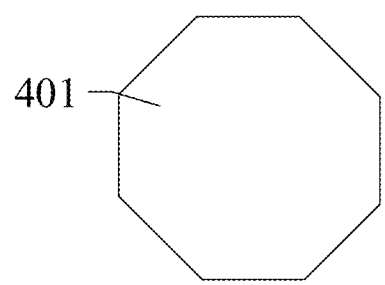
FIG. 1C is a planar structural view of an opening in a pixel defining layer of a display panel provided by another example of an embodiment of the present disclosure.
Figure 1D:
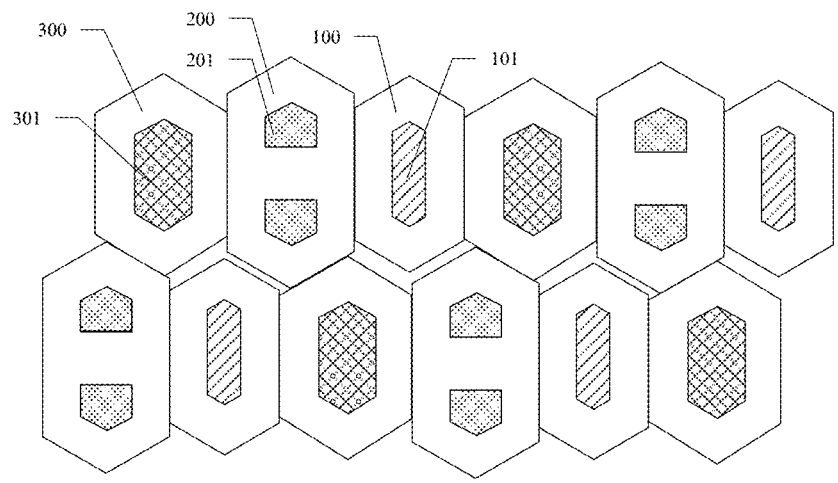
FIGS. 1D-1H are schematic diagrams of various pixel arrangement structures on display panels provided by the embodiments of the present disclosure.

For example, as shown in FIG. 1A and FIG. 1C, the embodiment of the present disclosure illustratively shows that the shapes of the openings 401 defining the effective light emitting regions of the first color sub-pixel 100 and the third color sub-pixel 300 are both square or octagonal, that is, the shapes of the first effective light emitting region 101 and the third effective light emitting region 301 are both square or octagonal; the shapes of the openings on the mask plate used to form the light emitting layers of the first color sub-pixel 100 and the third color sub-pixel 300 are also square or octagonal, that is, the planar shapes of the first color light emitting layer 110 and the third color light emitting layer 310 are both substantially square or octagonal; the shape of the opening 401 for forming the second effective light emitting region 201 of the second color sub-pixel 200 is elliptical, and the shape of the opening on the mask plate used to form the second color light emitting layer 210 is circular.

For example, the shape of the first color light emitting layer 110 is substantially square or rhombic, the side length of an opening on the mask plate corresponding to the first color light emitting layer can be 33 microns; the opening 401 defining the first effective light emitting region 101 has a shape of substantially square or rhombic, and the side length thereof can be 15.2 microns. For example, the shape of the second color light emitting layer 210 is substantially round or octagonal, the diameter of an opening on the mask plate corresponding to the second color light emitting layer can be 33 microns; a shape of the opening 401 defining the second effective light emitting region 201 is substantially any one selected from the group of an oval, an olive, a hexagon, an octagon and a rectangle, and a long axis thereof can be 14 microns, and a short axis thereof can be 12 microns. For example, the diameter of an octagon can be the size of the octagon in a direction passing through the geometric center of the octagon and perpendicular to a pair of opposite sides of the octagon. For example, the shape of the third color light emitting layer 310 is substantially square or rhombic, and the diagonal length of an opening on the mask plate corresponding to the third color light emitting layer can be 50 microns; the opening 401 defining the third effective light emitting region 301 has a shape of substantially square or rhombic, and the side length thereof can be 18.3 microns. For example, the long axis of a hexagon, an octagon or a rectangle can be in the length direction thereof, and the short axis thereof can be in the width direction thereof, such as a direction perpendicular to the long axis direction. For example, each polygonal pattern described above can be a rounded corner pattern.

For example, the area of the orthographic projection (the area of the planar shape) of the first color light emitting layer 110 of the first color sub-pixel 100 on the base substrate 10 can be 900-1200 square microns, such as 1000-1100 square microns, and the area of the first effective light emitting region 101 can be 150-300 square microns, such as 220-240 square microns, and a ratio between the area of the orthographic projection of the first color light emitting layer and the area of the first effective light emitting region is 3-6, such as 4-5. For example, the area of the planar shape of the second color light emitting layer 210 of the second color sub-pixel 200 can be 700-1000 square microns, such as 800-900 square microns, and the area of the second effective light emitting region 201 can be 100-200 square microns, such as 100-150 square microns, and a ratio between the area of the planar shape of the second color light emitting layer and the area of the second effective light emitting region is 5-8, such as 6-7. For example, the area of the planar shape of the third color light emitting layer 310 of the third color sub-pixel 300 can be 1000-1500 square microns, such as 1200-1300 square microns, and the area of the third effective light emitting region 301 can be 200-500 square microns, such as 300-400 square microns, and a ratio between the area of the planar shape of the third color light emitting layer and the area of the third effective light emitting region is 2-6, such as 3-4. According to the above data, it can be seen that the area ratio between the area of the planar shape of the second color light emitting layer and the area of the second effective light emitting region of the second color sub-pixel is greater than the area ratio between the area of the planar shape of the first color light emitting layer and the area of the first effective light emitting region of the first color sub-pixel, and the area ratio between the area of the planar shape of the first color light emitting layer and the area of the first effective light emitting region of the first color sub-pixel is greater than the area ratio between the planar shape of the area of the third color light emitting layer and the area of the third effective light emitting region of the third color sub-pixel.

For example, as shown in FIG. 1A to FIG. 3, the first color light emitting layer 110 and the second color light emitting layer 210 arranged along the third direction and adjacent to each other are overlapped, and the second color light emitting layer 210 and the third color light emitting layer 310 arranged along the fourth direction and adjacent to each other are overlapped. That is, the boundary of the second color light emitting layer 210 can be overlapped to some extent with the boundary of the first color light emitting layer 110, and the boundary of the second color light emitting layer 210 can also be overlapped to some extent with the boundary of the third color light emitting layer 310, thereby improving the resolution of the display panel and improving the process margin. "Overlap" in the embodiment of the present disclosure means that two items are overlapped in the direction perpendicular to the base substrate, that is, the orthographic projections of the two items on the base substrate have an overlapping part.

For example, the formation order of the light emitting layers of the sub-pixels can be as follows: the first color light emitting layer, the second color light emitting layer and the third color light emitting layer, or the third color light emitting layer, the first color light emitting layer and the second color light emitting layer. For example, taking the order in which the first color light emitting layer, the second color light emitting layer and the third color light emitting layer are sequentially formed as an example, the boundary of the third color light emitting layer covers the boundary of the second color light emitting layer, and the boundary of the second color light emitting layer covers the boundary of the first color light emitting layer. For example, the planar shapes of the first color light emitting layer and the third color light emitting layer are rectangular, the light emitting layers at the positions of opposite sides or corners of the first color light emitting layer and the third color light emitting layer may be overlapped or may not be overlapped; the planar shape of the second color light emitting layer is circular or elliptical, a part of the second color light emitting layer close to the side or corner of the first color light emitting layer may not be overlapped with the first color light emitting layer, and a part of the second color light emitting layer close to the side or corner of the third color light emitting layer may not be overlapped with the third color light emitting layer.

For example, as shown in FIG. 1A to FIG. 3, an overlapping part between the first color light emitting layer 110 of one first color sub-pixel 100 and light emitting layers of other sub-pixels is a forth overlapping part, an overlapping part between the third color light emitting layer 310 of one third color sub-pixel 300 and light emitting layers of other sub-pixels is a fifth overlapping part, and an overlapping part between the second color light emitting layer 210 of one second color sub-pixel 200 and light emitting layers of other sub-pixels is a sixth overlapping part. The area ratio between the orthographic projection of forth overlapping part on the substrate 10 and the orthographic projection of the first color light emitting layer 110 on the base substrate 10, and the area ratio between the orthographic projection of fifth overlapping part on the base substrate 10 and the orthographic projection of the third color light emitting layer 310 on the base substrate 10, are both smaller than the area ratio between the orthographic projection of sixth overlapping part on the base substrate 10 and the orthographic projection of the second color light emitting layer 210 on the base substrate 10.

For example, the second color light emitting layer 210 of the second color sub-pixel 200 are overlapped with other color sub-pixels in both the third direction and the fourth direction. For example, the boundary of the second color light emitting layer 210 is overlapped with the boundary of an adjacent first color light emitting layer 110 in the length direction of the effective light emitting region of the second color light emitting layer 210, and the boundary of the second color light emitting layer 210 is overlapped with the boundary of an adjacent third color light emitting layer 310 in the width direction of the effective light emitting region of the second color light emitting layer 210.

For example, as shown in FIG. 1A to FIG. 3, the first color light emitting layer 110 and the third color light emitting layers 310 adjacent to each other are not overlapped, that is, the boundary of the first color light emitting layer 110 may not be overlapped with the boundary of third color light emitting layer 310 adjacent to the first color light emitting layer. The above-mentioned "adjacent" means that there is no other first color light emitting layer or third color light emitting layer between the first color light emitting layer and the third color light emitting layer, and can mean that the first color light emitting layer and the third color light emitting layer are adjacent along at least one of the first direction, the second direction, the third direction and the fourth direction.

For example, the overlapping area of the first color light emitting layer 110 and the third color light emitting layer 310 adjacent to each other is smaller than the overlapping area of the first color light emitting layer 310 and the second color light emitting layer 210 adjacent to each other, and the overlapping area of the third color light emitting layer 310 and the second color light emitting layer 210 adjacent to each other.

For example, the maximum size of an overlapping part between the boundaries of the first color light emitting layer 110 and the third color light emitting layer 310 adjacent to each other in the first direction, and the maximum size of an overlapping part between the boundaries of the first color light emitting layer 110 and the third color light emitting layer 310 adjacent to each other in the second direction, are both smaller than the maximum size of an overlapping part between the boundaries of the first color light emitting layer 110 and second color light emitting layer 210 adjacent to each other in the third direction, and the maximum size of an overlapping part between the boundaries of the second color light emitting layer 210 and the third color light emitting layer 310 adjacent to each other in the fourth direction. In the embodiment of the present disclosure, because the area of the orthographic projection of the second color light emitting layer on the base substrate is the smallest, the overlapping area of the second color light emitting layer and other color light emitting layers is set to be relatively large, thus improving the process margin of the second color sub-pixel.

For example, the distance between the center of the light emitting layer of each sub-pixel and the center of the corresponding effective light emitting region, i.e., the pixel position accuracy (ppa) deviation, is less than 6 microns. For example, the ppa deviation can be ±3 microns. For example, in the case where the display panel provided by the embodiment of the present disclosure is applied to vehicle-mounted products, the ppa deviation of each sub-pixel can be −6 to 6 microns, such as −5 to 5 microns. For example, in the case where the display panel provided by the embodiment of the present disclosure is applied to a display device with high PPI characteristics, the ppa deviation of each sub-pixel can be ±1.5 microns.

For example, the area of the second color light emitting layer of the second color sub-pixel is the smallest, and the ppa deviation thereof accounts for the largest proportion of the size of the light emitting layer.

The above ppa deviation can indicate the alignment accuracy between the fine metal mask and the display panel, which is directly reflected in the alignment accuracy between the opening of the mask plate and the opening of the pixel defining layer corresponding to the same sub-pixel. The opening of the mask plate is used to form the light emitting layer, one aspect of the alignment accuracy between FMM (fine metal mask) and the display panel is the distance between the center of the light emitting layer and the center of a corresponding opening of the pixel defining layer.

For example, as shown in FIG. 1A to FIG. 3, the pixel defining layer 400 includes a flat surface 403 at one side of the pixel defining layer 400 away from the base substrate 10, a width of the flat surface 403 between the first effective light emitting region 101 and the second effective light emitting region 201 adjacent to each other in the third direction or the fourth direction is approximately equal to the width of the flat surface 403 between the second effective light emitting region 201 and the third effective light emitting regions 301 adjacent to each other in the fourth direction or the third direction. That is, the pixel defining layer gaps between sub-pixels with different colors (the PDL gaps) are approximately the same. For example, the distance between adjacent first effective light emitting region and second effective light emitting region along the third or fourth direction is approximately equal to the distance between adjacent second effective light emitting region and third effective light emitting region along the fourth or third direction. For example, the distance between adjacent first effective light emitting region and second effective light emitting region along the length direction of the second effective light emitting region is approximately equal to the distance between adjacent second effective light emitting region and third effective light emitting region along the width direction of the second effective light emitting region.

For example, the width of the pixel defining layer between adjacent first effective light emitting region and second effective light emitting region in the third direction is in the range from 15 to 25 microns; the pixel defining layer includes a first surface away from the base substrate and between adjacent first effective light emitting region and second effective light emitting region, in a plane parallel to the base substrate and along the third direction, a part of the first surface covered by the first color light emitting layer is 0.3-0.8 times the width of the pixel defining layer. For example, a part of the first surface covered by the second color light emitting layer is 0.3-0.8 times the width of the pixel defining layer. For example, the width of the pixel defining layer between adjacent third effective light emitting region and second effective light emitting region in the third direction is in the range from 15 to 25 microns. For example, the pixel defining layer includes a second surface away from the base substrate and between adjacent third effective light emitting region and second effective light emitting region, in a plane parallel to the base substrate and along the third direction, a part of the second surface covered by the third color light emitting layer is 0.3-0.8 times the width of the pixel defining layer. For example, a part of the second surface covered by the second color light emitting layer is 0.3-0.8 times the width of the pixel defining layer.

For example, the width of a part of the pixel defining layer 400 between adjacent first effective light emitting region 101 and second effective light emitting region 201 along the length direction of the second effective light emitting region 201 can be in the range from 15 to 25 microns, that is, the size of the PDL gap is about in the range from 15 to 25 microns. For example, the size of the PDL gap is about in the range from 16 to 18 microns. For example, when there exists a slope at the position of the pixel defining layer where an opening is formed, the width of the flat surface 403 of the pixel defining layer 400 is smaller than the size of the PDL gap.

For example, the width of the part in the light emitting layer of each sub-pixel covering the flat surface 403 of the pixel defining layer 400 is 0.3-0.8 times the width of the pixel defining layer 400. For example, the width of the part, which is covered, of the flat surface 403 of the pixel defining layer 400 in the light emitting layer of each sub-pixel is 0.4 to 0.6 times the width of the flat surface 403.

For example, in the plane parallel to the base substrate and along the length direction (e.g., the third direction) of the second effective light emitting region, the part of the first surface covered by the first color light emitting layer is 0.3-0.8 times the width of the pixel defining layer. For example, in the plane parallel to the base substrate and along the length direction (e.g., the third direction) of the second effective light emitting region, the part of the first surface covered by the second color light emitting layer is 0.3-0.8 times the width of the pixel defining layer.

For example, the width of the pixel defining layer at each position can be the size in a direction substantially perpendicular to the center line of the pixel defining layer at the each position and passing through the centers of adjacent effective light emitting regions. For example, in the display region, the pixel defining layer is grid-shaped, and the center line (center line CL shown in FIG. 17B) of the pixel defining layer at each position can be the center line of each pixel defining layer segment constituting the grid in the extending direction thereof, the center line is parallel to the extending direction of the pixel defining layer segment, and the center line can divide the pixel defining layer segment into two parts with approximately the same area on both sides.

In order to realize a dense arrangement of the sub-pixels of each color, the process accuracy of each sub-pixel is the same in the manufacturing process, and each light emitting layer not only covers the corresponding opening of the pixel defining layer, but also covers about half of the width of the flat surface between adjacent openings.

For example, the length direction of one second color sub-pixel 200 is the third direction, and the width direction of the second color sub-pixel 200 is the fourth direction. The first color light emitting layer 110 covers the pixel defining layer 400 between adjacent first color sub-pixel 100 and second color sub-pixel 200, and the width of the part of the first color light emitting layer 110 covering the flat surface 403 of the pixel defining layer 400 in the third direction is 0.3-0.8 times the width of the pixel defining layer 400 in the third direction; the second color light emitting layer 210 covers the pixel defining layer 400 between adjacent first color sub-pixel 100 and second color sub-pixel 200, and the width of the part of the second color light emitting layer 210 covering the flat surface 403 of the pixel defining layer 400 in the third direction is 0.3-0.8 times the width of the pixel defining layer 400 in the third direction.

For example, the length direction of one second color sub-pixel 200 is the third direction, and the width direction of the second color sub-pixel 200 is the fourth direction. The third color light emitting layer 310 covers the pixel defining layer 400 between adjacent third color sub-pixel 300 and second color sub-pixel 200, and the width of the part of the third color light emitting layer 310 covering the flat surface 403 of the pixel defining layer 400 in the fourth direction is 0.3-0.8 times the width of the pixel defining layer 400 in the fourth direction; the second color light emitting layer 210 covers the pixel defining layer 400 between adjacent third color sub-pixel 300 and second color sub-pixel 200, and the width of the part of the second color light emitting layer 210 covering the flat surface 403 of the pixel defining layer 400 in the fourth direction is 0.3-0.8 times the width of the pixel defining layer 400 in the fourth direction.

For example, as shown in FIG. 2 and FIG. 3, the edge region of each light emitting layer includes an annular region, which extends by about a certain width in the direction from the outer edge to the center. In the process of manufacturing the light emitting layer of each color sub-pixel, each color light emitting layer will diffuse to the periphery due to process reasons, and the internal diffusion of the light emitting layer may be uneven, so that a shadow region is formed. For example, the annular region includes the shadow region. The annular region is located at the edge region of the light emitting layer, and the width a of the annular region can be 1-4 microns, and for example, can be 3-4 microns, and for example, can be 1-3 microns. For example, the average thickness of the light emitting layer in the annular region is less than the average thickness of the light emitting layer in the effective light emitting region. For example, the light emitting layer of the annular region is located at the outer side of the opening of the pixel defining layer, for example, on the pixel defining layer. For example, the light emitting layer in the annular region is overlapped with the center line of a corresponding pixel defining layer along the extending direction thereof. For example, the average thickness of the light emitting layer in the annular region is less than or equal to 90% of the average thickness of the light emitting layer in the opening of the pixel defining layer. For example, the average thickness of the light emitting layer in the annular region is less than or equal to 95% of the average thickness of the light emitting layer in the opening of the pixel defining layer. For example, the average thickness of the light emitting layer in the annular region is less than or equal to 80% of the average thickness of the light emitting layer in the opening of the pixel defining layer.

For example, taking the first color light emitting layer 110 as an example, the edge regions of the first color light emitting layer 110 close to an adjacent second color light emitting layer 210 and an adjacent third color light emitting layer 310 can both be annular regions, and the width, along the third direction, of the annular region of the first color light emitting layer 110 close to the second color light emitting layer 210, is a. The first color light emitting layer 110 which is adjacent to the second color light emitting layer 210 in the first direction has the annular region, which has a width of a in the first direction. The first color light emitting layer 110 which is adjacent to the third color light emitting layer 210 in the second direction has the annular region, which has a width of a in the second direction.

For example, the annular regions of adjacent light emitting layer patterns with different colors are overlapped. For example, the annular region of the red light emitting layer and the annular region of the green light emitting layer are overlapped. For example, the annular region of the green light emitting layer and the annular region of the blue light emitting layer are overlapped. For example, the annular region of the red light emitting layer and the annular region of the blue light emitting layer are overlapped. For example, in at least some regions, the annular regions of the red light emitting layer, the green light emitting layer and the blue light emitting layer are all overlapped.

For example, the spacing between light emitting layers emitting light with the same color is not less than 10 microns. For example, the spacing between light emitting layers emitting light with the same color is not less than 12 microns. For example, the minimum spacing between light emitting layers of green sub-pixels is not less than 11 microns. For example, the minimum spacing between light emitting layers of red sub-pixels is greater than the minimum spacing between light emitting layers of green sub-pixels. For example, the minimum spacing between light emitting layers of red sub-pixels is not less than 15 microns. For example, the minimum spacing between light emitting layers of red sub-pixels is not less than 20 microns. For example, the minimum spacing between light emitting layers of blue sub-pixels is greater than the minimum spacing between light emitting layers of green sub-pixels. For example, the minimum spacing between light emitting layers of blue sub-pixels is not less than 14 microns. For example, the minimum spacing between light emitting layers of blue sub-pixels is not less than 18 microns.

For example, the width of a part of the pixel defining layer between adjacent sub-pixels is a', that is, the width of PDL gap is a'; the width of the overlapping part of adjacent light emitting layers is o, and o≥a and o<(0.5*a')−a. For example, the size of the overlapping part between adjacent first color light emitting layer and second color light emitting layer along the third direction is o1, o1≥a and o1<(0.5*−a')−a; the size of a part of the pixel defining layer between adjacent third color light emitting layer and second color light emitting layer along the fourth direction is a', the size of the overlapping part of adjacent third color light emitting layer and second color light emitting layer along the fourth direction is o2, o2≥a and o2<(0.5*a')−a.

For example, as shown in FIG. 1A to FIG. 3, in the portion of each light emitting layer located on the flat surface 403 of the pixel defining layer 400, the area that is not overlapped with the light emitting layers of other sub-pixels is greater than the area that is overlapped with the light emitting layers of other sub-pixels.

For example, the portion of the first color light emitting layer 110 located on the flat surface 403 includes a first part overlapped with the second color light emitting layer 210 and a second part not overlapped with the second color light emitting layer 210, the size of the first part in the third direction is smaller than the size of the second part in the third direction; the portion of the second color light emitting layer 210 located on the flat surface 403 includes a third part overlapped with the first color light emitting layer 110 and a fourth part not overlapped with the first color light emitting layer 110, the size of the third part in the third direction is smaller than the size of the fourth part in the third direction.

For example, the portion of the third color light emitting layer 310 located on the flat surface 403 includes a fifth part overlapped with the second color light emitting layer 210 and a sixth part not overlapped with the second color light emitting layer 210, the size of the fifth part in the fourth direction is smaller than the size of the sixth part in the fourth direction; the portion of the second color light emitting layer 210 located on the flat surface 403 includes a seventh part overlapped with the third color light emitting layer 310 and an eighth part not overlapped with the third color light emitting layer 310, the size of the seventh part in the fourth direction is smaller than the size of the eighth part in the fourth direction.

For example, as shown in FIG. 2, at one side of the midline of the PDL gap, in the light emitting layer on the pixel defining layer, the width of the part not overlapped with the adjacent light emitting layers is greater than the width of the part overlapped with the adjacent light emitting layers.

For example, as shown in FIG. 2 and FIG. 3, the first color sub-pixel 100 further includes a second electrode 120 between the first color light emitting layer 110 and the base substrate, the second color sub-pixel 200 further includes a second electrode 220 between the second color light emitting layer 210 and the base substrate, and the third color sub-pixel 300 further includes a second electrode 320 between the third color light emitting layer 310 and the base substrate. The second electrode of each sub-pixel and the pixel defining layer 400 have an overlapping part along the direction perpendicular to the base substrate, and the size of the overlapping part is smaller than the overlapping part between the light emitting layer of the corresponding sub-pixel and the pixel defining layer 400, and also smaller than the overlapping part between the light emitting layer of the corresponding sub-pixel and the light emitting layers of the adjacent sub-pixels.

Figure 13A:
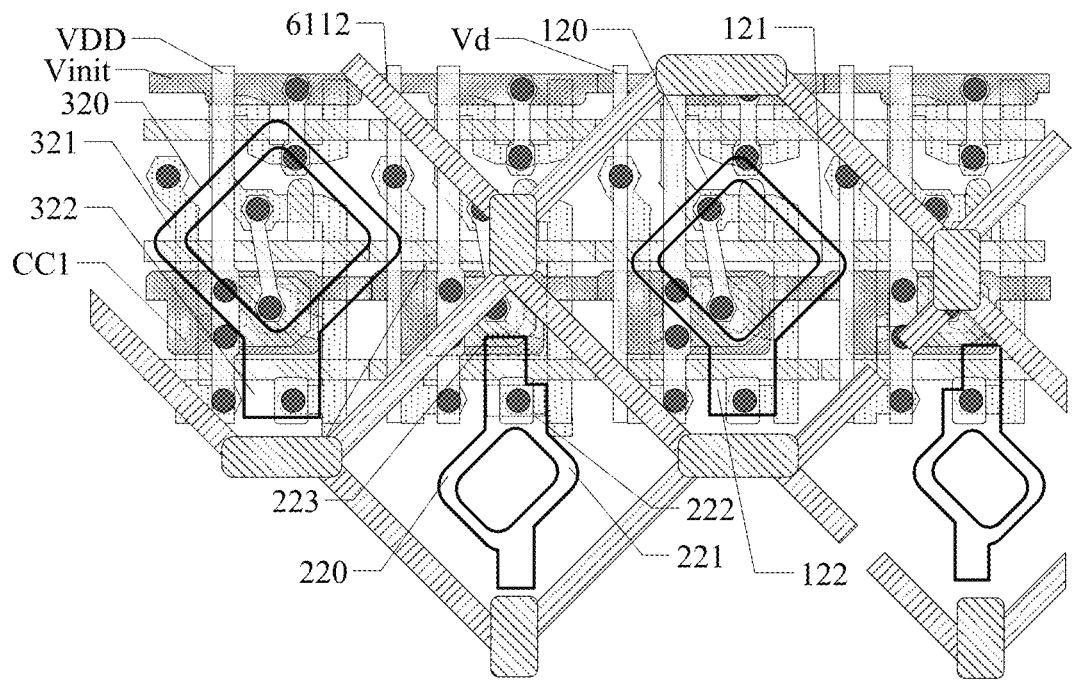
FIGS. 13A-13E are schematic diagrams of various positional relationships between pixel circuits and touch electrode lines provided by the embodiments of the present disclosure.

For example, the second electrode in each sub-pixel includes a main body electrode (referring to FIG. 13A), and in a direction from the center of the effective light emitting region to the edge of the effective light emitting region, the size of the overlapping part between the main body electrode and the pixel defining layer is not greater than the size of the overlapping part between the light emitting layer and the pixel defining layer. For example, in each sub-pixel, the shape of the main body electrode and the shape of the effective light emitting region are substantially the same, or are approximate patterns. Referring to FIG. 13A, in the first color sub-pixel, the shape of the main body electrode 121 and the shape of the first effective light emitting region 101 are substantially the same, and for example, both are approximately square.

For example, in a display panel, the overall aperture ratio of the first color sub-pixel 100 can be 4%-5.5%, for example, 4%-5%, and for example, 4.81%. For example, the overall aperture ratio of the second color sub-pixel 200 can be 4%-7%, for example, 5%-6%, and for example, 5.49%. For example, the overall aperture ratio of the third color sub-pixel 300 can be 5%-8%, for example, 6%-7%, and for example, 6.97%. For example, the PDL gap can be 18-25 microns, for example, about 24 microns, for example, about 23 microns, for example, about 22 microns, for example, about 21 microns, for example, about 20 microns, and for example, about 19 microns. For example, the distance between the second electrodes of adjacent sub-pixels can be 1-6 microns, for example, 2-4 microns, for example, 2-3 microns, and for example, 2.5 microns. For example, the width of the overlapping part between the second electrode and the pixel defining layer can be 0.5-4 microns, for example, 1-3 microns, for example, 1-2 microns, and for example, 1.5-1.7 microns.

For example, the aperture ratio of the first color sub-pixel can be 4.45%, the aperture ratio of the second color sub-pixel can be 6.20%, and the aperture ratio of the third color sub-pixel can be 8.53%. For example, the PDL gap can be 19 microns. For example, the distance between the second electrodes of adjacent sub-pixels can be 5 microns, and the width of the overlapping part between the second electrode and the pixel defining layer can be 2.5 microns.

For example, as shown in FIG. 2, the size b of the overlapping part between the main body electrode of the second electrode 120 in the first color sub-pixel 100 and the pixel defining layer 400 along the third direction is less than the size c of the overlapping part between the first color light emitting layer 110 and the pixel defining layer 400 along the third direction. Similarly, the size of the overlapping part between the main body electrode of the second electrode 220 in the second color sub-pixel 200 and the pixel defining layer 400 along the third direction is less than the size of the overlapping part between the second color light emitting layer 210 and the pixel defining layer 400 along the third direction.

It should be noted that the second electrode of each sub-pixel includes a main body electrode (to be described later) and a connection electrode (to be described later) connected with the main body electrode, and the connection electrode is configured to be connected with a pixel circuit (to be described later). For example, the "overlapping part between the second electrode and the pixel defining layer" mentioned in the embodiment of the present disclosure may refer to the overlapping part between the main body electrode of the second electrode and the pixel defining layer.

For example, the size b of the overlapping part between the main body electrode of the second electrode 120 in the first color sub-pixel 100 and the pixel defining layer 400 can be less than the size of the overlapping part between the first color light emitting layer 110 and an adjacent second color light emitting layer 210 along the third direction. The size of the overlapping part between the main body electrode of the second electrode 220 in the second color sub-pixel 200 and the pixel defining layer 400 along the third direction is less than the size of the overlapping part between the second color light emitting layer 210 and an adjacent first color light emitting layer 110 along the third direction.

For example, as shown in FIG. 3, the size d of the overlapping part between the main body electrode of the second electrode 220 in the second color sub-pixel 200 and the pixel defining layer 400 along the fourth direction is less than the size e of the overlapping part between the second color light emitting layer 210 and the pixel defining layer 400 along the fourth direction. Similarly, the size of the overlapping part between the main body electrode 320 in the third color sub-pixel 300 and the pixel defining layer 400 along the fourth direction is less than the size of the overlapping part between the third color light emitting layer 310 and the pixel defining layer 400 along the fourth direction.

For example, the size d of the overlapping part between the second electrode 220 in the second color sub-pixel 200 and the pixel defining layer 400 is less than the size of the overlapping part between the second color light emitting layer 210 and an adjacent third color light emitting layer 310 along the fourth direction. Similarly, the size of the overlapping part between the second electrode 320 in the third color sub-pixel 300 and the pixel defining layer 400 along the fourth direction is less than the size of the overlapping part between the third color light emitting layer 310 and an adjacent second color light emitting layer 210 along the fourth direction.

For example, the width of the overlapping region between the pixel defining layer 400 and the main body electrode of each second electrode is greater than 1.7 microns, and for example, greater than 2 microns. If the size of the part of the main body electrode of each second electrode covered by the pixel defining layer is too large, the aperture ratio of the sub-pixel will decrease; however, if the edge of the main body electrode of the second electrode is not covered by the pixel defining layer, it will easily lead to problems of breakdown and short circuit, etc., at the corner of the main body electrode of the second electrode. Therefore, on the premise of avoiding breakdown, minimizing the overlapping area between the pixel defining layer and the second electrode can improve the aperture ratio to the best, improve the display brightness and reduce the power consumption.

In some embodiments, the display panel may have no touch function, that is, it may not include touch electrodes. In some embodiments, the touch electrodes of the display panel may not adopt the arrangement manner of touch electrode lines and bridge lines, and for example, the touch electrodes may be electrodes having a plane shape. In some embodiments, the material of the touch electrode of the display panel can be metal, metal oxide or any other conductive material.

In some embodiments, spacers can be disposed on the pixel defining layer. In some embodiment, the spacers on the pixel defining layer can be integrally formed with the pixel defining layer. In some embodiments, there may be no spacers on the pixel defining layer. For example, the spacers are disposed on other film layers. For example, the spacers are formed on an opposing substrate. For example, the spacers are formed on the mask plate. In some embodiments, the spacers may not be overlapped with the pixel defining layer. In some embodiments, the size and area of the spacer and the pixel defining layer may not necessarily satisfy the relationship in the following embodiments. For example, the density of spacers is set to be relatively large; for example, the number of spacers is approximately the same as the number of pixels, and for example, the ratio of the number of spacers to the number of sub-pixels is 0.8-1.2. For example, in the direction of the center connection line of the openings of adjacent pixel defining layer, the size of the spacer is equivalent to the size of the spacing between the openings of the pixel defining layer, and for example, the ratio between the size of the spacer and the size of the spacing between the openings of the pixel defining layer is approximately 0.8-1.2.

With the rapid development of touch sensing technology, many consumer electronic products, such as mobile phones, GPS navigator systems, tablet PCs, personal digital assistants (PDAs) and laptop PCs, have products combined with touch function. At present, the technology development of touch panel is very diversified, and the common technologies include resistive type, capacitive type and optical type, etc. The capacitive touch panel has become the mainstream touch technology because of high accuracy, multi-touch, high durability and high touch resolution. The operation principle of the capacitive touch panel is to use sensing electrodes to detect the capacitance changes of touch points, and to use touch signal transmission traces connecting the electrodes in different directions to transmit signals back, so as to complete positioning.

In a capacitive touch panel technology, the sensing electrode is made of a transparent conductive material, such as indium tin oxide. Because the resistivity of the transparent conductive material is higher than that of a metal conductive material, the problem that the overall resistance value is too high to affect the reaction speed may occur in the case where the transparent conductive material is used to form the sensing electrode. Therefore, the design of forming the sensing electrode by using a metal mesh interwoven with metal traces instead of a transparent conductive material, can improve the reaction speed.

With the development of flexible organic light emitting diode display devices, it has become a trend to provide low-cost flexible touch solutions. A flexible touch solution includes: manufacturing touch electrodes on a thin film (e.g., an encapsulation film layer) to form a touch screen. The encapsulation film layer can be, for example, an inorganic layer or a stack of an organic layer and an inorganic layer. The material of the inorganic layer can be, for example, silicon nitride; and the material of the organic layer can be, for example, polyimide. After forming the encapsulation film layer, for example, a film layer made of silicon dioxide is formed thereon, and then a first metal mesh layer, a touch insulation layer and a second metal mesh layer are sequentially formed at one side of the silicon dioxide film layer away from the encapsulation film layer.

According to different touch manners, the capacitive touch screens can be divided into self-capacitive touch screens and mutual-capacitive touch screens. Because the mutual-capacitive touch screens can realize multi-touch, the mutual-capacitive touch screens have become the mainstream products in the current touch screen market and the development trend in the future.

Figure 4:
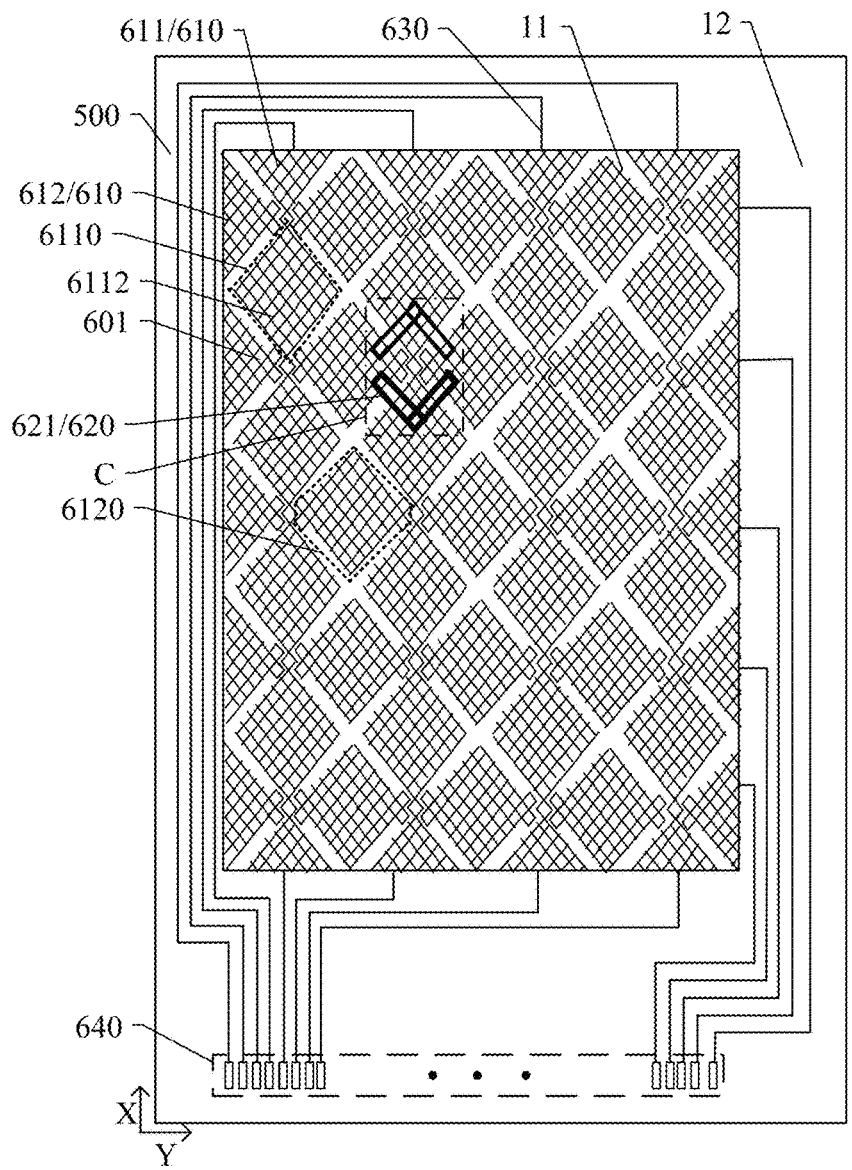
FIG. 4 is a partial planar structural view of a touch structure in a display panel provided by an embodiment of the present disclosure.
Figure 5:
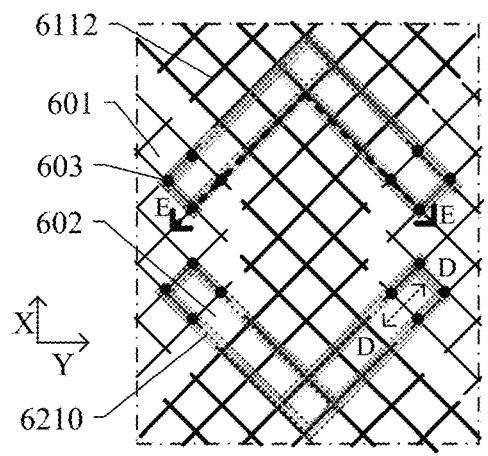
FIG. 5 is an enlarged structural view of region C shown in FIG. 4.
Figure 6:
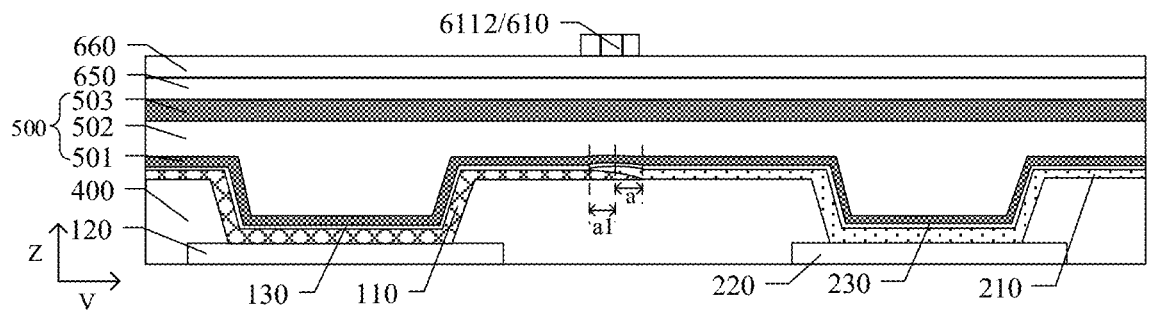
FIG. 6 is a partial cross-sectional structural view taken along line DD shown in FIG. 5.
Figure 7:
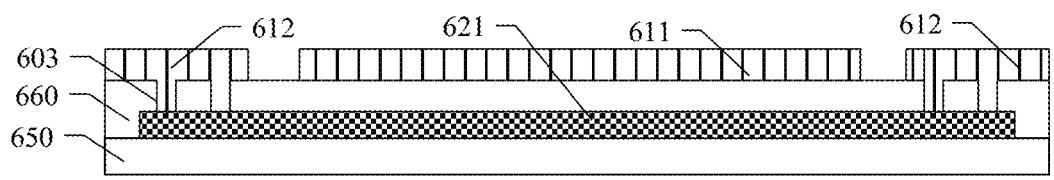
FIG. 7 is a partial cross-sectional structural view taken along line EE shown in FIG. 5.

FIG. 4 is a partial planar structural view of a touch structure in a display panel provided by an embodiment of the present disclosure, FIG. 5 is an enlarged structural view of region C shown in FIG. 4, FIG. 6 is a partial cross-sectional structural view taken along line DD shown in FIG. 5, and FIG. 7 is a partial cross-sectional structural view taken along line EE shown in FIG. 5. As shown in FIG. 6, each sub-pixel further includes a first electrode located at one side of the light emitting layer away from the second electrode. For example, taking the first color sub-pixel and the second color sub-pixel as examples, the first color sub-pixel 100 includes a first electrode 130, and the second color sub-pixel 200 includes a first electrode 230.

For example, the first electrode of each sub-pixel can be formed as a continuous film layer, that is, the first electrode is a common electrode of the sub-pixel. For example, an encapsulation layer 500 covering the display region 11 and the peripheral region 12 is provided at one side of the first electrode away from the base substrate, and the encapsulation layer 500 covers the sub-pixels in the display region and the pixel defining layer 400. For example, the encapsulation layer 500 can include a first inorganic encapsulation layer 501, an organic encapsulation layer 502 and a second inorganic encapsulation layer 503, which are sequentially stacked. For example, a buffer layer 650 is provided at one side of the encapsulation layer 500 away from the first electrode, and a touch insulation layer 660 is provided at one side of the buffer layer 650 away from the encapsulation layer 500. For example, the material of the touch insulation layer 660 can include an inorganic material, such as silicon oxide or silicon nitride, etc.

For example, as shown in FIG. 4 to FIG. 7, at least one embodiment of the present disclosure provides a display panel, which includes: a base substrate, including a display region and a peripheral region located at the peripheral of the display region; a plurality of first color sub-pixels, located in the display region, the plurality of first color sub-pixels being arranged along a first direction to form a plurality of first color sub-pixel rows, the plurality of first color sub-pixel rows being arranged along a second direction, and adjacent first color sub-pixel rows in the plurality of first color sub-pixel rows are shifted with each other along the first direction; a plurality of second color sub-pixels, located in the display region, and arrayed along the first direction and the second direction, and four second color sub-pixels surrounding one first color sub-pixel; a plurality of third color sub-pixels, located in the display region, the plurality of first color sub-pixels and the plurality of third color sub-pixels being alternately arranged along the first direction and the second direction, the plurality of first color sub-pixels and the plurality of second color sub-pixels being alternately arranged along a third direction as a first group, the plurality of third color sub-pixels and the plurality of second color sub-pixels being alternately arranged along the third direction as a second group, the first group and the second group being alternately arranged along the fourth direction, and the third direction and the fourth direction being intersected with both the first direction and the second direction; a pixel defining layer, located in the display region and the peripheral region, the pixel defining layer including a plurality of openings to define effective light emitting regions of the plurality of sub-pixels, the plurality of first color sub-pixels including a plurality of first effective light emitting regions, the plurality of second color sub-pixels including a plurality of second effective light emitting regions, and the plurality of third color sub-pixels including a plurality of third effective light emitting regions. The plurality of first color sub-pixels include a plurality of first color light emitting layers located in the corresponding openings and on the pixel defining layer surrounding the corresponding openings, the plurality of second color sub-pixels include a plurality of second color light emitting layers located in the corresponding openings and on the pixel defining layer surrounding the corresponding openings, the plurality of first color light emitting layers included in the plurality of first color sub-pixels are spaced apart from each other, and the plurality of second color light emitting layers included in the plurality of second color sub-pixels are spaced apart from each other; the plurality of third color sub-pixels include a plurality of third color light emitting layers located in the corresponding openings and on the pixel defining layer surrounding the corresponding openings, and the plurality of third color light emitting layers included in the plurality of third color sub-pixels are spaced apart from each other.

The display panel further includes: an encapsulation layer, located in the display region and the peripheral region; a first touch electrode layer, located at one side of the encapsulation layer away from the base substrate, the first touch electrode layer including a plurality of first touch electrodes extending along the first direction and a plurality of second touch electrodes extending along the second direction, each first touch electrode including a plurality of first touch electrode units, each second touch electrode including a plurality of second touch electrode units, the first touch electrode layer including a plurality of touch electrode lines, the plurality of touch electrode lines being intersected to form a plurality of first meshes, and both each first touch electrode unit and each second touch electrode unit including a plurality of communicated first meshes; a second touch electrode layer, including a plurality of connection bridges, the second touch electrode layer including a plurality of bridge lines, the plurality of bridge lines being intersected to form a plurality of second meshes, each connection bridge including a plurality of communicated second meshes, and adjacent second touch electrode units being electrically connected through at least one connection bridge; a touch insulation layer, located between the first touch electrode layer and the second touch electrode layer, and the second touch electrode unit being electrically connected with the connection bridge through a via hole penetrating through the touch insulation layer. The orthographic projection of the plurality of touch electrode lines in the display region on the base substrate is located within the orthographic projection of the pixel defining layer on the base substrate.

In some embodiments, the first color sub-pixel, the second color sub-pixel and the third color sub-pixel may not be arranged according to the above embodiments. The touch electrode line and bridge line of each touch electrode are located at the spacing between the light emitting regions of the sub-pixels, and for example, the orthographic projection of the touch electrode line and bridge line of each touch electrode can be substantially located within the orthographic projection of the pixel defining layer on the base substrate. In some embodiments, only a partial region of the display panel has a touch function, and the touch electrode line and bridge line of each touch electrode may be arranged only in this partial region. In some embodiments, the touch electrode line and bridge line of each touch electrode are located on another substrate opposite to the base substrate. In some embodiments, the touch electrode line and bridge line of each touch electrode are located on a touch substrate, and the touch substrate and the base substrate with pixel structures are assembled to form a display panel with touch function. In some embodiments, the magnitude relationship of the area ratio between the light emitting layer of the sub-pixel and the corresponding effective light emitting region in the display panel can be the same as that set in the above embodiments. In some embodiments, the magnitude relationship of the area ratio between the light emitting layer of the sub-pixel and the corresponding effective light emitting region in the display panel can be different from that set in the above embodiments, that is, the area ratio may have no specific magnitude relationship, or the magnitude relationship of the area ratio of at least some sub-pixels may not satisfy the relationship in the above embodiments.

For example, as shown in FIG. 4 to FIG. 7, the display panel further includes a first touch electrode layer 610 and a second touch electrode layer 620 located at one side of the buffer layer 650 away from the encapsulation layer 500. For example, the second touch electrode layer 620 can be located between the first touch electrode layer 610 and the encapsulation layer 500, and a touch insulation layer 660 is further disposed between the first touch electrode layer 610 and the second touch electrode layer 620. The embodiment of the present disclosure is not limited thereto, and the second touch electrode layer 620 can also be located at one side of the first touch electrode layer 610 away from the encapsulation layer 500.

For example, the first touch electrode layer 610 includes a plurality of first touch electrodes 611 and a plurality of second touch electrodes 612, each first touch electrode 611 includes a plurality of first touch electrode units 6110 arranged along a first direction, and each second touch electrode includes a plurality of second touch electrode units 6120 arranged along a second direction. The first touch electrode layer 610 includes a plurality of touch electrode lines 6112, and the plurality of touch electrode lines 6112 are intersected to form a plurality of first meshes 601. Both each first touch electrode unit 6110 and each second touch electrode unit 6120 include a plurality of communicated first meshes 601. Here, the plurality of communicated first meshes refer to a plurality of first meshes which are electrically connected and integrated.

For example, the second touch electrode layer 620 includes a plurality of connection bridges 621, each connection bridge includes a plurality of bridge lines 6210, the plurality of bridge lines 6210 are intersected to form a plurality of second meshes 602, each connection bridge 621 includes a plurality of communicated second meshes 602, and adjacent second touch electrode units 6120 are electrically connected through at least one connection bridge 621. Here, the plurality of communicated second meshes refer to a plurality of second meshes which are electrically connected and integrated.

For example, one of the first touch electrode 611 and the second touch electrode 612 is a touch sensing electrode, and the other of the first touch electrode 611 and the second touch electrode 612 is a touch driving electrode. Both the touch sensing electrode and the touch driving electrode are formed in the same electrode layer, that is, in the first touch electrode layer 610. One kind of the touch sensing electrodes and the touch driving electrodes, such as the plurality of first touch electrode units 6110, are directly connected, and the other kind of the touch sensing electrodes and the touch driving electrodes, such as the plurality of second touch electrode units 6120, are disconnected at the position where adjacent first touch electrode units are directly connected, and a connection bridge is formed via another electrode layer. That is, a line of first touch electrode units 6110 arranged along the X direction are directly electrically connected, and a line of second touch electrode units 6120 arranged along the Y direction are electrically connected through a connection bridge 621 in the second touch electrode layer 620.

For example, FIG. 4 to FIG. 5 illustratively show that two adjacent second touch electrode units 6120 are electrically connected through two connection bridges 621, which is not limited thereto, and two adjacent second touch electrode units 6120 can also be electrically connected through one connection bridge or more connection bridges.

For example, as shown in FIG. 4 to FIG. 7, the orthographic projection of the plurality of touch electrode lines 6112 located in the display region on the base substrate is within the orthographic projection of the pixel defining layer 400 on the base substrate, that is, the line width of each touch electrode line 6112 is smaller than the width of the PDL gap. The line width of each touch electrode line 6112 is 2-5 microns. For example, the line width of each touch electrode line 6112 can be 3 microns. For example, the material of the touch electrode line can include metal. For example, the material of the touch electrode line can include three layers of Ti/Al/Ti. Because the touch electrode line includes metal and has a certain width and thickness, it has a certain shielding effect on the light emitted from each color sub-pixel. In order to make the touch electrode line not affect the balance of the whole display, the line width of the touch electrode line can be set relatively narrow and the touch electrode line may not be overlapped with the effective light emitting region of each sub-pixel.

For example, the line width of the touch electrode line 6112 can be the same as the line width of the bridge line 6210, for convenience of manufacturing, which is not limited thereto. And the line width of the bridge line may also be greater than the line width of the touch electrode line.

For example, as shown in FIG. 4 to FIG. 7, in the pixel defining layer 400, the pixel defining layer segment overlapped with the touch electrode line 6112 has the center line extending along the extending direction of the touch electrode line 6112. In the display region, more than 80% of the orthographic projection of the center line on the base substrate is located in the orthographic projection of the touch electrode line 6112 on the base substrate. For example, in the display region, more than 90% of the orthographic projection of the center line on the base substrate is located in the orthographic projection of the touch electrode line 6112 on the base substrate. For example, except for the fracture part of the touch electrode line 6112, the orthographic projection of the center line on the base substrate is substantially located in the orthographic projection of the touch electrode line 6112 on the base substrate. For example, the center line of the pixel defining layer extending along the extending direction of the touch electrode line can also be a boundary line of half the width of the pixel defining layer between the effective light emitting regions of different color sub-pixels.

In some embodiments, the extending direction of each part of the touch electrode line 6112 or the bridge line may not be completely the same as the extending direction of a corresponding pixel defining layer segment, and for example, there exists a certain included angle between the extending directions as mentioned above. For example, the included angle is in the range from 0 to 30 degrees. In some embodiments, some pixel defining layer segments are special-shaped or curved portions. For example, some regions have notches or protruding portions, and the extending direction thereof can be the extending trend of the main body portion or the general extending trend of the curved portion.

In the embodiment of the present disclosure, the touch electrode line is arranged at the middle position of the PDL gap, and for example, the center line of the pixel defining layer is covered by the touch electrode line, which can prevent the touch electrode line from affecting the balance of the whole display of the display panel.

For example, the orthographic projection of the center line, extending along the extending direction of the bridge line 6210, of the surface of the pixel defining layer 400 at one side away from the base substrate on the base substrate, is located within the orthographic projection of the bridge line 6210 on the base substrate. In the embodiment of the present disclosure, the touch electrode line is arranged at the middle position of the PDL gap, and for example, the center line of the pixel defining layer is covered by the bridge line, which can prevent the bridge line from affecting the balance of the whole display of the display panel.

For example, as shown in FIG. 4 to FIG. 7, the first electrode in the effective light emitting region of each sub-pixel is not overlapped with the touch electrode line 6112 and the bridge line 6210, and the thickness of the insulation layer between the first electrode and the second touch electrode layer 620 in the effective light emitting region of each sub-pixel is greater than the thickness of the insulation layer between the first electrode and the second touch electrode layer 620 in the non-light emitting region. Because the second touch electrode layer is formed on the encapsulation film, the distance between the first electrode and the second touch electrode layer is small. The signal on the first electrode is the signal driving the light emitting layer to emit light, while the signal on the touch electrode layer is the touch electrode signal; these two signals are different, and interference will occur if the distance between the first electrode and the second touch electrode layer is set too small. Therefore, by setting the thickness of the insulation layer between the first electrode and the touch electrode layer in the effective light emitting region of each sub-pixel to be relatively large, the signal interference between the first electrode and the touch electrode layer can be effectively reduced, so as to prevent normal display or touch accuracy from being affected.

For example, as shown in FIG. 6, the first electrodes of the plurality of sub-pixels are an integral film layer, one of the first touch electrode layer and the second touch electrode layer which is closer to the first electrode is a closer touch electrode layer, the distance between the first electrode in the effective display region and the closer touch electrode layer is greater than the distance between the first electrode on the pixel defining layer and the closer touch electrode layer.

For example, the first electrode is an integral film layer, and the distance between the first electrode located in the effective light emitting region and the first touch electrode layer is greater than the distance between the first electrode located at the outer side of the effective light emitting region and the first touch electrode layer. For example, the first electrode located at the outer side of the effective light emitting region is a portion formed on one side of a concrete structure of the pixel defining layer away from the base substrate and overlapped with the concrete structure of the pixel defining layer. For example, there are only some light emitting functional film layers between the first electrode located at the outer side of the effective light emitting region and the concrete structure of the pixel defining layer, and two surfaces of these light emitting functional film layers are respectively in contact with the first electrode located at the outer side of the effective light emitting region and the concrete structure of the pixel defining layer.

For example, in the display region, the total thickness of insulation layers between the first electrode located in the effective light emitting region and the closer touch electrode layer is greater than the total thickness of the insulation layer between the first electrode located at the outer side of the effective light emitting region and the closer touch electrode layer. For example, the insulation layers can include insulation layers in the encapsulation layer, such as a first inorganic layer, a first organic layer, a second inorganic layer, and a buffer layer between the encapsulation layer and the touch electrode layer (for example, the buffer layer is between the encapsulation layer and the first touch electrode layer in the case where the first touch electrode layer is located between the second touch electrode layer and the base substrate). Here, the total thickness can be the average total thickness of the insulation layers in the effective light emitting region, such as the thickness of the corresponding insulation layers in all of the first effective light emitting region, the second effective light emitting region and the third effective light emitting region.

For example, as shown in FIG. 4, the plurality of first touch electrodes 610 and the plurality of second touch electrodes 620 are connected to a lead end region 640 through the plurality of touch electrode lines 630, and detection of touch operations and detection of positions where touch operations occur can be realized by applying detection electrical signals to the plurality of touch electrode lines 630. For example, both sides of the first touch electrode 610 in the X direction are electrically connected with the touch electrode lines 630 to realize dual-side driving. Of course, the embodiment of the present disclosure is not limited thereto, and only one side of the first touch electrode may be electrically connected with the touch electrode line to realize single-side driving. The touch electrode line 630 can be arranged around the outer sides of the first touch electrode and the second touch electrode. For convenience of description, the space of the region where the touch electrode line is arranged is exaggerated in the accompanying drawings. The first touch electrode and the second touch electrode may be overlapped with the display region and not overlapped with the non-display region.

The plurality of first touch electrodes 610 and the plurality of second touch electrodes 620 can form capacitors at overlapping positions. When a finger touches, the coupling of the capacitor close to the touch point is affected, thus changing the capacitance of the capacitor close to the touch point. Therefore, the touch position can be judged by using this capacitance change. The embodiment of the present disclosure is not limited thereto, and for example, the touch layer may include a mutual-capacitive touch structure, and may also include a self-capacitive touch structure. In addition, the touch layer can also be made of materials such as nano silver wires.

Figure 8:
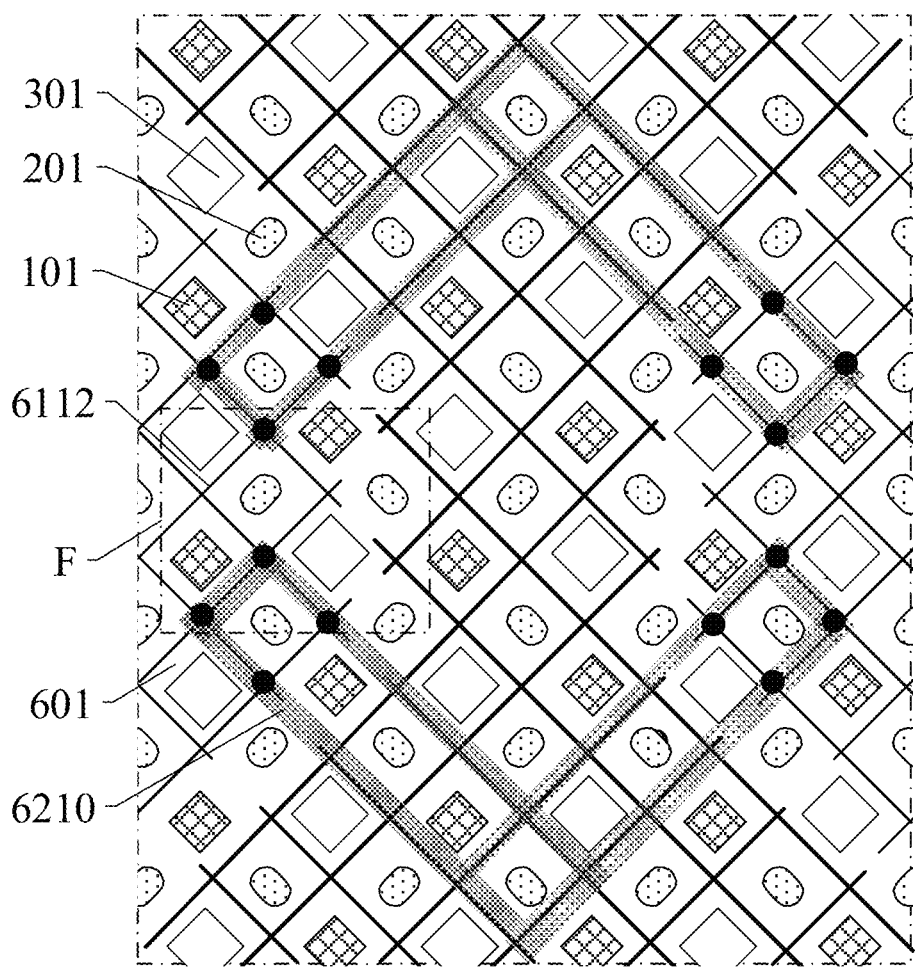
FIG. 8 is a schematic diagram of a positional relationship between a touch electrode and an effective light emitting region of each sub-pixel.
Figure 9:
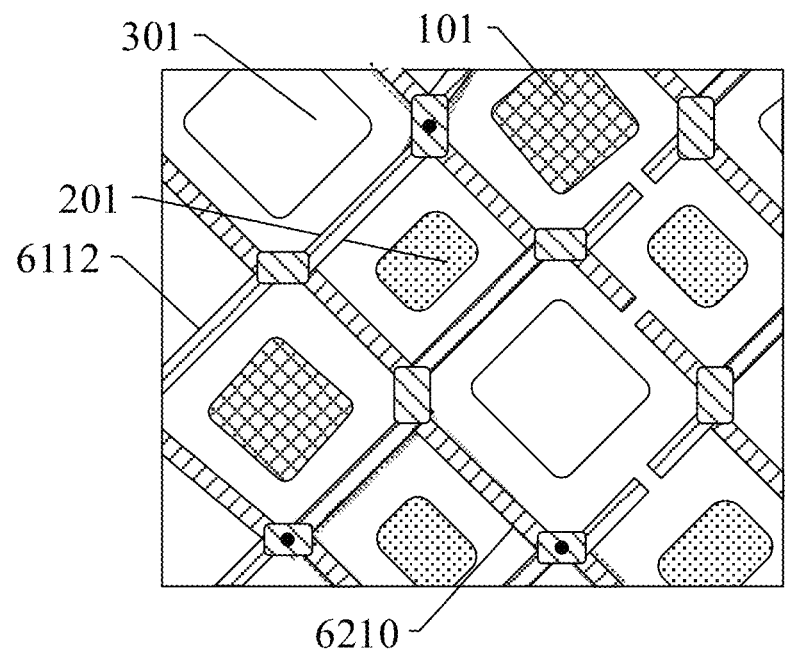
FIG. 9 is an enlarged view of region F in FIG. 8.

For example, FIG. 8 is a schematic diagram of a positional relationship between a touch electrode and an effective light emitting region of each sub-pixel, and FIG. 9 is an enlarged view of region F in FIG. 8. As shown in FIG. 8 and FIG. 9, in the display area, the effective light emitting region of each sub-pixel is located in each first mesh 601, that is, one first mesh 601 surrounds the effective light emitting region of one sub-pixel. For example, the shape of the first mesh 601 is approximately rectangular. The ratio of the opening area of the first mesh 601 corresponding to the first color sub-pixel to the area of the first effective light emitting region is less than the ratio of the opening area of the first mesh 601 corresponding to the second color sub-pixel to the area of the second effective light emitting region, and the ratio of the opening area of the first mesh 601 corresponding to the third color sub-pixel to the area of the third effective light emitting region is less than the ratio of the opening area of the first mesh 601 corresponding to the second color sub-pixel to the area of the second effective light emitting region. The first mesh corresponding to each sub-pixel refers to a mesh surrounding the effective light emitting region of the sub-pixel. In the embodiment of the present disclosure, the area of the effective light emitting region of the second color sub-pixel is the smallest, and has the greatest influence on the integral brightness uniformity of the display panel. By setting the ratio of the opening area of the first mesh corresponding to the second color sub-pixel to the area of the second effective light emitting region to the maximum, the limitation of the touch electrode line on the light emitting angle of the second color sub-pixel can be reduced. The above-mentioned "opening area of the first mesh" refers to the area of the hollow region surrounded by the touch electrode lines. For example, the shape of the hollow region can be approximately rectangular.

For example, the shape of the first mesh corresponding to the first color sub-pixel can be rectangular, and for example, it can be approximately square. The two sides of the rectangle can both have a length of 30-33 microns, the area thereof can be 900-1000 square microns, the area of the opening of the pixel defining layer corresponding to the first color sub-pixel can be 200-250 square microns, and the ratio of these two areas can be 4-5. For example, the shape of the first mesh corresponding to the second color sub-pixel can be rectangular, the two sides have lengths of 28-31 microns and 30-33 microns, respectively, the area thereof can be 850-1100 square microns, such as 900-1000 square microns, the area of the opening of the pixel defining layer corresponding to the second color sub-pixel can be 100-180 square microns, such as 100-150 square microns, and the ratio of these two areas can be 5-9, such as 7-8. For example, the shape of the first mesh corresponding to the third color sub-pixel can be rectangular, and for example, it can be approximately square. The lengths of the two sides are 30-38 microns, the area thereof can be 900-1300 square microns, such as 1100-1200 square microns, the area of the opening of the pixel defining layer corresponding to the third color sub-pixel can be 300-400 square microns, and the ratio of these two areas can be 3-4.

For example, in the connecting line direction from the center of the first effective light emitting region of the first color sub-pixel to the center of the second effective light emitting region of the second color sub-pixel adjacent to the first color sub-pixel, the size of a part of the pixel defining layer covered by each light emitting layer is in the range from 5 to 15 microns, for example, the size can be in the range from 7 to 13 microns.

For example, the distance between the edge of the touch electrode line and the edge of the opening of the pixel defining layer close to each other can be 3.5-13.5 microns, and for example, 3.5-11.5 microns. In the embodiment of the present disclosure, by designing the distance between the boundary of the touch electrode line and the edge of the opening of the pixel defining layer to be relatively large, it can be ensured that the touch electrode line is as far away from the opening of each pixel defining layer as possible, and the shielding of light emitted from each sub-pixel by the touch electrode line is reduced, thereby avoiding color deviation caused by unbalanced shielding of different color sub-pixels by the touch electrode lines.

For example, as shown in FIG. 4 to FIG. 8, the shape of each second mesh 602 is V-shaped, and both endpoints of the V-shape are configured to be electrically connected with the second touch electrode units 6120 through via holes 603 in the touch insulation layer 660. For example, adjacent second touch electrode units 6120 can be electrically connected through two connection bridges 621, and the V-shaped openings of the two connection bridges 621 are opposite to each other. The embodiment of the present disclosure is not limited thereto, and the adjacent second touch electrodes can also be electrically connected through one connection bridge or through more connection bridges.

For example, each second mesh 602 corresponds to two first effective light emitting regions 101, five second effective light emitting regions 201 and two third effective light emitting regions 301. For example, the second effective light emitting region 201 is located in the second mesh where the two endpoints closest to the V-shaped opening are located. For example, the number ratio of sub-pixels in the display panel is that the number ratio of the first color sub-pixel, the second color sub-pixel and the third color sub-pixel is 1:2:1, and the number ratio between the first color sub-pixel and the third color sub-pixel surrounded by the connection bridge 621 is less than the number ratio between the first color sub-pixel and the third color sub-pixel in the display region, which can reduce the restrictions on the light emitted from the first color sub-pixel and the third color sub-pixel, and improve the luminous efficiency of the first color sub-pixel and the luminous efficiency of the third color sub-pixel.

Figure 10:
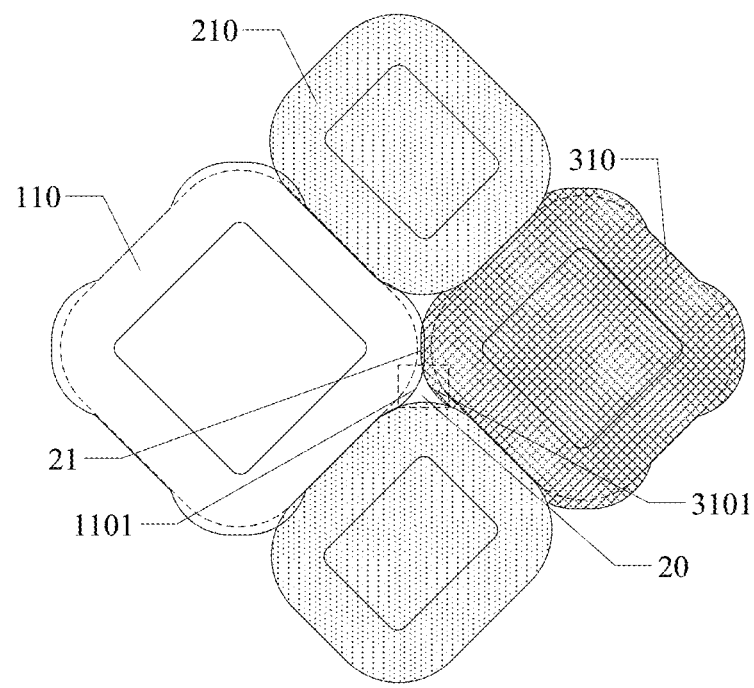
FIG. 10 is a partial planar structural view of a pixel structure provided by another embodiment of the present disclosure.
Figure 11:
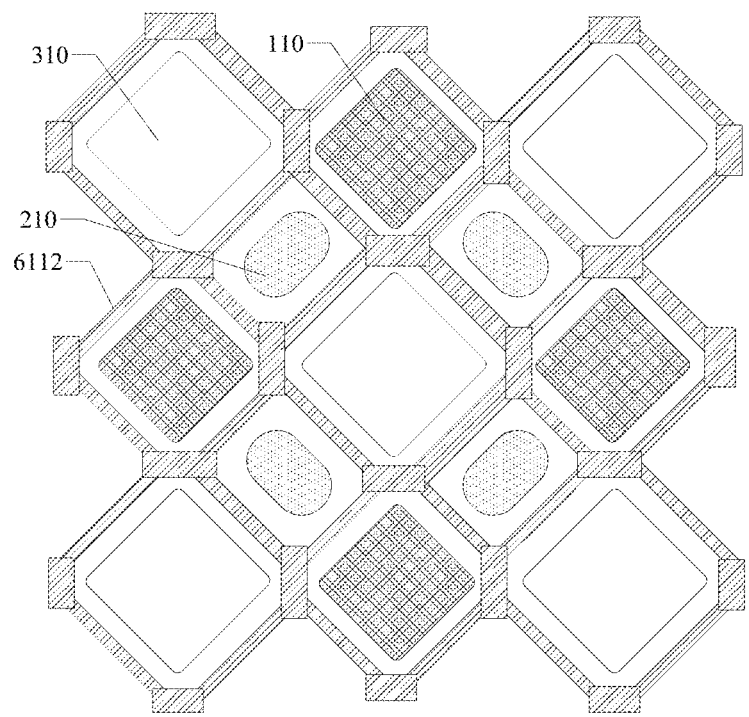
FIG. 11 is a schematic diagram of a positional relationship between a pixel structure and a touch electrode line shown in FIG. 10.

FIG. 10 is a partial planar structural view of a pixel structure provided by another embodiment of the present disclosure, and FIG. 11 is a schematic diagram of a positional relationship between a pixel structure and a touch electrode line shown in FIG. 10. As shown in FIG. 10 and FIG. 11, gaps 20 are provided between the first color light emitting layer 110, the second color light emitting layer 210 and the third color light emitting layer 310 which are adjacent to one another, the first color light emitting layer 110 has a shape including a first rounded rectangle and a first protruding portion 1101 located at the rounded corner of the first rounded rectangle and protruding toward the gap 20. The second color light emitting layer 210 has a shape including a second rounded rectangle, and the first protruding portion 1101 at least partially protrudes from an extension line of a straight edge of the first rounded rectangle close to the second color light emitting layer 210, and for example, the straight edge is parallel to an edge of a corresponding effective light emitting region closet to the straight edge. The third color light emitting layer 310 has a shape including a third rounded rectangle and a second protruding portion 3101 located at the rounded corner of the third rounded rectangle and protruding toward the gap 20, and the second protruding portion 3101 at least partially protrudes from the extension line of a straight edge of the third rounded rectangle close to the second color light emitting layer 210, and for example, the straight edge is parallel to an edge of a corresponding effective light emitting region closet to the straight edge. In the pixel structure provided by the embodiment of the present disclosure, the shape of the first color light emitting layer includes a first protruding portion located at the rounded corner of the first rounded rectangle and protruding toward the gap. Compared with the first color light emitting layer without a first protruding portion, the first protruding portion of the first color light emitting layer in the embodiment of the present disclosure occupies a part of the area of the gap, that is, reduces the area of the gap; therefore, on the one hand, the utilization ratio of the gap can be increased, and on the other hand, the distance between the rounded edge of the first color light emitting layer and the rounded edge of a corresponding second electrode (i.e., anode) can be increased, thereby reducing or even avoiding the risks of defects such as color mixing, color deviation, etc., and improving the yield. For example, the gap can be a region surrounded by one first color light emitting layer, one second color light emitting layer and one third color light emitting layer which are adjacent to each other and distributed in a triangle shape, and there exists no light emitting layer in the region. The one first color light emitting layer, the one second color light emitting layer and the one third color light emitting layer which are adjacent to each other and distributed in a triangle shape, for example, are one first color light emitting layer and one third color light emitting layer which are adjacent to each other in the same row, and one second color light emitting layer which is in an adjacent row and adjacent to both of the first color light emitting layer and the third color light emitting layer.

For example, the orthographic projections of the first protruding portion and the second protruding portion on the base substrate are at least partially overlapped with the orthographic projection of the touch electrode line on the base substrate.

For example, the overlapping part of the edges of the light emitting layers of two adjacent sub-pixels with different colors on the pixel defining layer 400 is an overlapping portion 21, and the orthographic projection of the touch electrode line 6112 on the base substrate is overlapped with at least part of the orthographic projection of the overlapping portion 21 on the base substrate.

Figure 1E:
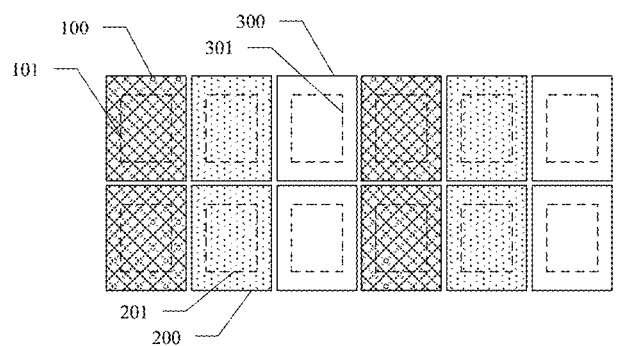
Figure 1F:
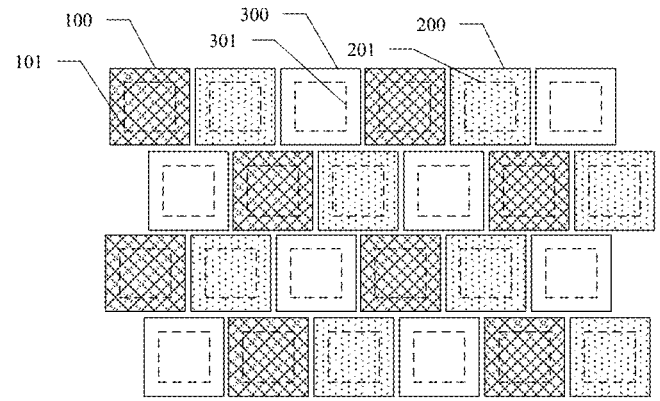
Figure 1G:
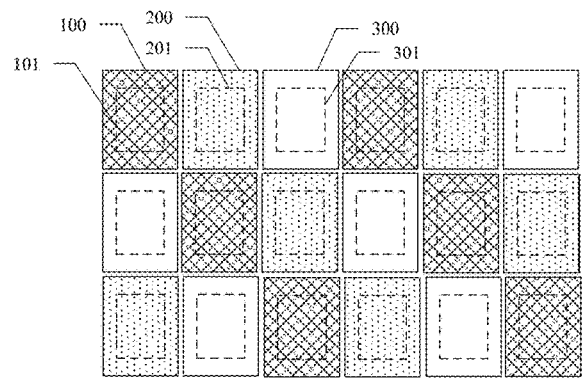
Figure 1H:
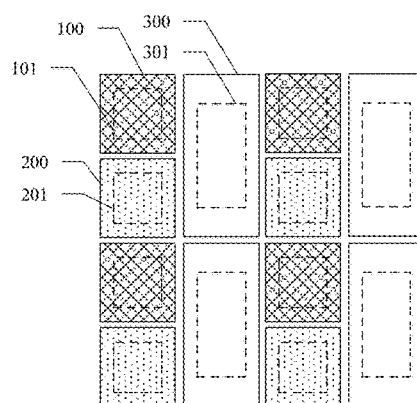

In some embodiments, the pixel arrangement structure shown in FIG. 10 may not be adopted, and for example, a pixel arrangement, such as the stripe arrangement shown in FIG. 1E, one triangle arrangement shown in FIG. 1H, another triangle arrangement shown in FIG. 1F, or the mosaic arrangement shown in FIG. 1G may be adopted. For example, as shown in FIG. 1H, by setting the size of the blue sub-pixel 300 to be greater than the size of the red sub-pixel 100 and the size of the green sub-pixel 200, the service life of the display panel can also be extended.

For example, as shown in FIG. 10 and FIG. 11, in the display region, the orthographic projection of more than 50% of the touch electrode line 6112 on the base substrate is located within the orthographic projection of the overlapping portion 21 on the base substrate. For example, in the display region, the orthographic projection of more than 50% of the touch electrode line on the base substrate is located within the orthographic projection of a light emitting layer overlapping portion on the base substrate, and the light emitting layer overlapping portion includes an overlapping part of at least two selected from the group consisting of the first color light emitting layer, the second color light emitting layer and the third color light emitting layer. For example, in the display region, the orthographic projection of more than 70% of the touch electrode line on the base substrate is located within the orthographic projection of the light emitting layer overlapping portion on the base substrate. For example, in the display region, the orthographic projection of more than 80% of the touch electrode line on the base substrate is located within the orthographic projection of the light emitting layer overlapping portion on the base substrate. The overlapping portion of light emitting layers with different colors, due to crosstalk, may easily produce some undesirable colors and lead to display defect and in order to reduce the influence of crosstalk, touch electrode lines can be used for partial shielding to improve the display effect.

In the process of evaporating a light emitting layer by using an FMM, the distance between the opening of the FMM and the edge of the second electrode of each sub-pixel is a key parameter to ensure the evaporation yield. However, for a general FMM, due to the influence of the manufacturing process, the actual distance between the rounded edge of the opening of the FMM and the edge of the anode may not reach the theoretical design value, so that the openings of different FMMs are different in an FMM set. That is, the gap between adjacent light emitting layers with different colors are relatively large, and may not be fully utilized, which increases the risks of defects such as color mixing and color deviation, etc. Therefore, by designing a novel FMM and utilizing the above gap, the distance between the rounded edge of the opening of the FMM and the rounded edge of the second electrode of each sub-pixel is manufactured to be relatively large, that is, the rounded edge of the FMM opening is compensated (increased in size), thereby reducing or even avoiding the above-mentioned risks of defects such as color mixing, color deviation, etc., and improving the yield. It should be noted that the distance between the opening of the FMM and the edge of the second electrode mentioned above refers to the distance between the edge of the orthographic projection of the opening of the FMM on the base substrate including the second electrode and the edge of the second electrode, not a distance in three dimensions.

In the fine metal mask process, for the position of the corner of the light emitting layer, such as the closest position of the light emitting layers the first color sub-pixel and the third color sub-pixel, the material of the film layer is easy to be missing or the quality of the film layer is defective. Therefore, for the opposite portions of the first color sub-pixel and the third color sub-pixel, the shape of the pattern of the light emitting layer can be adjusted; for example, the position of the corner of the opening of the fine metal mask is smoothed, and the opening of the fine metal mask protrudes outward toward both sides of the corner, so that the quality of the film layer at the position corresponding to each corner, and the process margin at the position of the corner can be improved.

In some embodiments, the light emitting layer having a protruding portion can have any other shape, such as a triangle, a quadrangle, a pentagon, a hexagon or an octagon. In some embodiments, the adjacent light emitting layers may not be distributed in a corner-to-corner manner; for example, the portions of the adjacent light emitting layers closest to each other may also be distributed in a corner-to-edge manner or in an edge-to-edge manner, or completely shifted (that is, the orthographic projections of the opposite and closest portions of the adjacent two light emitting layers on a straight line in the gap between the two light emitting layers, are basically not overlapped).

For example, taking a center line of a part of the pixel defining layer between the first color sub-pixel and the second color sub-pixel as a benchmark, at least part of the first color light emitting layer stretches across the center line, and at least part of the center line is located in the overlapping region of the light emitting layers of the first color sub-pixel and the second color sub-pixel. Similarly, taking a center line of a part of the pixel defining layer between the second color sub-pixel and the third color sub-pixel as a benchmark, at least part of the second color light emitting layer stretches across the center line, and at least part of the center line is located in the overlapping region of the light emitting layers of the second color sub-pixel and the third color sub-pixel.

For example, by adjusting the shapes of at least part of the light emitting layers, the boundary of each light emitting layer can be overlapped with the boundary of an adjacent light emitting layer. For example, for the edge region where the composition or thickness changes, a molecular probe can be used to measure the molecular amount and thickness of materials. For example, for the overlapping part of light emitting layers of the first color sub-pixel and the second color sub-pixel, the film layer material of the overlapping part close to the center of the light emitting layer of the first color sub-pixel is mainly the material of the light emitting layer of the first color sub-pixel and supplemented by the material of the second color light emitting layer, and the thickness of the first color light emitting layer is greater than the thickness of the second color light emitting layer. At least part of a concave-convex shape appeared at the position of the boundary of the light emitting layer of each sub-pixel (i.e., the planar shape of the boundary position of the light emitting layer is a concave-convex shape) is covered by the touch electrode line, and the uniformity of the film layer of the light emitting layer pattern close to the center of the PDL gap of the pixel defining layer is poor. Because the transverse leakage current may result in undesirable light or crosstalk between adjacent light emitting layers, the display quality of the display panel can be improved by using the touch electrode line to shield the overlapping part of the boundaries of the light emitting layers.

For example, the line width of the touch electrode line can be 3 microns, and if the boundaries of two adjacent light emitting layers are connected, the width of the shadow region can be 2a, that is, 6-8 microns. For example, in the direction of the connecting line connecting the centers of the openings of two adjacent pixel defining layer, the width of the overlapping part of the boundaries of adjacent light emitting layers can be less than 6-8 microns. For example, the orthographic projection of the touch electrode line arranged at least in the intermediate position between the first color sub-pixel and the second color sub-pixel on the base substrate completely falls into the orthographic projection of the overlapping part of the boundaries of the light emitting layers on the base substrate. For example, for the positions of the opposite corners between the first color light emitting layer of the first color sub-pixel and the third color light emitting layer of the third color sub-pixel, there may be no overlapping of light emitting layers, so part of the touch electrode line may not be overlapped with the overlapping region of the light emitting layers. Therefore, the orthographic projection of at least 50% of the touch electrode line in the display region on the base substrate is located within the orthographic projection of the overlapping region of the light emitting layers on the base substrate. For example, the orthographic projection of at least 80% of the touch electrode line in the display region on the base substrate is located within the orthographic projection of the overlapping region of the light emitting layers on the base substrate, thereby reducing cross-color caused by the overlapping of the light emitting layers.

For example, each sub-pixel includes an organic light emitting element and a pixel circuit connected with the organic light emitting element, and each pixel circuit is located between the organic light emitting element and the base substrate.

Figure 12A:
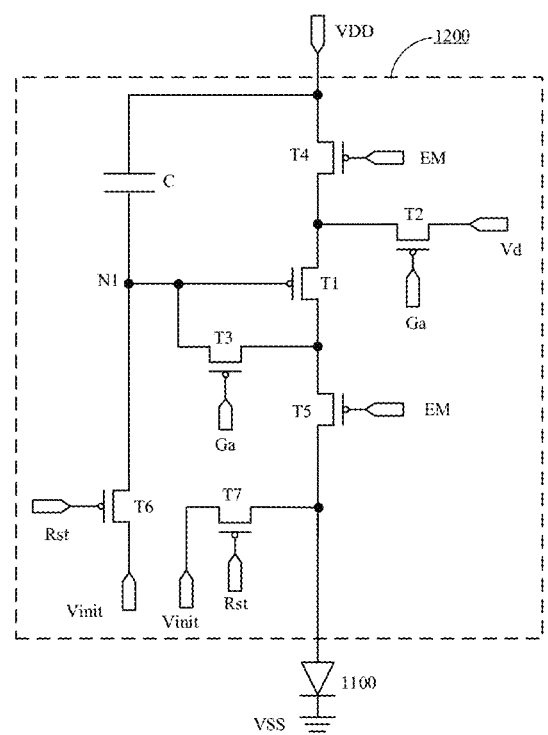
FIG. 12A is a schematic diagram of a pixel circuit included in each sub-pixel.
Figure 12B:
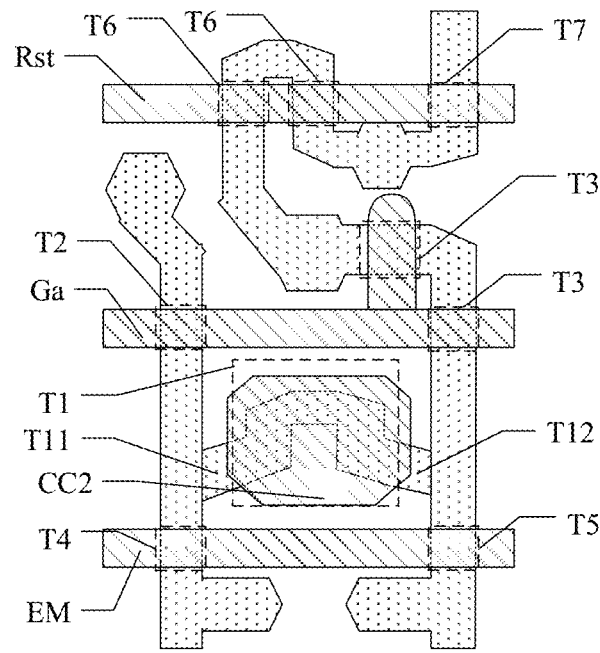
FIG. 12B is a schematic diagram of a positional relationship of each transistor illustrated in the active layer and the gate line layer of each sub-pixel.

For example, FIG. 12A is a schematic diagram of a pixel circuit included in each sub-pixel, and FIG. 12B is a schematic diagram of a positional relationship of each transistor of each sub-pixel in the active layer and the gate line layer. As shown in FIG. 12A and FIG. 12B, taking the first color sub-pixel as an example, for example, the first color sub-pixel 100 includes an organic light emitting element 1100 and a pixel circuit 1200. The pixel circuit 1200 of the first color sub-pixel can include a driving transistor T1, a first light emitting control transistor T4, a second light emitting control transistor T5, a data writing transistor T2, a storage capacitor C, a threshold compensation transistor T3, a first reset transistor T6 and a second reset transistor T7. The driving transistor T1 includes a gate electrode, a first electrode and a second electrode, and is configured to provide the organic light emitting element 1100 with a driving current which is used for driving the organic light emitting element 1100 to emit light. The display panel further includes a data line Vd (shown in FIG. 13A) arranged in the same layer as a power signal transmission line VDD (shown in FIG. 13A), and the data line extends in the same direction as the power signal transmission line; the display panel further includes a gate line Ga, a light emitting control signal line EM and a reset control signal line Rst which are located at one side of the power signal transmission line facing the base substrate and parallel to each other, and the extending direction of the gate line is intersected with the extending direction of the data line, and for example, the extending direction of the gate line is perpendicular to the extending direction of the data line; the display panel further includes a reset power signal line (not shown) extending along the first direction, which is located between the film layer where the gate line is located and the film layer where the data line is located.

For example, as shown in FIG. 12A, FIG. 12B and FIG. 13A, the first electrode of the data writing transistor T2 is electrically connected with the first electrode of the driving transistor T1, the second electrode of the data writing transistor T2 is configured to be electrically connected with the data line Vd to receive a data signal, and the gate electrode of the data writing transistor T2 is configured to be electrically connected with the gate line Ga to receive a scan signal; the first electrode CC1 of the storage capacitor C is electrically connected with the first voltage terminal VDD, and the second electrode CC2 of the storage capacitor C is electrically connected with the gate electrode of the driving transistor T1; the first electrode of the threshold compensation transistor T3 is electrically connected with the second electrode of the driving transistor T1, the second electrode of the threshold compensation transistor T3 is electrically connected with the gate electrode of the driving transistor T1, and the gate electrode of the threshold compensation transistor T3 is configured to be electrically connected with the gate line Ga to receive a compensation control signal; the first electrode of the first reset transistor T6 is configured to be electrically connected with the reset power signal line Vinit to receive a reset signal, the second electrode of the first reset transistor T6 is electrically connected with the gate electrode of the driving transistor T1, and the gate electrode of the first reset transistor T6 is configured to be electrically connected with the reset control signal line Rst to receive a reset control signal; the first electrode of the second reset transistor T7 is configured to be electrically connected with the reset power signal line Vinit to receive a reset signal, the second electrode of the second reset transistor T7 is electrically connected with the second electrode of the organic light emitting element 1100, and the gate electrode of the second reset transistor T7 is configured to be electrically connected with the reset control signal line Rst to receive a reset control signal; the first electrode of the first light emitting control transistor T4 is electrically connected with the first voltage terminal VDD, the second electrode of the first light emitting control transistor T4 is electrically connected with the first electrode of the driving transistor T1, and the gate electrode of the first light emitting control transistor T4 is configured to be electrically connected with the light emitting control signal line EM to receive a light emitting control signal; the first electrode of the second light emitting control transistor T5 is electrically connected with the second electrode of the driving transistor T1, the second electrode of the second light emitting control transistor T5 is electrically connected with the second electrode of the organic light emitting element 1100, and the gate electrode of the second light emitting control transistor T5 is configured to be electrically connected with the light emitting control signal line EM to receive a light emitting control signal; the first electrode of the organic light emitting element 1100 is electrically connected with the second voltage terminal VSS.

For example, one of the first voltage terminal VDD and the second voltage terminal VSS is a high voltage terminal and the other of the first voltage terminal VDD and the second voltage terminal VSS is a low voltage terminal. For example, in the embodiment shown in FIG. 12A, the first voltage terminal VDD is a voltage source to output a constant first voltage, which is a positive voltage; and the second voltage terminal VSS can be a voltage source to output a constant second voltage, which is a negative voltage.

For example, according to the characteristics of transistors, transistors can be divided into N-type transistors and P-type transistors. The embodiment of the present disclosure takes that the transistors are P-type transistors (e.g., P-type MOS transistors) as an example, that is, in the description of the present disclosure, the driving transistor T1, the data writing transistor T2, the threshold compensation transistor T3, the first light emitting control transistor T4, the second light emitting control transistor T5, the first reset transistor T6 and the second reset transistor T7, etc., can all be P-type transistors. However, the transistors in the embodiment of the present disclosure are not limited to P-type transistors, and those skilled in the art can also realize the functions of one or more transistors in the embodiment of the present disclosure by using N-type transistors (e.g., N-type MOS transistors) according to actual needs. The transistors used in the embodiment of the present disclosure can be thin film transistors or field effect transistors or other switching elements having the same characteristics, and thin film transistors can include oxide semiconductor thin film transistors, amorphous silicon thin film transistors or polysilicon thin film transistors, etc. The source electrode and the drain electrode of the transistor can be symmetrical in structure, so the source electrode and the drain electrode can be indistinguishable in physical structure. In the embodiment of the present disclosure, in order to distinguish electrodes of a transistor, as for the electrodes other than the gate electrode which serves as a control electrode, it is directly described that one of them is the first electrode and the other is the second electrode, so the first electrode and the second electrode of all or part of the transistors in the embodiment of the present disclosure can be interchanged as needed.

Figure 15A:
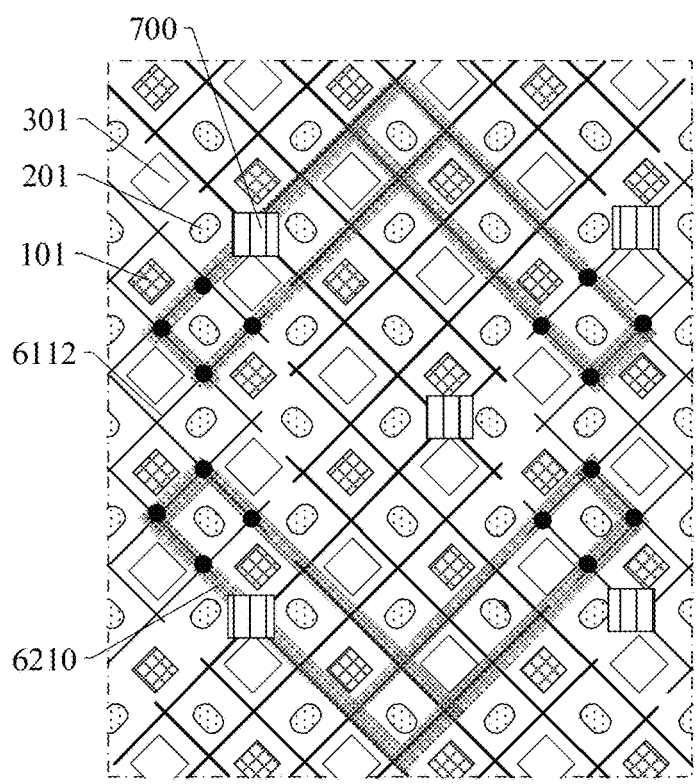
FIGS. 15A-15G are schematic diagrams of various positional relationships between spacers and sub-pixels provided by the embodiments of the present disclosure.
Figure 15B:
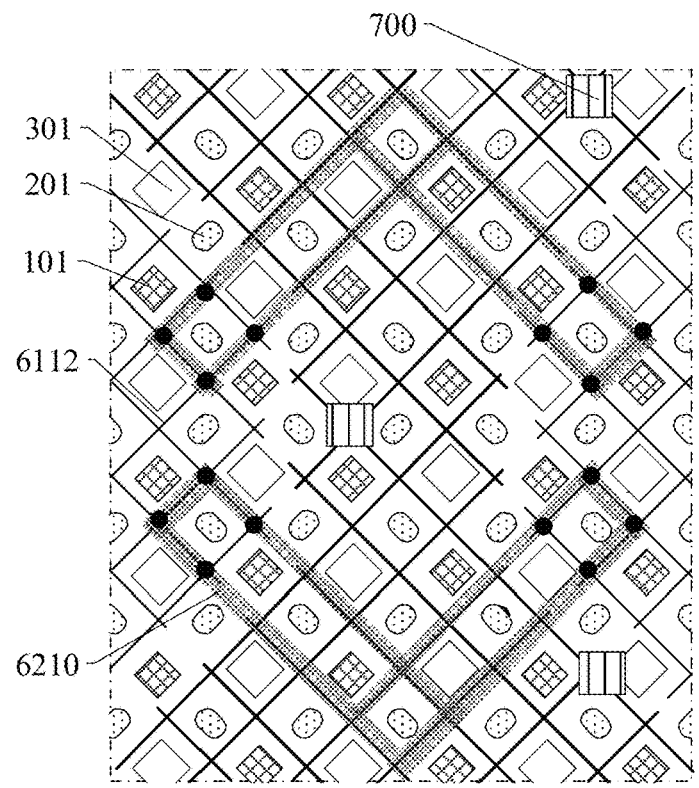

It should be noted that, in the embodiment of the present disclosure, the pixel circuit can have a 7T1C structure (i.e., seven transistors and one capacitor) as shown in FIG. 15B, and can also have a structure including other numbers of transistors and capacitors, such as 7T2C structure, 6T1C structure, 6T2C structure or 9T2C structure, without being limited in the embodiment of the present disclosure. In the embodiment of the present disclosure, the pixels can adopt any arrangement manner, such as stripe arrangement, triangle arrangement, mosaic arrangement, etc. In the embodiment of the present disclosure, the number ration of RGB (that is red color sub-pixels, green color sub-pixels and blue color sub-pixels) in one pixel unit or repeating unit can be any one or a combination of two or more selected from the group consisting of 1:1:2, 1:2:1, 2:2:1, 1:1:1, 1:2:3, 3:3:2, 1:3:2, 2:3:1, 3:2:3, 2:3:3, etc. For example, RGB may be equal in size, or may not be equal in size. For example, as to the size of the opening in the pixel defining layer for defining a single sub-pixel, it can be that the size of the opening in B is greater than the size of the opening in R and the size of the opening in B is greater than the size of the opening in G. For example, as to the size of the opening in the pixel defining layer for defining a single sub-pixel, it can be that the size of the opening in B is greater than the size of the opening in R and the size of the opening in R is greater than the size of the opening in G. For example, as to the size of the opening in the pixel defining layer for defining a single sub-pixel, it can be that the size of the opening in B is greater than the size of the opening in R and the size of the opening in R is equal to the size of the opening in G. For example, as to the size of the opening in the pixel defining layer for defining a single sub-pixel, it can be that the size of the opening in B is equal to the size of the opening in the size of the opening in R and R is greater than the size of the opening in G. For example, as to the size of the opening in the pixel defining layer for defining a single sub-pixel, it can be that the size of the opening in R is greater than the size of the opening in G. For example, as to the size of the opening in the pixel defining layer for defining a single sub-pixel, it can be that the size of the opening in G is greater than the size of the opening in R. For example, as to the size of the opening in the pixel defining layer for defining a single sub-pixel, it can be that the size of the opening in G is greater than the size of the opening in B. For example, the number of sub-pixels included in each repeating unit or pixel unit can be any one or a combination of two or more selected from the group consisting of 2, 3, 4, 5, 6, 7, 8, 9, 10, etc.

In some embodiments, some sub-pixels with the same color may have effective light emitting regions of different areas. For example, in some embodiments, sub-pixels included in one repeating unit or pixel unit includes two green sub-pixels with the same color, two red sub-pixels with the same color, two blue sub-pixels with the same color, or two pairs of sub-pixels in which each pair of sub-pixels are of the same color (e.g., two green sub-pixels and two red sub-pixels), and the areas of the effective light emitting regions of the sub-pixels with the same color can be different. In some embodiments, in the case where sub-pixels with the same color are located at an edge position, at a special-shaped region or at a foldable region, etc., and the effective light emitting regions thereof can have different areas or shapes from the effective light emitting regions of sub-pixels with the same color in other regions.

In the above embodiments, the luminous color, size, shape and position distribution of each sub-pixel can be freely combined. For example, the size and shape of the sub-pixels can be partly the same and partly different; or totally the same; or completely different. For example, some sub-pixels have the same size but different shapes. For example, some sub-pixels have substantially the same shape outline, but different areas. For example, there may be different numbers of second color sub-pixels around different first color sub-pixels, and the number may be 2, 3, 4, 5, 6, 7, 8, etc. These second color sub-pixels may have approximately the same distance from the first color sub-pixel, or some of these second color sub-pixels have the same distance from the first color sub-pixel and some of these second color sub-pixels have different distances from the first color sub-pixel. For example, there may be different numbers of third color sub-pixels around different second color sub-pixels, and the number may be 2, 3, 4, 5, 6, 7, 8, etc. These third color sub-pixels may have approximately the same distance from the second color sub-pixel, or some of these third color sub-pixels have the same distance from the second color sub-pixel and some of these third color sub-pixels have different distances from the second color sub-pixel. For example, there may be different numbers of second color sub-pixels around different third color sub-pixels, and the number may be 2, 3, 4, 5, 6, 7, 8, etc. These second color sub-pixels may have approximately the same distance from the third color sub-pixel, or some of these second color sub-pixels have the same distance from the third color sub-pixel and some of these second color sub-pixels have different distances from the third color sub-pixel.

FIG. 13A is a schematic diagram of a positional relationship between a pixel circuit and a touch electrode line provided by an example of the embodiment of the present disclosure. As shown in FIG. 13A, at least one selected from the group consisting of the second electrode 120 of the first color sub-pixel 100, the second electrode 220 of the second color sub-pixel 200 and the second electrode 320 of the third color sub-pixel 300, is overlapped with the touch electrode line 6112.

For example, as shown in FIG. 13A, the second electrode 220 in the second color sub-pixel 200 includes a main body electrode 221, a connection electrode 222, and an auxiliary electrode 223. For example, the main body electrode, the connection electrode and the auxiliary electrode of the second color sub-pixel 200 are an integrated electrode.

For example, in the second electrode 220 of the second color sub-pixel 200, the main body electrode 221 is overlapped with the second effective light emitting region 201, and the shape of the main body electrode 221 is approximately the same as the shape of the second effective light emitting region 201; and the connection electrode 222 and the auxiliary electrode 223 are not overlapped with the second effective light emitting region 201. For example, the connection electrode 222 is configured to be electrically connected with the second electrode of the second light emitting control transistor T5. For example, the auxiliary electrode 223 is overlapped with the driving transistor T1, and the touch electrode line 6112 is not overlapped with the second electrode 220 of the second color sub-pixel 200.

For example, as shown in FIG. 13A, the second electrode 120 of the first color sub-pixel 100 includes a main body electrode 121 and a connection electrode 122, the main body electrode 121 is overlapped with the first effective light emitting region 101, and the shape of the main body electrode 121 is approximately the same as the shape of the first effective light emitting region 101; and the connection electrode 122 is not overlapped with the first effective light emitting region. For example, the connection electrode 122 is configured to be electrically connected with the second electrode of the second light emitting control transistor T5. For example, the second electrode 120 of the first color sub-pixel 100 is overlapped with the touch electrode line 6112, and for example, the connection electrode 122 of the first color sub-pixel 100 is overlapped with the touch electrode line 6112.

For example, as shown in FIG. 13A, the second electrode 320 of the third color sub-pixel 300 includes a main body electrode 321 and a connection electrode 322, the main body electrode 321 is overlapped with the third effective light emitting region, and the shape of the main body electrode 321 is approximately the same as the shape of the third effective light emitting region; and the connection electrode 322 is not overlapped with the third effective light emitting region. For example, the connection electrode 322 is configured to be electrically connected with the second electrode of the second light emitting control transistor T5. For example, the second electrode 320 of the third color sub-pixel 300 is overlapped with the touch electrode line 6112, and for example, the connection electrode 322 of the third color sub-pixel 300 is overlapped with the touch electrode line 6112.

For example, at least one selected from the group consisting of the second electrode of the first color sub-pixel, the second electrode of the second color sub-pixel and the second electrode of the third color sub-pixel, is overlapped with the touch electrode line; and/or the driving transistor of at least one selected from the group consisting of the first color sub-pixel, the second color sub-pixel and the third color sub-pixel, is overlapped with the touch electrode line. The second electrode not only functions as an electrode for driving the light emitting element to emit light, but also can be used, for example, to shield part of the structure of some transistors, which can better play a complementary shielding role by being overlapped with the touch electrode line.

For example, as shown in FIG. 13A, the driving transistor T1 of the second color sub-pixel 200 is overlapped with the touch electrode line 6112, while the driving transistors of the first color sub-pixel 100 and the third color sub-pixel 300 are not overlapped with the touch electrode line 6112. The above case in which the driving transistor is overlapped with the touch electrode line, includes that the gate electrode of the driving transistor (e.g., the second electrode CC2 of the storage capacitor shown in FIG. 12B) is overlapped with the touch electrode line. Of course, the embodiment of the present disclosure is not limited thereto. The driving transistor T1 further includes a source electrode region T11 and a drain electrode region T12, which are conducted by doping, etc., so as to be electrically connected with each structure. The case in which the driving transistor T1 is overlapped with the touch electrode line can also include that the source electrode region T11 and the drain electrode region T12 of the driving transistor are overlapped with the touch electrode line. The driving transistor plays an important role in the output current of the pixel circuit, and the size of the driving transistor (e.g., the size of the gate electrode, or the size of the source and drain electrodes and the size of the semiconductor region between the source and drain electrodes) is generally greater than the size of other transistors. And the driving transistor is easily affected by illumination and other factors, therefore, by using the touch electrode line to partially shield the driving transistor, the driving transistor can be better stabilized, so that the output current is less interfered.

For example, as shown in FIG. 13A, the second electrode 220 of the second color sub-pixel 200 is substantially not overlapped with the touch electrode line 6112. For example, the second electrode of the first color sub-pixel 100 and the second electrode of the third color sub-pixel 300 are not overlapped with the touch electrode line 6112.

For example, the part of the driving transistor T1 of the second color sub-pixel 200 that is not covered by the auxiliary electrode 223 is overlapped with the touch electrode line 6112, and the driving transistors T1 of the first color sub-pixel 100 and the third color sub-pixel 300 are substantially not overlapped with the touch electrode line 6112.

The pixel circuits of the plurality of sub-pixels are approximately rectangular regions and arranged periodically. The second electrodes of the first color sub-pixel and the third color sub-pixel can substantially cover the positions of the driving transistors of corresponding pixel circuits, while the second electrode of the second color sub-pixel and a corresponding driving transistor are not overlapped or have a small overlapping area. For example, the main body electrodes of the second electrodes of the first color sub-pixel and the third color sub-pixel can cover the driving transistors of corresponding pixel circuits, while the main body electrode of the second electrode of the second color sub-pixel is not overlapped with the driving transistor of a corresponding pixel circuit. Therefore, the second electrode of the second color sub-pixel extends a portion (i.e. auxiliary electrode) towards the direction close to the driving transistor to shield the driving transistor. At the same time, the touch electrode line helps to shield the part of the driving transistor which is not covered by the auxiliary electrode, so as to further stabilize the driving transistor of the second color sub-pixel.

For example, as shown in FIG. 13A, the data writing transistor T2 or the threshold compensation transistor T3 of the second color sub-pixel 200 is overlapped with the touch electrode line 6112. For example, as shown in FIG. 13A, the threshold compensation transistor T3 of the second color sub-pixel 200 is overlapped with the touch electrode line 6112. For example, the touch electrode line can be overlapped with the data writing transistor. For example, the data writing transistors T2 and the threshold compensation transistors T3 of the first color sub-pixel 100 and the third color sub-pixel 300 are not overlapped with the touch electrode line 6112.

For example, the data writing transistor T2 or the threshold compensation transistor T3 (channel, gate electrode, drain electrode) of the second color sub-pixel is shielded by the touch electrode line, thus stabilizing the transistor. Because the threshold compensation transistor T3 is directly connected with the gate electrode and the drain electrode of the driving transistor, it has a direct influence on the working state of the driving transistor, so it can generally be a double-gate transistor; the active layer between the two gate electrodes is easily affected by illumination or other external factors, so it needs to be shielded. Accordingly, the threshold compensation transistors T3 of the first color sub-pixel and the third color sub-pixel have been shielded by respective second electrodes. For example, the threshold compensation transistors T3 of the first color sub-pixel and the third color sub-pixel are shielded by respective main body electrodes, while the threshold compensation transistors T3 of the second color sub-pixel is not overlapped with the main body electrode of the second color sub-pixel.

For example, in a sub-pixel with a small overlapping area between the second electrode of the organic light emitting element and the first electrode of the storage capacitor (e.g., in a second color sub-pixel), the overlapping area between the touch electrode line 6112 and the first electrode of the storage capacitor is large.

For example, in a charging phase, T1 and T3 continuously charge node N1, and the potential of the node N1 directly affects the working state of T1, while the film layer where the data line of the node N1 is located and the film layer where the first electrode of the storage capacitor is located have partial overlapping load; in a light emitting phase, in the case where the VDD signal is introduced in the film layer where the first electrode of the storage capacitor is located, if the node N1 is under-charged, due to the overlapping load, the node N1 is interfered by the VDD signal, which will produce a potential change, and then the working state of T1 is affected, and the working state of T1 will affect the light emitted from the OLED element. Therefore, during charging, it is necessary to ensure that the charging potential of the node N1 is sufficient; the charging voltage of the node N1 is related to the states of T1 and T3, and because thin film transistors are particularly sensitive to light, the related characteristics of thin film transistors will shift due to the influence of light, so it is necessary to protect and shield T1 or T3 during charging, so as to ensure the charging voltage of node N1, to maintain the stable working state of T1 and to avoid affecting the normal operation of the OLED element.

Figure 13B:
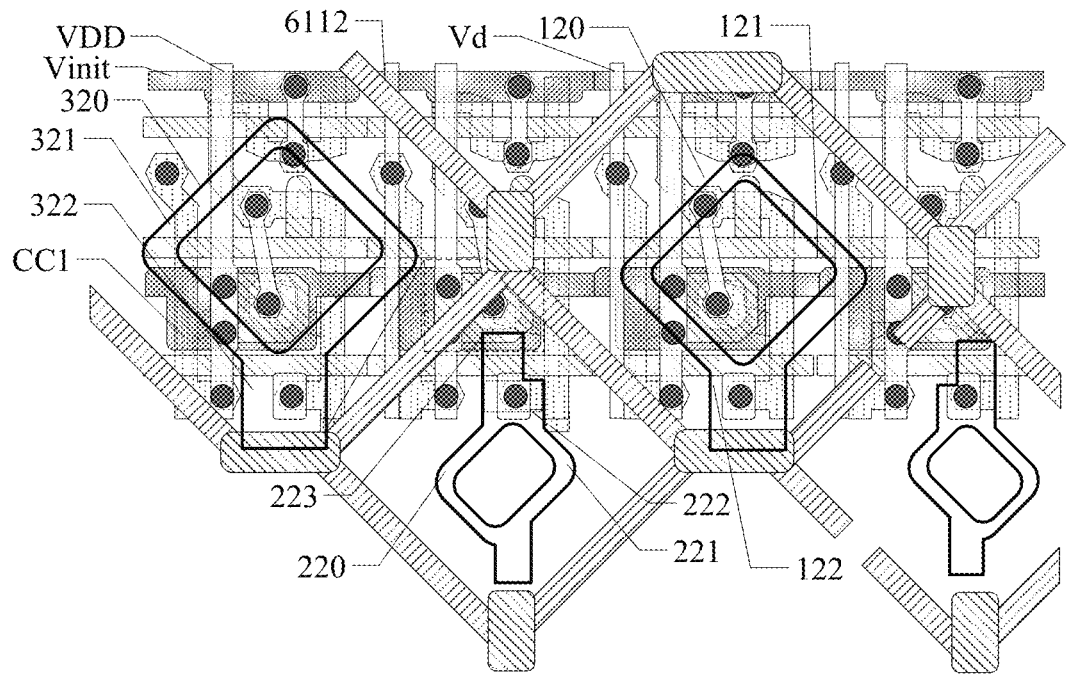

FIG. 13B is a schematic diagram of a positional relationship between a pixel circuit and a touch electrode line provided by another example of the embodiment of the present disclosure. For example, as shown in FIG. 13B, the driving transistor in the second color sub-pixel 200 is overlapped with the touch electrode line 6112, and the second electrode 220 of the organic light emitting element of the second color sub-pixel 200 is substantially not overlapped with the touch electrode line 6112; in the first color sub-pixel 100, the driving transistor is overlapped with the second electrode 120 of the organic light emitting element, but substantially not overlapped with the touch electrode line 6112, and the second electrode 120 of the organic light emitting element is overlapped with the touch electrode line 6112; in the third color sub-pixel 300, the driving transistor is overlapped with the second electrode 320 of the organic light emitting element, but substantially not overlapped with the touch electrode line 6112, and the second electrode 320 of the organic light emitting element is overlapped with the touch electrode line. The second electrode of the organic light emitting element of the second color sub-pixel includes a main body electrode 221, a connection electrode 222 and an auxiliary electrode 223; in the second color sub-pixel 200, the connection electrode 222 and the auxiliary electrode 223 are substantially not overlapped with the second effective light emitting region 201, the main body electrode 221 is substantially not overlapped with the driving transistor, and the auxiliary electrode 223 is overlapped with the driving transistor.

For example, as shown in FIG. 13B, the second electrode 220 of the organic light emitting element of the second color sub-pixel 200 is overlapped with the second effective light emitting region 201. For example, the connection electrode 222 of the second electrode 220 of the organic light emitting element is configured to be electrically connected with the second electrode of the second light emitting control transistor T5 through a via hole 388 in the insulating layer.

For example, as shown in FIG. 13B, in the first color sub-pixel, at least one of the threshold compensation transistor and the data writing transistor is overlapped with the second electrode of the organic light emitting element and is not overlapped with the touch electrode line; in the third color sub-pixel, at least one of the threshold compensation transistor and the data writing transistor is overlapped with the second electrode of the organic light emitting element; in the second color sub-pixel, both the threshold compensation transistor and the data writing transistor are not overlapped with the second electrode of the organic light emitting element, and the threshold compensation transistor or the data writing transistor is overlapped with the touch electrode line.

Figure 13C:
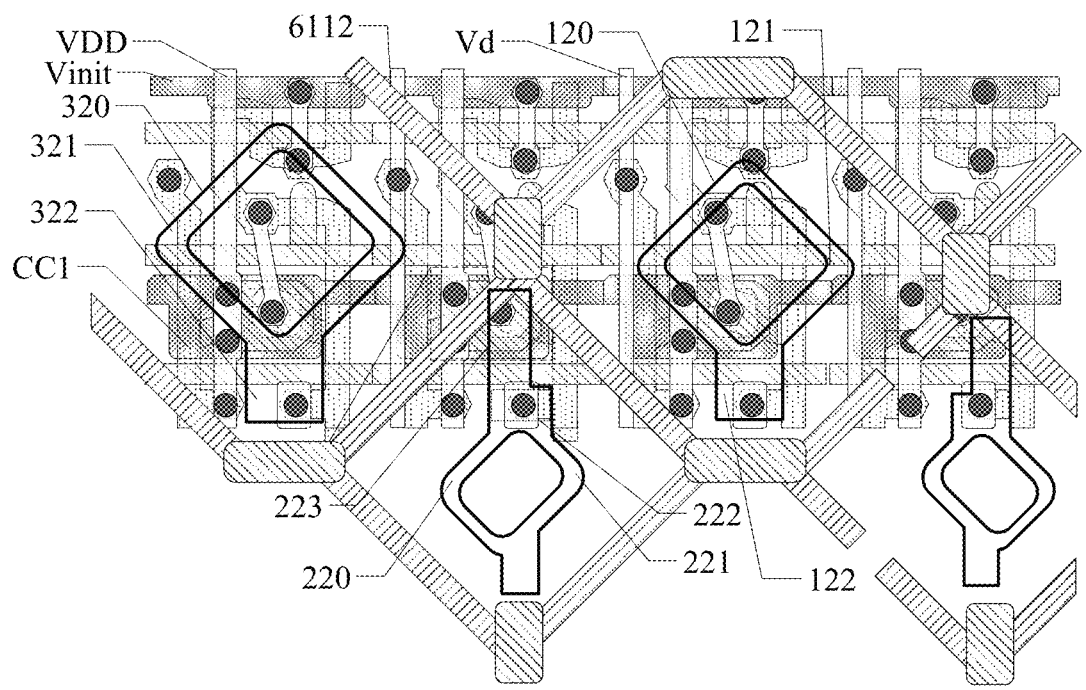

For example, as shown in FIG. 13C, in the second color sub-pixel 200, both the second electrode 220 of the organic light emitting element and the driving transistor are overlapped with the touch electrode line 6112; in the first color sub-pixel 100, both the second electrode 120 of the organic light emitting element and the driving transistor are substantially not overlapped with the touch electrode line 6112; in the third color sub-pixel 300, both the second electrode 320 of the organic light emitting element and the driving transistor are substantially not overlapped with the touch electrode line 6112.

Figure 13D:
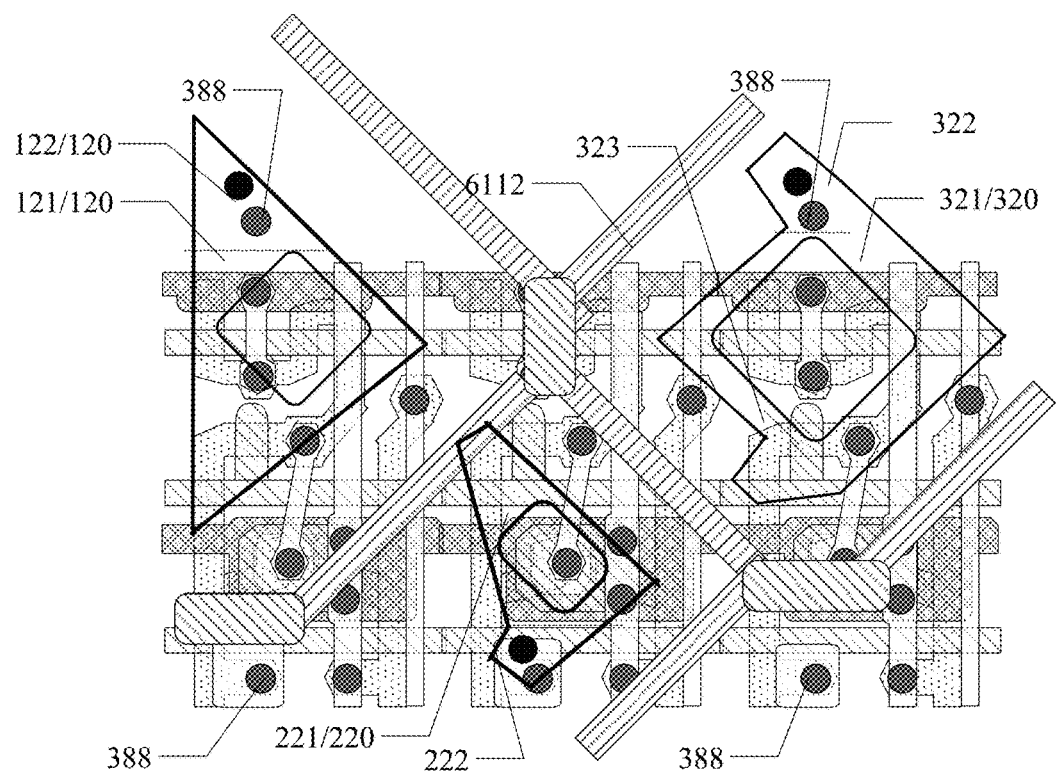

For example, as shown in FIG. 13D, in the second color sub-pixel 200, the driving transistor is overlapped with the second electrode 220 of the organic light emitting element, but not overlapped with the touch electrode line 6112, and the second electrode 220 of the organic light emitting element is overlapped with the touch electrode line 6112; in the first color sub-pixel 100, the driving transistor is overlapped with the touch electrode line 6112, but not overlapped with the second electrode 120 of the organic light emitting element, and the second electrode 120 of the organic light emitting element is not overlapped with the touch electrode line 6112; in the third color sub-pixel 300, the driving transistor is overlapped with the touch electrode line 6112, but not overlapped with the second electrode 320 of the organic light emitting element, and the second electrode 320 of the organic light emitting element is not overlapped with the touch electrode line 6112.

For example, as shown in FIG. 13D, in the first color sub-pixel, the second electrode of the organic light emitting element is not overlapped with the driving transistor or the touch electrode line, and the driving transistor is overlapped with the touch electrode line; in the third color sub-pixel, the second electrode of the organic light emitting element is not overlapped with the driving transistor or the touch electrode line, and the driving transistor is overlapped with the touch electrode line; in the second color sub-pixel, the second electrode of the organic light emitting element is overlapped with the driving transistor and the touch electrode line, and the driving transistor is overlapped with the touch electrode line.

For example, the second electrode 220 of the organic light emitting element of the second color sub-pixel 200 is overlapped with the driving transistor T1 and overlapped with the threshold compensation transistor T3 of the second color sub-pixel 200. For example, the touch electrode line 6112 is overlapped with the part of the driving transistor T1 of the second color sub-pixel 200 which is not covered by the second electrode 220 of the organic light emitting element, thus further stabilizing the driving transistor of the second color sub-pixel. In the second color sub-pixel, the second electrode of the organic light emitting element includes a main body electrode, a connection electrode and an auxiliary electrode. For example, in some embodiments, the auxiliary electrode is used to shield some transistors (such as the data writing transistor or the threshold compensation transistor), so the touch electrode line can be overlapped with the auxiliary electrode of the second electrode of the organic light emitting element to some extent.

For example, the touch electrode line 6112 is overlapped with the second electrode 220 of the organic light emitting element of the second color sub-pixel 200. For example, the touch electrode line 6112 is overlapped with the part of the threshold compensation transistor T3 of the second color sub-pixel 200 which is not covered by the second electrode 220 of the organic light emitting element. The portion of the second electrode of the organic light emitting element of the second color sub-pixel extending in the direction close to the threshold compensation transistor shields the threshold compensation transistor; meanwhile, the touch electrode line helps to shield the part of the threshold compensation transistor which is not covered by the second electrode of the organic light emitting element, thus further stabilizing the threshold compensation transistor of the second color sub-pixel. And therefore, the charging voltage of the node N1 can be ensured, the working state of T1 can be kept stable, and the influence on the normal operation of the OLED element can be avoided.

For example, as shown in FIG. 13D, in the second electrode 120 of the organic light emitting element of the first color sub-pixel 100, the main body electrode 121 is overlapped with the first effective light emitting region 101, and the connection electrode 122 is not overlapped with the first effective light emitting region. For example, the connection electrode 122 is configured to be electrically connected with the second electrode of the organic light emitting element of the second light emitting control transistor T5 through a via hole 388 in the insulating layer.

For example, the second electrode 120 of the organic light emitting element of the first color sub-pixel 100 is not overlapped with the touch electrode line 6112. For example, the second electrode 120 of the organic light emitting element of the first color sub-pixel 100 covers the threshold compensation transistor T3 of the first color sub-pixel 100, thus stabilizing the threshold compensation transistor of the first color sub-pixel. And therefore, the charging voltage of the node N1 can be ensured, the working state of T1 can be kept stable, and the influence on the normal operation of the OLED element can be avoided.

For example, the second electrode 120 of the organic light emitting element of the first color sub-pixel 100 is substantially not overlapped with the driving transistor T1 of the first color sub-pixel 100. For example, the touch electrode line 6112 is overlapped with the driving transistor T1 of the first color sub-pixel 100, so that the driving transistor of the first color sub-pixel can be stabilized.

For example, as shown in FIG. 13D, in the second electrode 320 of the organic light emitting element of the third color sub-pixel 300, the main body electrode 321 is overlapped with the third effective light emitting region, and the connection electrode 322 is not overlapped with the third effective light emitting region. For example, the connection electrode 322 is configured to be electrically connected with the second electrode of the second light emitting control transistor T5 through a via hole 388. For example, the second electrode 320 of the organic light emitting element of the third color sub-pixel 300 is not overlapped with the touch electrode line 6112.

For example, as shown in FIG. 13D, the second electrode 320 of the organic light emitting element of the third color sub-pixel 300 is not overlapped with the touch electrode line 6112. For example, the second electrode 320 of the organic light emitting element of the third color sub-pixel 300 includes a protruding portion 323, the protruding portion 323 covers the threshold compensation transistor T3 of the third color sub-pixel 300, thus stabilizing the threshold compensation transistor of the third color sub-pixel. And therefore, the charging voltage of the node N1 can be ensured, the working state of T1 can be kept stable, and the influence on the normal operation of the OLED element can be avoided.

For example, the second electrode 320 of the organic light emitting element of the third color sub-pixel 300 is substantially not overlapped with the driving transistor T1 of the third color sub-pixel 300. For example, the touch electrode line 6112 is overlapped with the driving transistor T1 of the third color sub-pixel 300, so that the driving transistor of the third color sub-pixel can be stabilized.

Figure 13E:
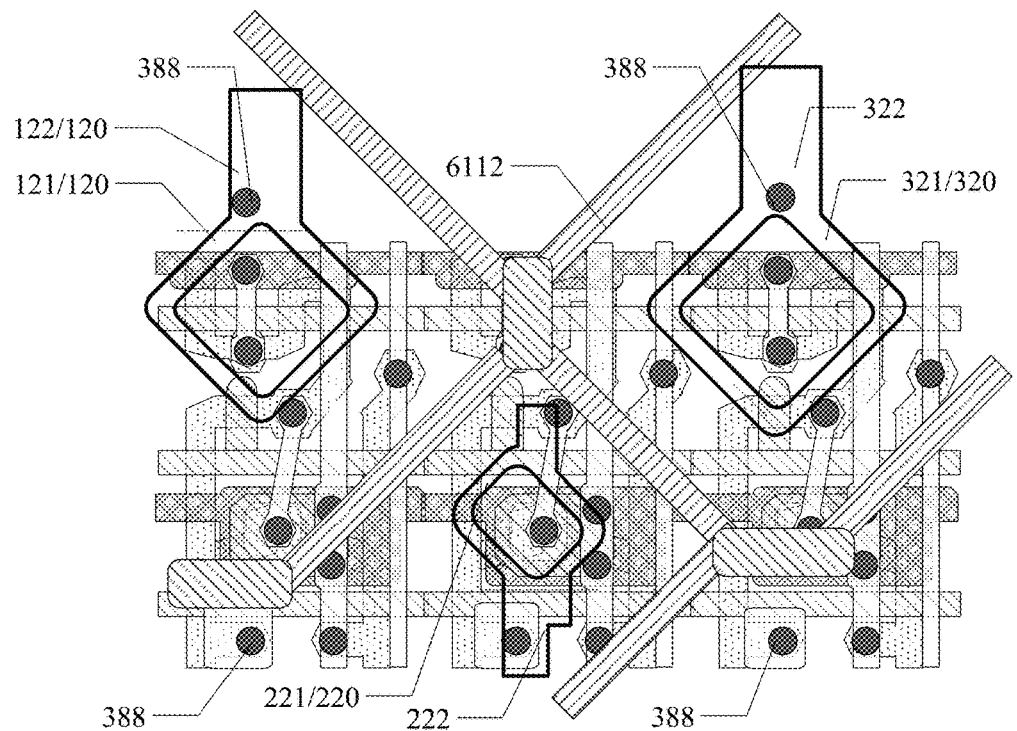

For example, as shown in FIG. 13E, in the second color sub-pixel 200, both the second electrode 220 of the organic light emitting element and the driving transistor are substantially not overlapped with the touch electrode line 6112; in the first color sub-pixel 100, both the second electrode 120 of the organic light emitting element and the driving transistor are overlapped with the touch electrode line 6112; in the third color sub-pixel 300, both the second electrode 320 of the organic light emitting element and the driving transistor are overlapped with the touch electrode line 6112.

Figure 14A:
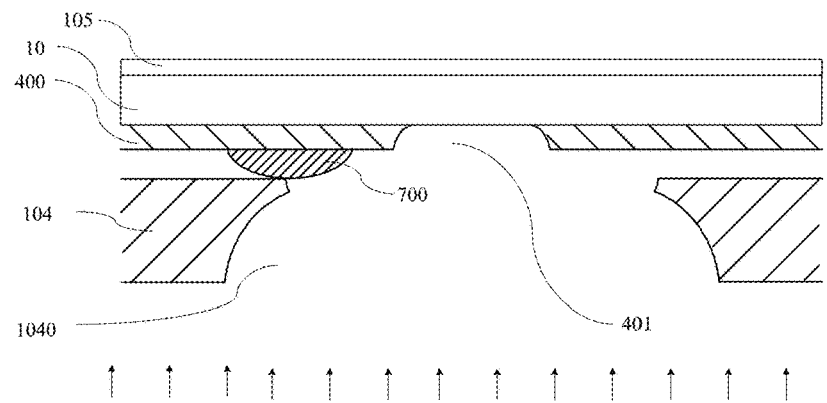
FIG. 14A is a schematic diagram of evaporating a light emitting layer by using an FMM.

FIG. 14A is a schematic diagram of evaporating a light emitting layer by using an FMM. A pixel defining layer 400 is formed on the base substrate 10, the pixel defining layer 400 has an opening 401, a spacer 700 is provided on the pixel defining layer 400, the spacer functions to support an FMM 104, the FMM 104 has a through hole 1040, the through hole 1040 can be a hole formed by etching, and the evaporation material is deposited on the base substrate 10 from bottom to top through the through hole 1040. To prevent FMM from damaging the film layer on the base substrate 10, a spacer (such as a photo space, PS) is provided on the base substrate 10 to support the FMM during evaporation. During evaporation, the base substrate 10 is placed above the FMM 104, and the spacer 700 is attached to the FMM. In order to improve the accuracy of the evaporation position, it is usually necessary to place a Gaussian plate 105 with strong magnetism above the base substrate 10 to adsorb the FMM 104, so that the FMM 104 is more closely attached to the base substrate 10. The arrow in FIG. 14A indicates the gas flow direction.

Because the FMM is made of metal, it is easy to damage the material deposited on the base substrate 10 when it comes into contact with the base substrate 10. Therefore, in the OLED backplane design, the spacer 700 plays a supporting role when the FMM 104 is attached to the base substrate 10, thus preventing the FMM 104 from scratching the surface of the base substrate 10. The spacers 700 can be distributed in an array throughout the panel, but are not limited thereto.

For example, in the case where the spacer 700 is used to support the FMM, the top of the spacer 700 may not be evaporated with a light emitting layer. For example, each spacer 700 includes a first region 701 and an annular second region 702 surrounding the first region 701. The first region 701 includes a central region of the spacer 700, and the area ratio between the orthographic projections of the first region 701 and the spacer 700 on the base substrate 10 is not greater than ¼. For example, the area ratio between the orthographic projections of the first region 701 and the spacer 700 on the base substrate 10 is ⅓ to ¼, and the top of the spacer 700 is located in the first region 701.

For example, in the display region, the first region of at least one spacer is not overlapped with any one of the first color light emitting layer, the second color light emitting layer or the third color light emitting layer. For example, the first region 701 of at least one spacer 700 is not overlapped with the light emitting layer. For example, the first region 701 of at least one spacer 700 is overlapped with only one kind of color light emitting layer, for example, the first region 701 of at least one spacer 700 is overlapped with only the green light emitting layer. For example, the first region 701 of at least one spacer is 700 is overlapped with only two kinds of color light emitting layers, for example, the first region 701 of at least one spacer 700 is overlapped with only the red light emitting layer and the blue light emitting layer.

For example, the spacer can be arranged between the first color sub-pixel and the second color sub-pixel, and in the case where there is no light emitting layer overlapped on the top of the spacer, the transverse crosstalk or cross-color can be further reduced. For example, when the light emitting layer of the first color sub-pixel is evaporated, the part of the spacer close to the opening of the pixel defining layer for forming the second color sub-pixel supports the FMM, so that this part is not evaporated with the first color light emitting layer; when the light emitting layer of the third color sub-pixel is evaporated, the part of the spacer close to the opening of the pixel defining layer for forming the first color sub-pixel supports the FMM, so that this part is not evaporated with the third color light emitting layer. When the light emitting layer of the second color sub-pixel is evaporated, the second color light emitting layer is formed in parts on both sides of the spacer, and there is no second color light emitting layer in other regions. Because the openings are not overlapped, the distribution of the color light emitting layers in the center region (e.g., the first region) of the spacer are substantially not overlapped or have a small overlapping part (e.g., less than 30%) which is caused by factors such as process margin, etc.

For example, the orthographic projection of the spacer on the base substrate is at least one selected from the group consisting of a rounded rectangle, an ellipse and a circle. For example, the orthographic projection of the spacer on the base substrate is an axisymmetric pattern. For example, the spacer is located at the intersection of parts of the pixel defining layer with different extending directions (for example, the spacer covers the intersection of parts of the pixel defining layer with different extending directions), and has two symmetry axes, and the two symmetry axes are approximately parallel to the two extending directions of the pixel defining layer at the positions where the two symmetry axes are located. For example, the orthographic projection of the spacer on the base substrate has a size of 20-50 μm in the long axis direction. For example, the orthographic projection of the spacer on the base substrate has a size of 12-30 μm in the short axis direction. For example, the area of the orthographic projection of the spacer on the base substrate is less than 48 μm*26 μm. For example, the size range of the orthographic projection of the spacer on the base substrate is less than 41 μm*25 μm. For example, the size range of the orthographic projection of the spacer on the base substrate is less than 33 μm*20 μm. For example, the size range of the orthographic projection of the spacer on the base substrate is less than 25 μm*15 μm.

Figure 14B:
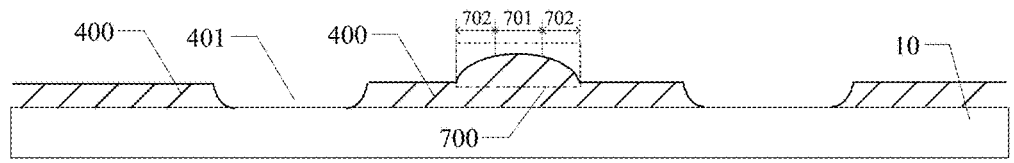
FIG. 14B is a schematic diagram of a positional relationship between a pixel defining layer and a spacer.

For example, FIG. 14B is a schematic diagram of a positional relationship between a pixel defining layer and a spacer. As shown in FIG. 14B, for example, the distance between the boundary of the spacer 700 and the edge of the opening 401 of the pixel defining layer 400 is not less than 6.5 μm.

For example, the spacer 700 and the pixel defining layer 400 can be an integrated structure without obvious boundaries. For example, the spacer 700 and the pixel defining layer 400 may be bounded by the position where the inflection point of the slope angle curve appears. For example, for the pixel defining layer itself, along a direction from one of the opening edges located at both sides of the center line of the extending direction thereof to the center line of the extending direction of the pixel defining layer, the slope angle has a trend from large to small, and the slope angle can be approximately 0 to 5 degrees at the surface of the pixel defining layer which is nearly flat; from the surface of the pixel defining layer which is nearly flat to the boundary of the spacer, the slope angle tends to rise again. For example, at the boundary of the spacer, the slope angle can rise from nearly 0 degree to about 10 degrees (for example, 5 to 10 degrees), or above 10 degrees. The slope angle can be an included angle between an outer tangent of the measuring point position and a plane where the surface of the main body electrode of the nearest second electrode (e.g., anode) away from the base substrate is located. For example, the thickness of the part of the pixel defining layer 400 without the spacer 700 is a first thickness (for example, the average thickness of the flat part), and the maximum thickness of the part of the pixel defining layer 400 with spacer 700 is a second thickness. The boundary between the spacer 700 and the pixel defining layer 400 can be defined as follows: the part has a first thickness from the surface of the pixel defining layer 400 close to the base substrate can be defined as the pixel defining layer 400 itself, and the part beyond the first thickness to the second thickness can be defined as the spacer.

For example, the thickness of the part of the pixel defining layer 400 without the spacer 700 is a first thickness (e.g., the average thickness of a nearly flat part), and for example, the first thickness is 0.8-1.8 μm. For example, the thickness of the part of the pixel defining layer 400 without the spacer 700 is a first thickness (e.g., the average thickness of a nearly flat part), and for example, the first thickness is greater than or equal to 1.1 μm. For example, the thickness of the part of the pixel defining layer 400 without the spacer 700 is a first thickness (e.g., the average thickness of a nearly flat part), and for example, the first thickness is less than 3 μm. If the pixel defining layer 400, as a part of the barrier dam for encapsulating the organic layer, has a too small thickness, and the overflow of the organic layer may easily affect the encapsulation effect. If the first thickness of the pixel defining layer 400 is too large, it is easy to cause a relatively large limitation on the luminous angle and affects the luminous efficiency.

For example, the slope angle of the part of the pixel defining layer close to the opening is 15-25 degrees. For example, the slope angle of the part of the pixel defining layer close to the opening is 17-21 degrees. For example, the slope angle of the part of the pixel defining layer close to the opening is 18-20 degrees.

For example, as shown in FIG. 15A to FIG. 15G, at least one embodiment of the present disclosure provides a display panel, which includes: a base substrate, including a display region and a peripheral region located at the peripheral of the display region; a plurality of first color sub-pixels, located in the display region, the plurality of first color sub-pixels being arranged along a first direction to form a plurality of first color sub-pixel rows, the plurality of first color sub-pixel rows being arranged along a second direction, and adjacent first color sub-pixel rows in the plurality of first color sub-pixel rows are shifted with each other along the first direction; a plurality of second color sub-pixels, located in the display region, and arrayed along the first direction and the second direction, and four second color sub-pixels surrounding one first color sub-pixel; a plurality of third color sub-pixels, located in the display region, the plurality of first color sub-pixels and the plurality of third color sub-pixels being alternately arranged along the first direction and the second direction, the plurality of first color sub-pixels and the plurality of second color sub-pixels being alternately arranged along a third direction as a first group, the plurality of third color sub-pixels and the plurality of second color sub-pixels being alternately arranged along the third direction as a second group, the first group and the second group being alternately arranged along the fourth direction, and the third direction and the fourth direction being intersected with both the first direction and the second direction; a pixel defining layer, located in the display region and the peripheral region, the pixel defining layer including a plurality of openings to define effective light emitting regions of the plurality of sub-pixels, the plurality of first color sub-pixels including a plurality of first effective light emitting regions, the plurality of second color sub-pixels including a plurality of second effective light emitting regions, and the plurality of third color sub-pixels including a plurality of third effective light emitting regions. The plurality of first color sub-pixels include a plurality of first color light emitting layers located in the corresponding openings and on the pixel defining layer surrounding the corresponding openings, the plurality of second color sub-pixels include a plurality of second color light emitting layers located in the corresponding openings and on the pixel defining layer surrounding the corresponding openings, the plurality of first color light emitting layers included in the plurality of first color sub-pixels are spaced apart from each other, and the plurality of second color light emitting layers included in the plurality of second color sub-pixels are spaced apart from each other; the plurality of third color sub-pixels include a plurality of third color light emitting layers located in the corresponding openings and on the pixel defining layer surrounding the corresponding openings, and the plurality of third color light emitting layers included in the plurality of third color sub-pixels are spaced apart from each other.

For example, the display panel further includes a plurality of spacers located on a surface of the pixel defining layer away from the base substrate, and the spacers in the display region are located in gaps between the sub-pixels arranged in the first direction, and the spacers in the display region are located in gaps between the sub-pixels arranged in the second direction. In the display region, the area ratio K between the spacer and the pixel defining layer satisfies $K \leq S0/[k1*n*m*(S1G-S2G)+k2*n*m*(S1R-S2R)+k3*n*m*(S1B-S2B)]$, where n is the number (e.g., 4, as shown by the long-strip frame F1 in FIG. 15F) of middle sub-pixels in the same line (e.g., two red sub-pixels 100 and two blue sub-pixels 300 in the same row and between two spacers in the row direction as shown in FIG. 15F) which are located between adjacent spacers among spacers arranged in the first direction, m is the number (e.g., 4, as shown by the long-strip frame F2 in FIG. 15F) of middle sub-pixels in the same line (e.g., four green sub-pixels 200 in the same column and between two spacers in the column direction as shown in FIG. 15F) which are located between adjacent spacers among spacers arranged in the second direction, S0 is the area of one spacer; S1G, S1R and S1B are the areas of the light emitting layers of the second color sub-pixel, the first color sub-pixel and the third color sub-pixel, respectively; S2G, S2R, and S2B are the areas of the openings of the pixel defining layer corresponding to the second color sub-pixel, the first color sub-pixel and the third color sub-pixel, respectively; and k1, k2, and k3 are the proportions of the second color sub-pixels, the first color sub-pixels, and the third color sub-pixels in the display region relative to all of the sub-pixels, respectively. For example, k1 is ½. For example, k2 is ¼. For example, k3 is ¼. For example, k1+k2+k3=1.

For example, S2G is about 80-180 square microns. For example, S2G is about 100-140 square microns. For example, S2R is about 150-280 square microns. For example, S2R is about 160-250 square microns. For example, S2B is about 200-400 square microns. For example, S2B is about 260-350 square microns.

The same line mentioned above refers to the same row or the same column. For example, the same line in the first direction refers to the same row. For example, the same line in the second direction refers to the same column.

In some embodiments, the spacers are not in the same row as the sub-pixels, and for example, the spacers are in the gap between two adjacent rows of sub-pixels; and/or the spacers are not in the same column as the sub-pixels, and for example, the spacers are in the gap between two adjacent columns of sub-pixels. Then the area ratio K between the spacer and the pixel defining layer satisfies $K<S0/[¼*k1*N*M*(S1G-S2G)+¼*k2*N*M*(S1R-S2R)+¼*k2*N*M*(S1B-S2B)]$, where N is the number of sub-pixel columns corresponding to one spacer period in the first direction such as the row direction, and M is the number of sub-pixel rows corresponding to one spacer period in the second direction such as the column direction. For example, one spacer period is that one spacer is set for every N columns of sub-pixels in the first direction such as the row direction. For example, one spacer period is that one spacer is set for every M rows of sub-pixels in the second direction such as the column direction.

In some embodiments, the sub-pixel rows are arranged in a shifted manner. As shown in FIG. 15G, the spacers and the sub-pixels are located in the same row, then in the first direction such as the row direction, the number N of sub-pixel columns corresponding to one spacer period, is twice the number n of middle sub-pixels in the same line which are located between adjacent spacers among spacers arranged in the first direction, and for example, n is 4 and N is 8 (as shown by the long-strip frame in the figure).

In some embodiments, the sub-pixel columns are arranged in a shifted manner. As shown in FIG. 15G, the spacers and the sub-pixels are located in the same column, then in the second direction such as the column direction, the number M of sub-pixel rows corresponding to one spacer period, is twice the number m of middle sub-pixels in the same line which are located between adjacent spacers among spacers arranged in the second direction, and for example, m is 4 and M is 8 (as shown by the long-strip frame in the figure).

FIG. 15A and FIG. 15B are schematic diagrams of positional relationships between spacers and sub-pixels provided by the embodiments of the present disclosure.

As shown in FIG. 15A, the plurality of spacers 700 of the display panel are located on a surface of the pixel defining layer 400 away from the base substrate 10, and the area ratio between the orthographic projection of the spacer 700 on the base substrate and the orthographic projection of the pixel defining layer 400 on the base substrate is not greater than 12%. For example, the area ratio between the orthographic projection of the spacer 700 on the base substrate and the orthographic projection of the pixel defining layer 400 on the base substrate is not greater than 8%. For example, the area ratio between the orthographic projection of the spacer 700 on the base substrate and the orthographic projection of the pixel defining layer 400 on the base substrate is not greater than 7%. For example, the area ratio between the orthographic projection of the spacer 700 on the base substrate and the orthographic projection of the pixel defining layer 400 on the base substrate is not greater than 6%. For example, the area ratio between the orthographic projection of the spacer 700 on the base substrate and the orthographic projection of the pixel defining layer 400 on the base substrate is not greater than 5%. For example, the area ratio between the orthographic projection of the spacer 700 on the base substrate and the orthographic projection of the pixel defining layer 400 on the base substrate is not greater than 4%. For example, the area ratio between the orthographic projection of the spacer 700 on the base substrate and the orthographic projection of the pixel defining layer 400 on the base substrate is not greater than 3%.

For example, the plurality of spacers are located on a surface of the pixel defining layer away from the base substrate. In the display region, the number ratio between spacers and all sub-pixels is less than or equal to 1:4. In the display region, the number ratio between spacers and all sub-pixels is less than or equal to 1:8. For example, in the display region, the number ratio between spacers and all sub-pixels is not greater than 1:12. For example, in the display region, the number ratio between spacers and all sub-pixels is not greater than 1:16. For example, in the display region, the number ratio between spacers and all sub-pixels is not greater than 1:20. For example, in the display region, the number ratio between spacers and all sub-pixels is not greater than 1:24.

For example, along the direction of the connecting line between the centers of the light emitting layers of two adjacent sub-pixels, the ratio of the size of the spacer 700 to the size of the pixel defining layer 400 (e.g., the surface of the pixel defining layer on which the spacer is located, such as the upper surface) is less than 0.9. For example, along the direction of the connecting line between the centers of the light emitting layers of two adjacent sub-pixels, the ratio of the size of the spacer 700 to the size of the pixel defining layer 400 is less than 0.8.

For example, as shown in FIG. 15A, four second color sub-pixels 200 are arranged between adjacent spacers 700 along the second direction, and two first color sub-pixels 100 and two third color sub-pixels 300 are arranged between adjacent spacers 700 along the first direction. For example, the ratio of the area of the orthographic projection of the spacer 700 on the base substrate to the area of the orthographic projection of the pixel defining layer 400 on the base substrate is not greater than 6%. Taking that one spacer is arranged every four sub-pixels in the row direction and one spacer is arranged every four sub-pixels in the column direction as an example, one spacer corresponds to eight second color sub-pixels, four first color sub-pixels and four third color sub-pixels. For example, the ratio between the area of the orthographic projection of the spacer 700 on the base substrate and the area of the orthographic projection of the pixel defining layer 400 on the base substrate is not greater than 8%. The density and size of spacers tend to be smaller and smaller, which can reduce the particles produced in the process and improve the yield. The first direction and the second direction in the embodiment of the present disclosure can be interchanged.

For example, as shown in FIG. 15B, six second color sub-pixels 200 are arranged between adjacent spacers 700 along the second direction, and three first color sub-pixels 100 and three third color sub-pixels 300 are arranged between adjacent spacers 700 along the first direction. For example, the area ratio between the orthographic projection of the spacer 700 on the base substrate and the orthographic projection of the pixel defining layer 400 on the base substrate is less than 6%. One spacer is arranged every six sub-pixels in the row direction and one spacer is arranged every six sub-pixels in the column direction.

For example, as shown in FIG. 15A and FIG. 15B, in the display region, the spacer 700 is not overlap with the bridge line. For example, in the display region, the bridge lines enclosing one second mesh are overlapped with at most one spacer 700. For example, the second mesh 602 has a long-strip shape, and the size of the overlapping part between the spacer 700 and the bridge line is smaller than the size of the second mesh 602 in the direction perpendicular to the extending direction of the second mesh 602. Because the first electrode of each sub-pixel is closest to the bridge line at the position of the spacer, less overlapping between the bridge line and the spacer can reduce crosstalk.

Figure 15C:
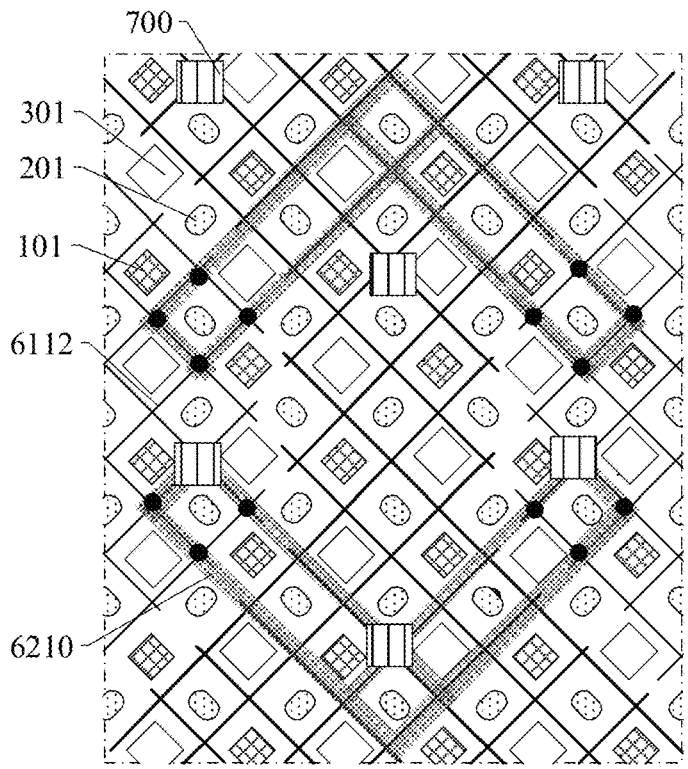
Figure 15D:
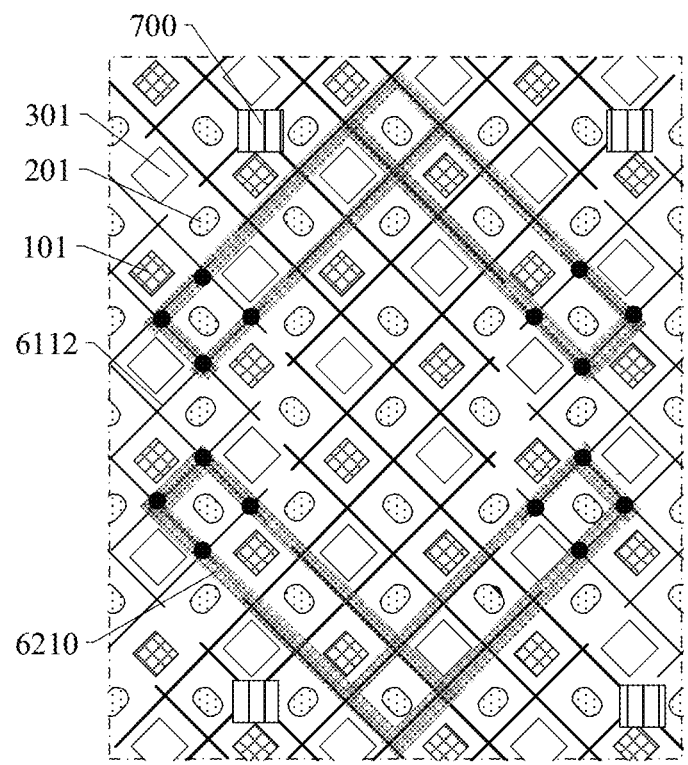
Figure 15E:
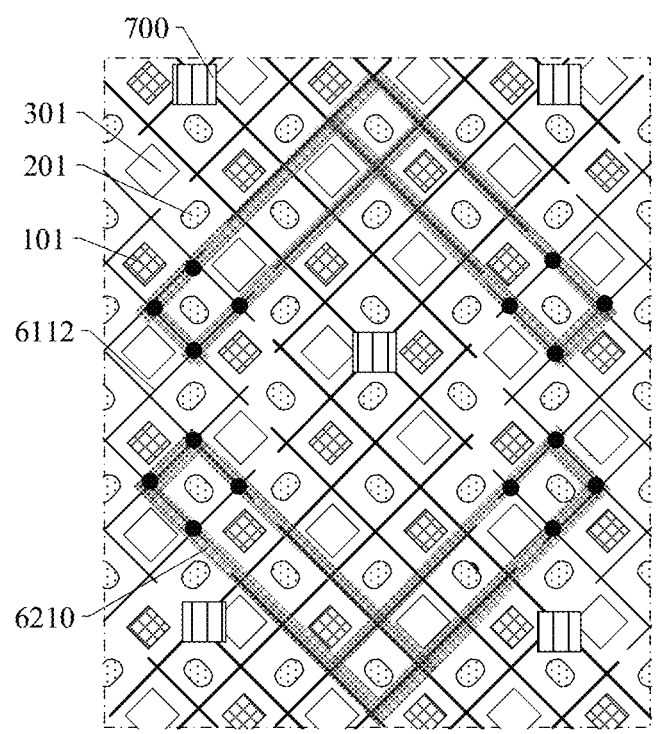
Figure 15F:
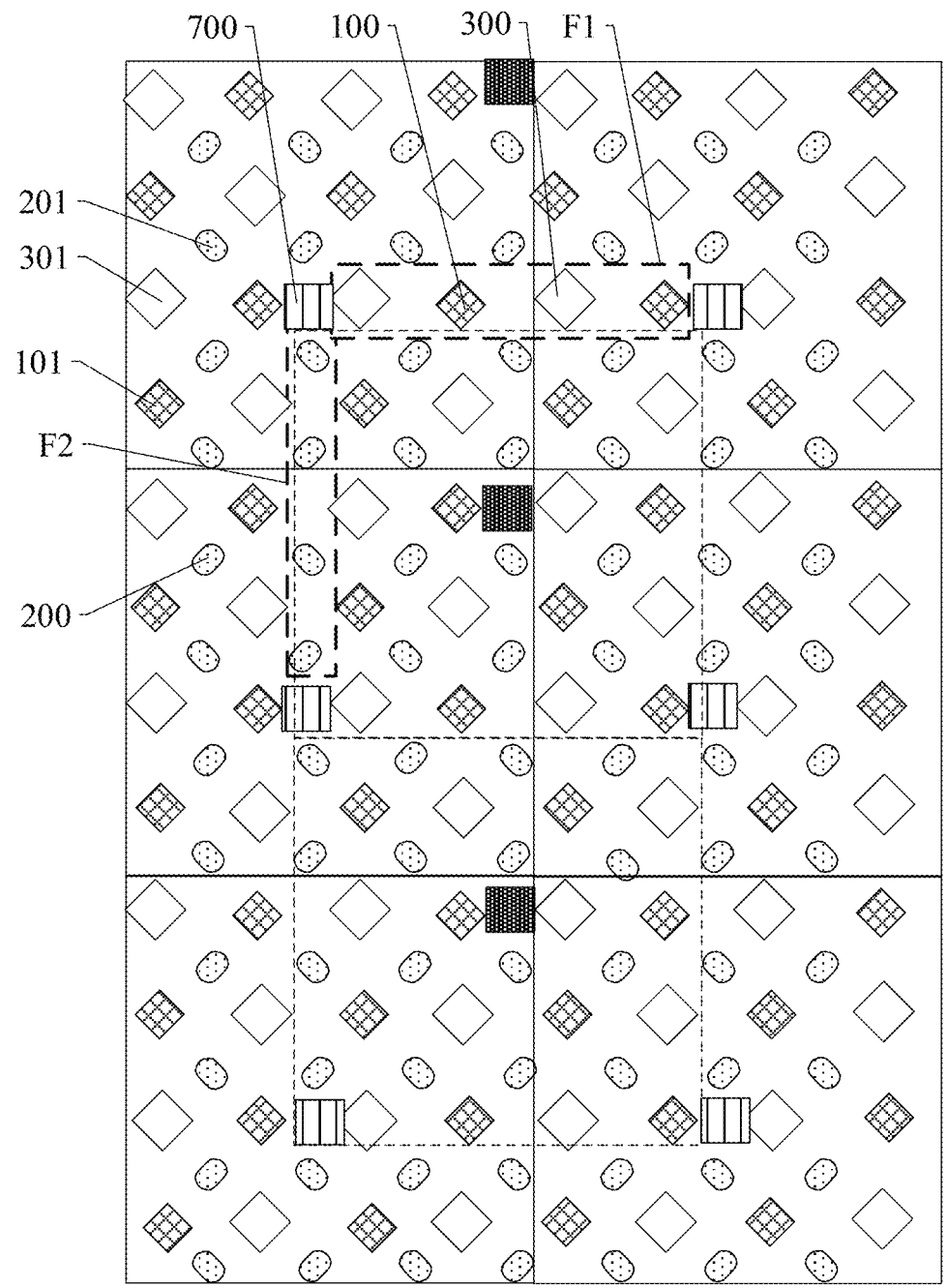
Figure 15G:
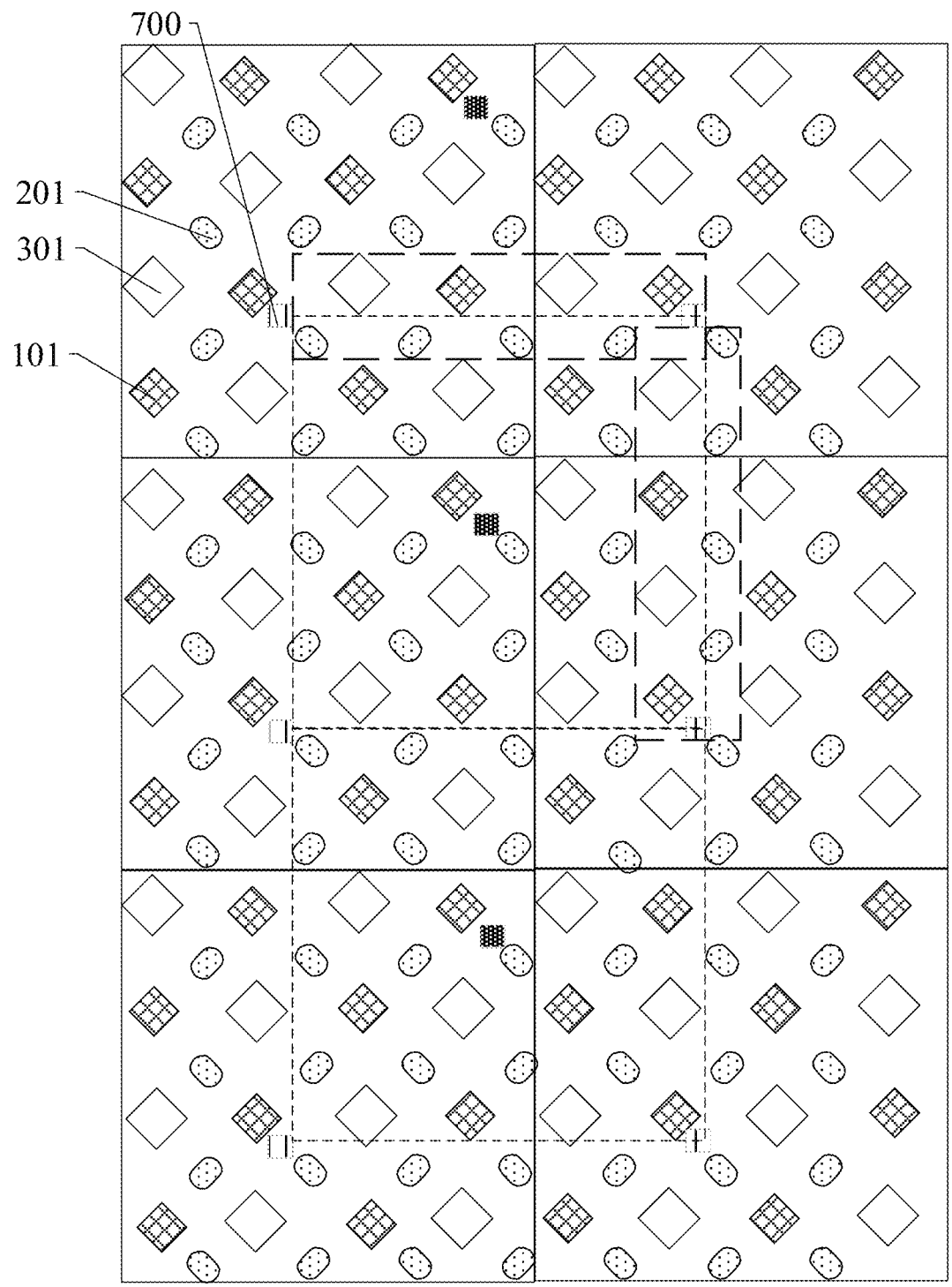

For example, as shown in FIG. 15C, taking that two adjacent second touch units are electrically connected through two connection bridges as an example, the second meshes where the two endpoints and the middle turning point of one connection bridge 621 are located can be overlapped with the spacer 700, while the other connection bridge 621 is not overlapped with the spacer 700. The embodiment of the present disclosure is not limited thereto, and for example, in the case where five or six second color sub-pixels are arranged between two adjacent spacers, only the second mesh where the middle turning point of one connection bridge is located may be overlapped with the spacer. For example, as shown in FIG. 15A, taking that two adjacent second touch units are electrically connected through two connection bridges as an example, one connection bridge 621 is overlapped with one spacer 700, and the other connection bridge 621 is also overlapped with one spacer 700. For example, the embodiment of the present disclosure is not limited to the positional relationship between the spacer and the connection bridge shown in FIG. 15A, and if the spacers in FIG. 15A are moved upward by a size of a second mesh, one connection bridge is overlapped with one spacer, while the other connection bridge is not overlapped with the spacer.

For example, FIG. 15F shows that adjacent spacers in the row direction are separated by four sub-pixels, such as two red sub-pixels and two blue sub-pixels, and that adjacent spacers in the column direction are separated by four sub-pixels, such as four green sub-pixels. For example, each spacer corresponds to an approximately rectangular region (shown by a solid frame in the figure). The region includes, for example, four green sub-pixel rows, and each row includes four green sub-pixel; that is, the region includes sixteen green sub-pixels. The region includes, for example, four rows, each row of which is formed by alternating red sub-pixels and blue sub-pixels, and each row includes two red sub-pixels and two blue sub-pixels; that is, the region includes eight red sub-pixels and eight blue sub-pixels. Among the spacers distributed in every four rows and four columns of sub-pixels (e.g., the first spacers, filled with vertical lines in the figure), one spacer (e.g., the second spacer, filled with fine grids in the figure) is also distributed in the approximate middle of a 2*2 matrix formed by every four spacers in the interior. The first spacers and the second spacers have the same distribution rule and approximately the same number. Each second spacer also corresponds to an approximately rectangular region (shown by a dashed frame in the figure), and the region also includes, for example, sixteen green sub-pixels, eight red sub-pixels and eight blue sub-pixels. The first spacers and the second spacers have the same distribution and approximately the same number, the rectangular regions corresponding to the first spacers cover approximately the entire display region, and the rectangular regions corresponding to the second spacers also cover approximately the entire display region, so each sub-pixel in the rectangular regions corresponding to the first spacer and the second spacer is included in two rectangular regions. For example, the number of sub-pixels essentially corresponding to the first spacer and the second spacer is eight green sub-pixels, four red sub-pixels and four blue sub-pixels (only at the inner side of the display region, the number ration at the edge part may have some differences due to the shape or algorithm). For example, if the repetition of rectangular regions corresponding to the first spacers and the second spacers is considered, the region obtained after dividing each rectangular region by two is roughly a display region essentially corresponding to one spacer, and the regions can be in one-to-one correspondence with the spacers inside the display region. For example, the area of the display region corresponding to one spacer is roughly the area occupied by eight green sub-pixels, four red sub-pixels and four blue sub-pixels.

For example, the number ratio between spacers and sub-pixels in the display region is 1:16.

For example, the ratio of the area of one spacer to the area of the orthographic projection of the pixel defining layer in the display region corresponding to the spacer is not greater than 8%.

For example, the pixel defining layer surrounding each sub-pixel is substantially covered by a corresponding light emitting layer. For example, the boundary of the opening, for forming the light emitting layer of each sub-pixel, of the mask plate, is approximately located at the center line of each portion of the pixel defining layer. For example, the area of the pixel defining layer surrounding the opening corresponding to each sub-pixel, is approximately the area of the opening, for forming the light emitting layer of the sub-pixel, of the mask plate, minus the area of the opening of the pixel defining layer. Or, for example, regardless of factors such as process margin, etc., the area of the pixel defining layer surrounding the opening corresponding to each sub-pixel, is approximately the area (S1) of the light emitting layer of the sub-pixel, minus the area (S2) the opening of the pixel defining layer.

For example, the opening of the FMM corresponding to the green sub-pixel has a shape of round or square, with a diameter or side length of 30-35 µm, and for example, 33 µm. For example, the opening of the FMM corresponding to the red sub-pixel has a shape of square, with a side length of 30-35 µm, and for example, 33 µm. For example, the opening of the FMM corresponding to the blue sub-pixel has a shape of square, with a side length of 33-38 µm, and for example, 35.5 µm.

For example, the opening of the pixel defining layer corresponding to the green sub-pixel has a shape of oval or rectangular (it can be considered that the length of the long side of the rectangular is the size of the long axis and the length of the short side of the rectangular is the size of the short axis), and the long axis thereof is 12-16 µm, for example, 14 µm, and the short axis thereof is 10-14 µm, for example, 11 µm. For example, the opening of the pixel defining layer corresponding to the red sub-pixel has a shape of square, and the side length thereof is approximately 14-17 µm, for example, 15 µm. For example, the opening of the pixel defining layer corresponding to the blue sub-pixel has a shape of square, and the side length thereof is approximately 16-20 µm, for example, 18 µm.

For example, in the display region, the pixel defining layer can include a part covered by the light emitting layer, and can also include a part not covered by the light emitting layer.

For example, in the display region, the area ratio K between the spacer and the pixel defining layer satisfies $K \leq S0/[k1*n*m*(S1G-S2G)+k2*n*m*(S1R-S2R)+k3*n*m*(S1B-S2B)]$, where n is the column number of middle sub-pixels between adjacent spacers in the same row, m is the row number of middle sub-pixels between adjacent spacers in the same column, S0 is the area of one spacer; S1G, S1R and S1B are the areas of the light emitting layers or corresponding FMM openings of the green sub-pixel, the red sub-pixel and the blue sub-pixel, respectively; S2G, S2R and S2B are the areas of the openings of the pixel defining layer corresponding to the green sub-pixel, the red sub-pixel and the blue sub-pixel, respectively; and k1, k2 and k3 are the ratios of the green sub-pixels, the red sub-pixels and the blue sub-pixels to all sub-pixels in the display region. For example, $k1+k2+k3=1$. For example, for the arrangement shown in FIG. 15F, the number ratio among G sub-pixels, R sub-pixels and G sub-pixels is 2:1:1, then k1 is $2/(2+1+1) = \frac{1}{2}$, k2 is $1/(2+1+1) = \frac{1}{4}$, and k3 is $1/(2+1+1) = \frac{1}{4}$. For example, for an arrangement with equal number of RGB sub-pixels, $k1=k2=k3=\frac{1}{3}$.

For example, regardless of other factors, the larger n or m is, the sparser the distribution of the spacers is, and the smaller the K value is. For example, regardless of other factors, the larger the area of the light emitting layer of each sub-pixel, the larger the corresponding opening of the FMM; the spacer correspondingly supports the part at the outer side of the opening of the FMM, and therefore, compared with the area of the opening part of the FMM, the area of the part that can be supported by the spacer decreases with the increase of the area of the light emitting layer, and the size of the spacer decreases correspondingly or the distribution number of the spacers is relatively smaller (because it is needed to avoid the opening of each FMM), so the K value is also smaller. For example, regardless of other factors, the smaller the area of the opening of the pixel defining layer corresponding to each sub-pixel is, the larger the entity area of the pixel defining layer is, and accordingly, the area ratio K between the spacer and the pixel defining layer is smaller under the same distribution density. For example, n can be equal to m, and for example, both are 4, or both are 6, or both are 5.

For example, n may not be equal to m, and for example, one of them is 4 and the other of them is 6.

In some embodiments, the display panel may have no touch function, that is, it does not include touch electrodes. In some embodiments, the touch electrodes of the display panel may not adopt the arrangement manner of touch electrode lines and bridge lines, and for example, the touch electrodes may be electrodes having a plane shape. In some embodiments, the material of the touch electrode of the display panel can be metal, or metal oxide, or any other conductive material.

As shown in FIG. 4 to FIG. 8 and FIG. 16, at least one embodiment of the present disclosure provides a display panel, which includes: a base substrate, including a display region and a peripheral region located at the peripheral of the display region; and a plurality of sub-pixels, located in the display region. Each sub-pixel includes a first electrode and a second electrode, the second electrode is located between the base substrate and the first electrode, and the first electrode is an integral film layer in the display region. The display panel further includes: an encapsulation layer, located in the display region and the peripheral region; a first touch electrode layer, located at one side of the encapsulation layer away from the base substrate, the first touch electrode layer including a plurality of first touch electrodes extending along the first direction and a plurality of second touch electrodes extending along the second direction, each first touch electrode including a plurality of first touch electrode units, each second touch electrode including a plurality of second touch electrode units, the first touch electrode layer including a plurality of touch electrode lines, the plurality of touch electrode lines being intersected to form a plurality of first meshes, and both of each first touch electrode unit and each second touch electrode unit including a plurality of communicated first meshes; a second touch electrode layer, including a plurality of connection bridges, the second touch electrode layer including a plurality of bridge lines, the plurality of bridge lines being intersected to form a plurality of second meshes, each connection bridge including a plurality of communicated second meshes, and adjacent second touch electrode units being electrically connected through at least one connection bridge; a touch insulation layer, located between the first touch electrode layer and the second touch electrode layer, and the second touch electrode unit being electrically connected with the connection bridge through a via hole penetrating through the touch insulation layer. One of the first touch electrode layer and the second touch electrode layer which is closer to the first electrode is a closer touch electrode layer, in the display region, the total thickness of the insulation layer between the first electrode located in the effective light emitting region and the closer touch electrode layer is greater than the total thickness of the insulation layer between the first electrode located at the outer side of the effective light emitting region and the closer touch electrode layer.

It should be noted that, in the embodiment of the present disclosure, the pixel circuit can have a 7T1C structure (i.e., seven transistors and one capacitor) as shown in FIG. 15B, and can also have a structure including other numbers of transistors and capacitors, such as 7T2C structure, 6T1C structure, 6T2C structure or 9T2C structure, without being limited in the embodiment of the present disclosure. In the embodiment of the present disclosure, the pixels can adopt any arrangement manner, such as stripe arrangement, triangle arrangement, mosaic arrangement, etc. In the embodiment of the present disclosure, the number proportion of RGB in one pixel unit or repeating unit can be any one or a combination of two or more selected from the group consisting of 1:1:2, 1:2:1, 2:2:1, 1:1:1, 1:2:3, 3:3:2, 1:3:2, 2:3:1, 3:2:3, 2:3:3, etc. For example, RGB may be equal in size, or may not be equal in size. For example, the size of the opening in the pixel defining layer for defining the light emitting layer of B is greater than that of R, and the size of the opening in the pixel defining layer for defining the light emitting layer of B is greater than that of G. For example, the size of the opening in the pixel defining layer for defining the light emitting layer of B is greater than that of R, and the size of the opening in the pixel defining layer for defining the light emitting layer of R is greater than that of G. For example, the size of the opening in the pixel defining layer for defining the light emitting layer of B is greater than that of R, and the size of the opening in the pixel defining layer for defining the light emitting layer of R is equal to that of G. For example, the size of the opening in the pixel defining layer for defining the light emitting layer of B is equal to that of R, and the size of the opening in the pixel defining layer for defining the light emitting layer of R is greater than that of G. For example, the size of the opening in the pixel defining layer for defining the light emitting layer of R is greater than that of G. For example, the size of the opening in the pixel defining layer for defining the light emitting layer of G is greater than that of R. For example, the size of the opening in the pixel defining layer for defining the light emitting layer of G is greater than that of B. For example, the number of sub-pixels included in each repeating unit or pixel unit can be any one or a combination of two or more selected from the group consisting of 2, 3, 4, 5, 6, 7, 8, 9, 10, etc.

In some embodiments, some sub-pixels emitting light with the same color may have effective light emitting regions of different areas. For example, in some embodiments, sub-pixels included in one repeating unit or pixel unit include two green sub-pixels with the same color, two red sub-pixels with the same color, two blue sub-pixels with the same color, or two pairs of sub-pixels in which each pair of sub-pixels are of the same color (e.g., two green sub-pixels and two red sub-pixels), and the areas of the effective light emitting regions of the sub-pixels with the same color can be different. In some embodiments, in the case where sub-pixels with the same color are located at an edge position, at a special-shaped region or at a foldable region, etc., and the effective light emitting regions thereof can have different areas or shapes from the effective light emitting regions of sub-pixels with the same color in other regions.

In the above embodiments, the luminous color, size, shape and position distribution of each sub-pixel can be freely combined. For example, the size and shape of the sub-pixels can be partly the same and partly different; or totally the same; or completely different. For example, some sub-pixels have the same size but different shapes. For example, some sub-pixels have substantially the same shape outline, but different areas. For example, there may be different numbers of second color sub-pixels around different first color sub-pixels, and the number of second color sub-pixels may be 2, 3, 4, 5, 6, 7, 8, etc. These second color sub-pixels may have approximately the same distance from the first color sub-pixel, or some of these second color sub-pixels have the same distance from the first color sub-pixel and some of these second color sub-pixels have different distances from the first color sub-pixel. For example, there may be different numbers of third color sub-pixels around different second color sub-pixels, and the number of third color sub-pixels may be 2, 3, 4, 5, 6, 7, 8, etc. These third color sub-pixels may have approximately the same distance from the second color sub-pixel, or some of these third color sub-pixels have the same distance from the second color sub-pixel and some of these third color sub-pixels have different distances from the second color sub-pixel. For example, there may be different numbers of second color sub-pixels around different third color sub-pixels, and the number of second color sub-pixels may be 2, 3, 4, 5, 6, 7, 8, etc. These second color sub-pixels may have approximately the same distance from the third color sub-pixel, or some of these second color sub-pixels have the same distance from the third color sub-pixel and some of these second color sub-pixels have different distances from the third color sub-pixel.

Figure 16:
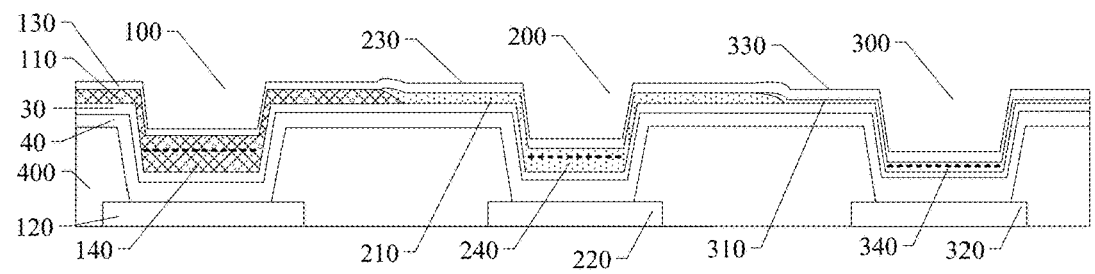
FIG. 16 is a partial cross-sectional structural view taken along line GG shown in FIG. 1A.

FIG. 16 is a partial cross-sectional structural view taken along line GG shown in FIG. 1A. FIG. 16 only illustratively shows the film layers between the second electrode and the first electrode of each sub-pixel. As shown in FIG. 16, the total thickness of the film layers between the first electrode and the second electrode of each sub-pixel is smaller than the depth of the opening in the pixel defining layer 400. For example, the total thickness of the functional film layers between the first electrode 130 and the second electrode 120 of the first color sub-pixel 100 is greater than the total thickness of the functional film layers between the first electrode 230 and the second electrode 220 of the second color sub-pixel 200, and the total thickness of the functional film layers between the first electrode 230 and the second electrode 220 of the second color sub-pixel 200 is greater than the total thickness of the functional film layers between the first electrode 330 and the second electrode 320 of the third color sub-pixel 300.

For example, the depth of the opening in the pixel defining layer 400 is about 0.8 to 1.8 microns. For example, the total thickness of the functional film layers between the first electrode 130 and the second electrode 120 of the first color sub-pixel can be 2800-2900 angstroms, the total thickness of the functional film layers between the first electrode 230 and the second electrode 220 of the second color sub-pixel 200 can be 2300-2400 angstroms, and the total thickness of the functional film layers between the first electrode 330 and the second electrode 320 of the third color sub-pixel 300 can be 1800-1900 angstroms.

For example, as shown in FIG. 16, the functional film layers between the first electrode and the second electrode of each sub-pixel includes an auxiliary light emitting layer, and the auxiliary light emitting layer is located between the light emitting layer and the second electrode. For example, the auxiliary light emitting layer is in direct contact with the light emitting layer. For example, the first color sub-pixel 100 includes an auxiliary light emitting layer 140 between the first color light emitting layer 130 and the second electrode 120, the second color sub-pixel 200 includes an auxiliary light emitting layer 240 between the second color light emitting layer 230 and the second electrode 220, and the third color sub-pixel 300 includes an auxiliary light emitting layer 340 between the third color light emitting layer 330 and the second electrode 320. For example, the thickness of the auxiliary light emitting layer 140 of the first color sub-pixel 100 is greater than the thickness of the auxiliary light emitting layer 240 of the second color sub-pixel 200, and the thickness of the auxiliary light emitting layer 240 of the second color sub-pixel 200 is greater than the thickness of the auxiliary light emitting layer 340 of the third color sub-pixel 300.

For example, the auxiliary light emitting layer can be at least one of the film layers having the functions of hole transport, electron blocking, electron transport, hole blocking, emitting light, etc. For example, the auxiliary light emitting layer is in direct contact with the light emitting layer. For example, the light emitting layer is directly formed on the surface of the auxiliary light emitting layer away from the base substrate. For example, the auxiliary light emitting layer in each color sub-pixel in the embodiment of the present disclosure can be formed by using the same fine metal mask as the corresponding color light emitting layer, so that the auxiliary light emitting layer of each color sub-pixel has basically the same shape, size, projection feature, etc., as the corresponding color light emitting layer, which will not be repeated here.

For example, the distance between the base substrate and one surface of the first color light emitting layer 130 away from the base substrate is greater than the distance between the base substrate and one surface of the second color light emitting layer 230 away from the base substrate, and the distance between the base substrate and one surface of the second color light emitting layer 230 away from the base substrate is greater than the distance between the base substrate and one surface of the third color light emitting layer 330 away from the base substrate.

For example, the distance between one surface of the first color light emitting layer 130 away from the base substrate and the flat surface of the pixel defining layer 400 is greater than the distance between one surface of the second color light emitting layer 230 away from the base substrate and the flat surface of the pixel defining layer 400, the distance between one surface of the second color light emitting layer 230 away from the base substrate and the flat surface of the pixel defining layer 400 is greater than the distance between one surface of the third color light emitting layer 330 away from the base substrate and the flat surface of the pixel defining layer 400.

For example, the slope angle of the slope at the opening of the pixel defining layer 400 can be in the range from 16 to 22 degrees. For example, the slope angle of the slope at the opening of the pixel defining layer 400 can be in the range from 18 to 20 degrees. In the case where the slope of the pixel defining layer is an arc surface, the slope angle is the included angle between the tangent line at the intersection of the slope and the second electrode of the organic light emitting element of the sub-pixel and the base substrate. But not limited thereto, there is a connecting line connecting the midpoint at the position of half the height of the pixel defining layer 400, and the intersection between the pixel defining layer 400 and the second electrode of the organic light emitting element of the sub-pixel, the slope angle can also be the included angle between the connecting line and the plane where the base substrate is located.

For example, as shown in FIG. 16, an integral hole transport layer 30 and an integral hole injection layer 40 are also arranged between the light emitting layer and the second electrode of the organic light emitting element of each sub-pixel. For example, the thickness of the hole injection layer 40 can be 5-10 nm, and the thickness of the hole transport layer 30 can be 90-120 nm. Because there are a plurality of continuous film layers between the light emitting layer and the second electrode, transverse leakage current may occur in the hole transport layer and the hole injection layer when a voltage is applied to the second electrode of the organic light emitting element of one color sub-pixel, resulting in that crosstalk easily occurs in the light emitting layer of an adjacent sub-pixel due to the existence of the overlapping part between the light emitting layer of the adjacent sub-pixel and the light emitting layer of the sub-pixel that emits light.

For example, the thickness of the auxiliary light emitting layer 140 of the first color sub-pixel 100 can be 70-90 nanometers, the thickness of the auxiliary light emitting layer 240 of the second color sub-pixel 200 can be 30-40 nanometers, and the thickness of the auxiliary light emitting layer 340 of the third color sub-pixel 300 can be 5-10 nanometers.

For example, at least one selected from the group consisting of an electron injection layer (not shown in the figure), an electron transport layer (not shown in the figure) and a hole blocking layer (not shown in the figure), is also arranged between the light emitting layer and the first electrode of the organic light emitting element of each sub-pixel. For example, the electron injection layer, the electron transport layer and the hole blocking layer are all continuous integral film layers.

For example, the thickness of the hole blocking layer can be in the range from 5 to 10 nanometers. For example, the thickness of the electron transport layer can be in the range from 20 to 30 nanometers.

For example, the second electrode of the organic light emitting element of each sub-pixel can have a laminated structure, such as a laminated structure including indium tin oxide, silver and indium tin oxide. For example, the thickness of the second electrode of the organic light emitting element can be in the range from 100 to 180 nanometers. For example, the thickness of the second electrode of the organic light emitting element can be in the range from 110 to 130 nanometers.

As shown in FIG. 16, the first electrodes of the organic light emitting elements of the plurality of sub-pixels are an integral film layer, and the sum of the thickness of the first electrode of the organic light emitting element and the thickness of the film layers between the first electrode and the second electrode of the organic light emitting element is less than the depth of the opening of the pixel defining layer, so that the first electrode of the organic light emitting element located in the opening and on the pixel defining layer forms a reflective cup structure, thereby improving luminous efficiency and reducing dispersion.

For example, the material of the first electrode of the organic light emitting element can include magnesium and silver, such as magnesium-silver alloy. For example, the thickness of the first electrode of the organic light emitting element can be in the range from 10 to 18 nanometers. For example, the thickness of the first electrode of the organic light emitting element can be in the range from 12 to 15 nanometers. For example, the thickness of the first electrode of the organic light emitting element can be 100 angstroms.

For example, the light emitting layer and the electron transport layer of each sub-pixel can include host-guest doped materials, and other film layers are single molecular weight materials. For example, the material of the electron transport layer can include at least one selected from the group consisting of ytterbium (Yb), magnesium (Mg) and lithium fluoride (LiF). For example, the material of the electron injection layer can be Yb, or a doped material of Mg and LiF.

For example, the auxiliary light emitting layer can have a hole transport function. For example, in the embodiment of the present disclosure, only the light emitting layers and the auxiliary light emitting layers are film layers which are manufactured by using the FMM and are spaced apart, and other organic film layers are continuous common film layers. For example, the materials of the auxiliary light emitting layers of sub-pixel with different colors are different. For example, the materials of the hole transport layer and the auxiliary light emitting layer can be aromatic amine derivatives.

For example, triazine/azine derivatives can be used as the material of the hole blocking layer. For example, the light emitting layer of the third color sub-pixel includes a host material and a doping material, and the thickness of the light emitting layer of the third color sub-pixel can be 15-20 nm. For example, the light emitting layer of the second color sub-pixel includes a host material and a doping material, and the thickness of the light emitting layer of the second color sub-pixel can be 30-40 nm. For example, the luminescent host material of the third color sub-pixel can include anthracene derivatives, the luminescent host material of the second color sub-pixel can include a mixture mixing carbazole and triazine, and the luminescent host material of the first color sub-pixel can include heterocyclic conjugated classes.

For example, the display panel further includes: a light extraction layer, located between the first electrode of the organic light emitting element and the encapsulation layer. For example, the light extraction layer can be an organic layer, which is formed at one side of the first electrode, such as the cathode, away from the base substrate by evaporation process.

For example, the display panel further includes: a transmission enhanced layer, located between the first electrode of the organic light emitting element and the encapsulation layer. For example, the transmission enhanced layer can be an inorganic layer, which is formed at one side of the first electrode of the organic light emitting element, such as the cathode, away from the base substrate by evaporation process. For example, the transmission enhanced layer can include LiF.

In some embodiments, the encapsulation layer can have a laminated structure of a first inorganic encapsulation layer, an organic encapsulation layer and a second inorganic encapsulation layer, which are arranged in sequence; the edge of the light extraction layer is located at one side of the edge of the first electrode close to the display region, and the edge of the light extraction layer is in contact with the edge of the first electrode and the first inorganic encapsulation layer. The common layer formed by using an open mask includes at least a cathode layer and a light extraction layer, and the boundary of the first electrode is larger than the boundary of the light extraction layer so as to realize the bonding of the first electrode with a trace which is at the periphery of the first electrode and connected to the VSS power terminal. For example, the first electrode is bonding with an anode connection layer, which is arranged in the same layer as the second electrode, through a via hole, and the anode connection layer is bonding with a trace which is connected to the VSS power terminal and located in the film layer where the data line is located.

In some embodiments, the display panel can omit at least one of the light extraction layer and the transmission enhanced layer, so as to save the cost of the evaporation process.

In some embodiments, some refractive index adjusting layers can also be included between the last film layer (such as cathode layer, light extraction layer, transmission enhanced layer or any other functional layer) formed by evaporation process and the encapsulation layer, and the refractive index adjusting layers include, for example, inorganic layers. For example, the refractive index adjusting layer can include silicon oxide or silicon nitride. For example, the thickness of the refractive index adjusting layer is in the range from 30 nm to 1 micron. For example, the refractive index adjusting layer can have a thickness of 40 nm to 500 nm. For example, the refractive index adjusting layer can have a thickness of 50 nm to 200 nm. For example, the refractive index adjusting layer may have a thickness of 50 nm to 100 nm. For example, the refractive index adjusting layer can be manufactured by means of vapor deposition. For example, the refractive index adjusting layers have different density, such as gradient change or layered change, so as to meet the requirements of refractive index. For example, the refractive index of the refractive index adjusting layer ranges from 1.3 to 1.8. For example, the refractive index of the refractive index adjusting layer ranges from 1.4 to 1.7. For example, the refractive index of the refractive index adjusting layer ranges from 1.6 to 1.7.

For example, the surface of the first inorganic encapsulation layer away from the base substrate is formed to have a plurality of periodically distributed concave-convex structures. For example, in the concave-convex structure of the surface of the first inorganic encapsulation layer away from the base substrate, the height difference between the concave part and the convex part in the direction perpendicular to the base substrate (for example, relative to the plane where the main body portion of the anode is located) is approximately in the range from 0.5 μm to 1.5 μm. For example, in the concave-convex structure of the surface of the first inorganic encapsulation layer away from the base substrate, the height difference between the concave part and the convex part in the direction perpendicular to the base substrate (for example, relative to the plane where the main body portion of the anode is located) is approximately in the range from 0.6 μm to 1.2 μm. For example, in the concave-convex structure of the surface of the first inorganic encapsulation layer away from the base substrate, the height difference between the concave part and the convex part in the direction perpendicular to the base substrate (for example, relative to the plane where the main body portion of the anode is located) is approximately in the range from 0.8 μm to 1.1 μm. For example, in the concave-convex structure of the surface of the first inorganic encapsulation layer away from the base substrate, one of the concave part and the convex part has a size in the range of (10-20) μm*(10-20) μm, and for example, the concave part has a size in the range of (10-20) μm*(10-20) μm. For example, in the concave-convex structure of the surface of the first inorganic encapsulation layer away from the base substrate, the other of the concave part and the convex part is substantially formed into a connected mesh shape, and the line width of the mesh is about 18-25 μm, so as to enhance the adhesion between the first inorganic encapsulation layer and the organic encapsulation layer in direct contact with the first inorganic encapsulation layer; for example, the convex part is substantially formed into a connected mesh shape. By forming the concave-convex structure on the first inorganic encapsulation layer, the path of water and oxygen invasion can be reduced, and the encapsulation effect can be improved.

Figure 17A:
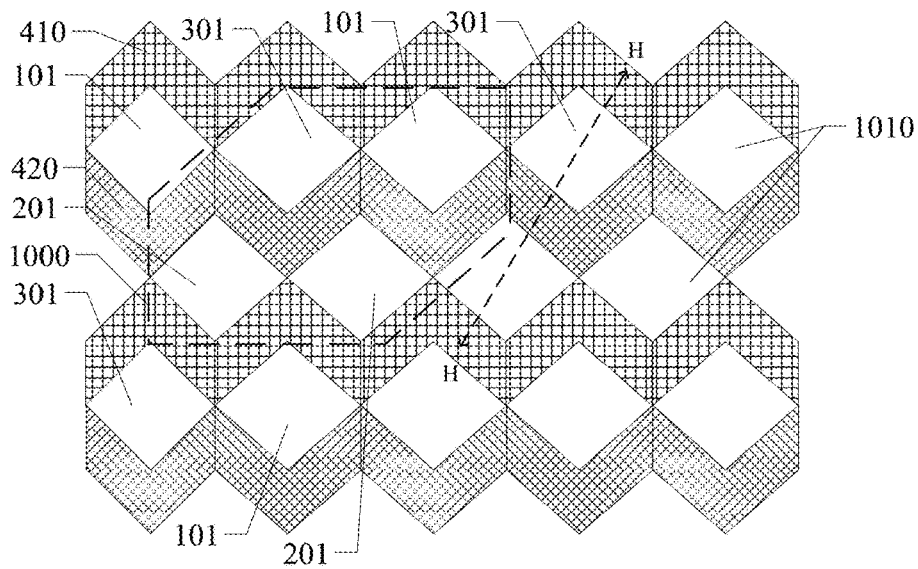
FIG. 17A is a planar view of a pixel defining layer and an effective light emitting region in a display region provided by an embodiment of the present disclosure.
Figure 17B:
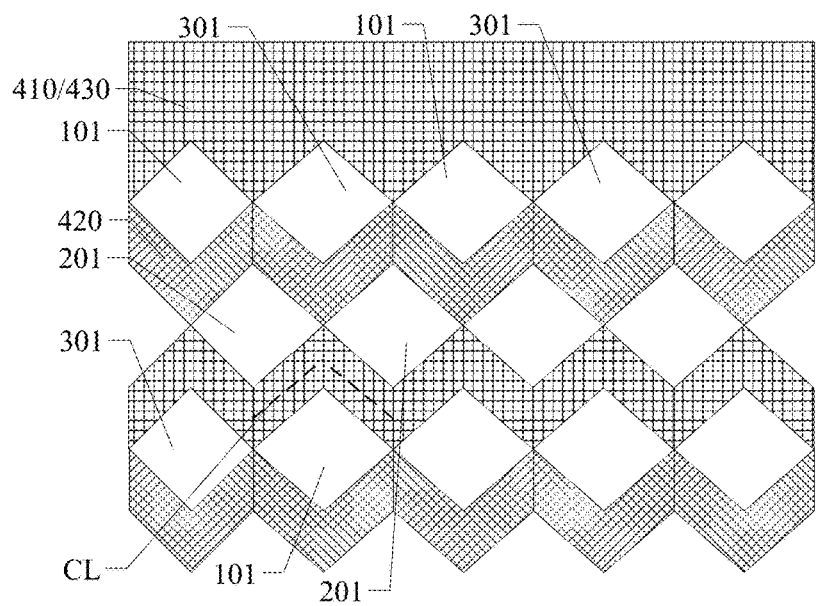
FIG. 17B and FIG. 17C are planar structural views of pixel defining layer of the display region and the peripheral region at two different positions, respectively.
Figure 17C:
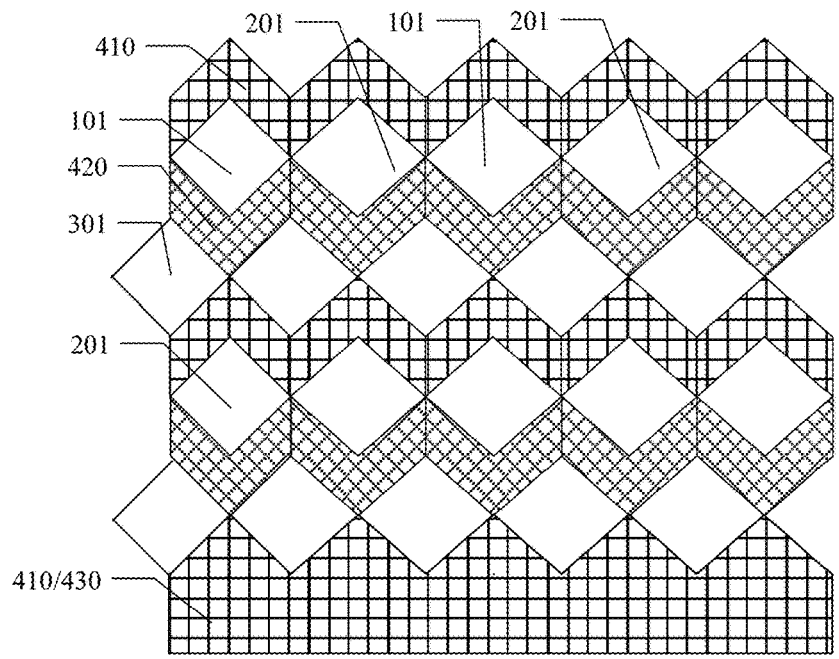
Figure 17D:
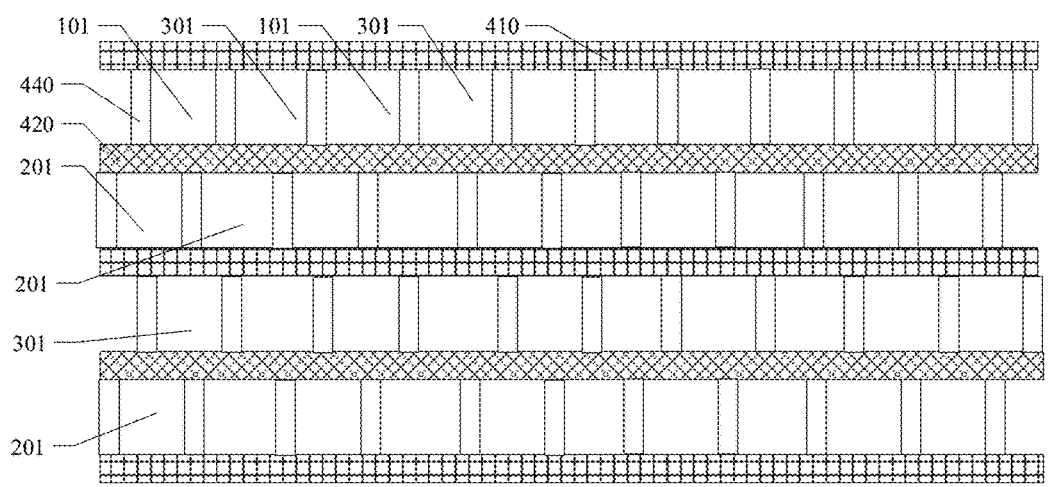
FIG. 17D is a planar structural view of a pixel defining layer of a display region provided by another example.
Figure 18:
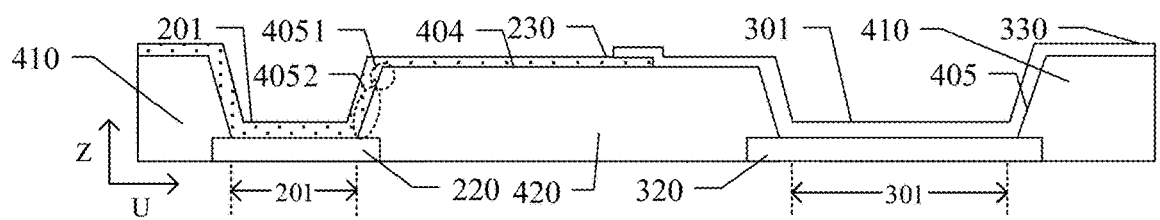
FIG. 18 is a partial cross-sectional structural view taken along line HH shown in FIG. 17A.

For example, as shown in FIG. 17A to FIG. 18, at least one embodiment of the present disclosure provides a display panel, which includes: a base substrate, including a display region and a peripheral region located at the peripheral of the display region; a plurality of first color sub-pixels, located in the display region, the plurality of first color sub-pixels being arranged along a first direction to form a plurality of first color sub-pixel rows, the plurality of first color sub-pixel rows being arranged along a second direction, and adjacent first color sub-pixel rows in the plurality of first color sub-pixel rows are shifted with each other along the first direction; a plurality of second color sub-pixels, located in the display region, and arrayed along the first direction and the second direction, and four second color sub-pixels surrounding one first color sub-pixel; a plurality of third color sub-pixels, located in the display region, the plurality of first color sub-pixels and the plurality of third color sub-pixels being alternately arranged along the first direction and the second direction, the plurality of first color sub-pixels and the plurality of second color sub-pixels being alternately arranged along a third direction as a first group, the plurality of third color sub-pixels and the plurality of second color sub-pixels being alternately arranged along the third direction as a second group, the first group and the second group being alternately arranged along the fourth direction, and the third direction and the fourth direction being intersected with both the first direction and the second direction; a pixel defining layer, located in the display region and the peripheral region, the pixel defining layer including a plurality of openings to define effective light emitting regions of the plurality of sub-pixels, the plurality of first color sub-pixels including a plurality of first effective light emitting regions, the plurality of second color sub-pixels including a plurality of second effective light emitting regions, and the plurality of third color sub-pixels including a plurality of third effective light emitting regions. The plurality of first color sub-pixels include a plurality of first color light emitting layers located in the corresponding openings and on the pixel defining layer surrounding the corresponding openings, the plurality of second color sub-pixels include a plurality of second color light emitting layers located in the corresponding openings and on the pixel defining layer surrounding the corresponding openings, the plurality of first color light emitting layers included in the plurality of first color sub-pixels are spaced apart from each other, and the plurality of second color light emitting layers included in the plurality of second color sub-pixels are spaced apart from each other; the plurality of third color sub-pixels include a plurality of third color light emitting layers located in the corresponding openings and on the pixel defining layer surrounding the corresponding openings, and the plurality of third color light emitting layers included in the plurality of third color sub-pixels are spaced apart from each other. The sub-pixel includes a first electrode and a second electrode, and the second electrode is located between the base substrate and the first electrode; the pixel defining layer includes a plurality of first defining portions and a plurality of second defining portions substantially extending along the first direction, the first defining portions and the second defining portions are alternately arranged along the second direction, and in the second direction, the average heights of one first defining portion and one second defining portion located at both sides of the same row of sub-pixels arranged along the first direction are different; the average heights of the plurality of first defining portions in the display region are approximately the same, the average heights of the plurality of second defining portions in the display region are approximately the same; the average height of the first defining portion is an average height from the surface of the first defining portion away from the base substrate to the plane where the surface of the main body electrode of the second electrode away from the base substrate, and the average height of the second defining portion is an average height from the surface of the second defining portion away from the base substrate to the plane where the surface of the main body electrode of the second electrode away from the base substrate.

In some embodiments, the relationship between the pixel defining layer and the light emitting layer, and the pixel arrangement manner may be different from those of the above embodiments.

For example, FIG. 17A is a planar view of a pixel defining layer and an effective light emitting region in a display region provided by an embodiment of the present disclosure, and FIG. 18 is a partial cross-sectional structural view taken along line HH shown in FIG. 17A. FIG. 17A illustratively shows a pixel defining layer, and a second electrode and a light emitting layer of each sub-pixel. As shown in FIG. 17A and FIG. 18, the pixel defining layer 400 includes wavy first defining portions 410 and wavy second defining portions 420 alternately arranged along the first direction, and the average height of the first defining portions 410 is greater than the average height of the second defining portions 420. For example, the pixel defining layer 400 includes a plurality of first defining portions 410 and a plurality of second defining portions 420 substantially extending along the first direction, the first defining portions and the second defining portions are alternately arranged along the second direction, and in the second direction, the average heights of one first defining portion 410 and one second defining portion 420 located at both sides of the same row of sub-pixels are different; the average heights of the plurality of first defining portions 410 located in the display region are approximately the same, the average heights of the plurality of second defining portions 420 located in the display region are approximately the same; the average height of the first defining portion 410 is an average height from the surface of the first defining portion 410 away from the base substrate to the plane where the surface of the main body electrode of the second electrode away from the base substrate, and the average height of the second defining portion 420 is an average height from the surface of the second defining portion 420 away from the base substrate to the plane where the surface of the main body electrode of the second electrode away from the base substrate. For example, because the second electrode may be uneven, the plane where the portion of the second electrode in the opening of the pixel defining layer is substantially located is taken as a benchmark. For example, the main body electrode of the second electrode can be the portion of the second electrode exposed by the opening of the pixel defining layer. For example, the main body electrode of the second electrode may not only include the portion of the second electrode exposed by the opening of the pixel defining layer, but also include an annular portion surrounding the portion of the second electrode exposed by the opening of the pixel defining layer, and the width of each part of the annular portion is approximately the same. For example, the main body electrodes of the second electrodes exposed by the openings of the pixel defining layer can be located substantially in the same plane.

FIG. 17A only illustratively shows the effective light emitting region of each sub-pixel, and the size and shape of the effective display region of each sub-pixel here are the same as the size and shape of the effective display region of each sub-pixel shown in FIG. 1A. FIG. 17A illustratively shows the first defining portion and the second defining portion with different filling colors, and the first defining portion and the second defining portion can be integrated to form a mesh.

For example, the first defining portion 410 and the second defining portion 420 are used to separate at least two rows of sub-pixels.

For example, the length of the first defining portion 410 extending in the first direction and the length of the second defining portion 420 extending in the first direction at least includes the sum of the size of the effective light emitting regions of four consecutive sub-pixels in this direction and the size of gaps between the effective light emitting regions of the four consecutive sub-pixels in this direction.

For example, as shown in FIG. 17A, two adjacent rows of sub-pixels form a pixel unit row 1010, and in the second direction, the average height of two first defining portions 410 located at both sides of one pixel unit row 1010 is greater than the average height of one second defining portion 420 located between two rows of sub-pixels in the one pixel unit row 1010. For example, the pixel unit row 1010 includes a row in which the first color sub-pixel 100 and the third color sub-pixel 300 are alternately arranged, and a row formed of the second color sub-pixels 200.

For example, the slope angle of the midpoint of the slope at the opening of the first defining portion 410 is greater than that of the slope angle of the midpoint of the slope at the opening of the second defining portion 420, the midpoint of the slope is, for example, at a position of approximately half the thickness of the slope in the direction perpendicular to the base substrate, or at a position of approximately half the extending size of the projection of the slope on a plane. For example, the variation trend of slope angle from one end at the opening of the first defining portion 410 away from the second electrode of the organic light emitting element to one end at the opening of the first defining portion 410 close to the second electrode of the organic light emitting element is slower than the variation trend of slope angle from one end at the opening of the second defining portion 420 away from the second electrode of the organic light emitting element to one end at the opening of the second defining portion 420 close to the second electrode of the organic light emitting element.

For example, the average height of the first defining portion and the average height of the second defining portion refer to a height relative to the surface where the main body electrode of the second electrode of the organic light emitting element of each sub-pixel is located. For example, a planarization layer is provided at one side of the second electrode of the organic light emitting element facing the base substrate, and the average height of the first defining portion and the average height of the second defining portion can also refer to an average distance between the surface of each defining portion away from the planarization layer and the surface of each defining portion close to the planarization layer.

For example, as shown in FIG. 17A, the pixel arrangement structure formed of the plurality of first color sub-pixels 100, the plurality of second color sub-pixels 200 and the plurality of third color sub-pixels 300, includes a plurality of minimum repeating units 1000 arranged along the first direction, and each minimum repeating unit 1000 includes one first color sub-pixel 100, one third color sub-pixel 300 and two second color sub-pixels 200, which are distributed in two sub-pixel rows; one second color sub-pixel 200 and the first color sub-pixel 100 form a first virtual pixel, while the other second color sub-pixel 200 and the third color sub-pixel 300 form a second virtual pixel, the first color sub-pixel 100 and the third color sub-pixel 300 are shared by two virtual pixels, respectively. The virtual pixel described in the present embodiment is not a pixel in the strict sense, that is, a pixel completely defined by one blue sub-pixel, one green sub-pixel and one red sub-pixel. The minimum repeating unit here means that the pixel arrangement structure can be formed by repeated arrangement of the minimum repeating units. In the embodiment of the present disclosure, the virtual pixel method of reducing the number of sub-pixels by sharing some sub-pixels can reduce the density of physical sub-pixels on the premise of the same resolution of the constituent images, thereby reducing the process difficulty in the manufacturing process of the display device, improving the yield and reducing the cost.

For example, in the second direction, the first defining portions 410 are located at both sides of the minimum repeating units 1000 arranged along the first direction, and the second defining portions 420 are located at the interval between two sub-pixel rows in which the minimum repeating units 1000 are distributed. For example, the first virtual pixel and the second virtual pixel are alternately arranged along the first direction and the second direction, the first defining portions 410 are located at both sides of the minimum repeating units 1000 arranged along the first direction, and the second defining portions 420 pass through the interval between two sub-pixels in each virtual pixel. In the embodiment of the present disclosure, by arranging the first defining portion and the second defining portion alternately, the color shift at the edge of the display region can be reduced, and the display uniformity between the edge and of the interior of the display region can improved, which is beneficial to the color mixing of sub-pixels in the virtual pixel.

For example, FIG. 17B and FIG. 17C are planar structural views of pixel defining layer in the display region and the peripheral region at two different positions, respectively. As shown in FIG. 17B and FIG. 17C, the average height of one first defining portion 410 is greater than the average height of one second defining portion 420, and the pixel defining layer 400 in the peripheral region is a third defining portion 430. For example, the average height of the third defining portion 430 is greater than the average height of one second defining portion 420. For example, the average height of the pixel defining layer 400 in the peripheral region is approximately equal to the average height of the first defining portion 410. Here, "approximately equal to" means that considering the process deviation, the pattern area of the pixel defining layer in the peripheral region is larger than the pattern area of the pixel defining layer in the display region, so the process may cause the height of the pixel defining layer in the peripheral region to be slightly greater or less than the height of the first defining portion. For example, the average height ratio between the pixel defining layer in the peripheral region and the first defining portion is 1.1:0.9.

For example, as shown in FIG. 17B and FIG. 17C, the pixel defining layer in the peripheral region can be integrated with the first defining portions and the second defining portions. In addition to the part of the peripheral region shown in the figure, other part of the peripheral region may also include some patterns in the same layer as the pixel defining layer, for example, barrier dams for encapsulation, for example, isolation pillars for isolating organic functional film layers, and materials of the pixel defining layer remaining in some via holes or hollowed-out structures in the peripheral region. In some embodiments, the pixel defining layer in the display region is completely covered by the cathode.

For example, FIG. 17D is a planar structural view of a pixel defining layer of a display region provided by another example. As shown in FIG. 17D, the present example differs from the example shown in FIG. 17A in that the first defining portion 410 and the second defining portion 420 are substantially linear, and the first defining portion 410 and the second defining portion 420 are connected by a defining connection portion 440. For example, the first defining portion 410, the second defining portion 420, and the defining connection portion 440 can be integrated.

For example, as shown in FIG. 18, the pixel defining layer 400 includes a flat portion 404 and a slope 405, the slope 405 surrounds each opening, and the slope 405 includes a first sub-slope 4051 close to the flat portion 404 and a second sub-slope 4052 away from the flat portion 404. Along the third direction or the fourth direction, the size ratio between the orthographic projections of the first sub-slope 4051 and the second sub-slope 4052 on the base substrate is not greater than ¼, and the average slope angle of the first sub-slope 4051 is smaller than the average slope angle of the second sub-slope 4052. For example, the flat portion is a substantially flat structure, such as a portion above 80% of the maximum thickness of the pixel defining layer. Here, the slope angle is, for example, an included angle between a tangent line made from the slope surface and the surface of the base substrate, and the average value of the slope angles measured at several consecutive points or several points with fixed intervals on the surface is the average slope angle.

For example, the thickness of the pixel defining layer is generally greater than 1.1 microns, the slope angle of the opening in the pixel defining layer is 20 degrees, and the length of the slope is about 3 microns.

For example, as shown in FIG. 1A, in order to prevent the organic light emitting elements in the display region 11 close to the peripheral region 12 from being influenced by the peripheral region 12, a transition region 13 is provided in a region of the peripheral region 12 adjacent to the display region 11. Some dummy sub-pixels 31 can be provided in the transition region 13.

Figure 19:
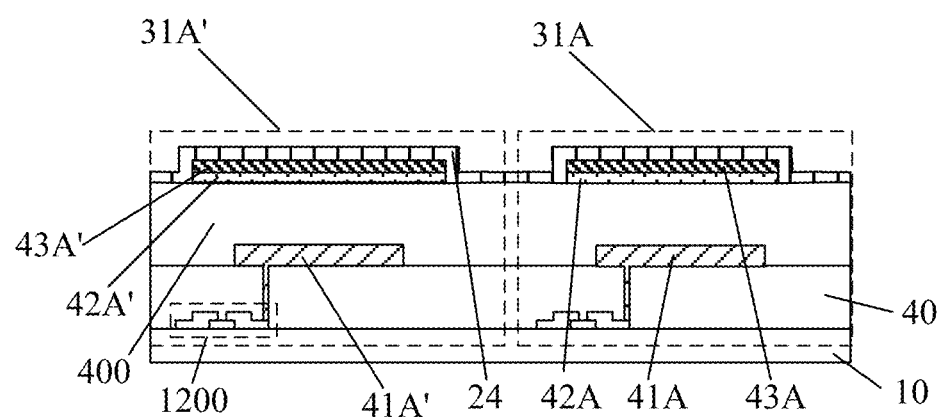
FIG. 19 is a partial cross-sectional structural view of a transition region shown in FIG. 1A.

For example, FIG. 19 is a partial cross-sectional structural view of a transition region shown in FIG. 1A. FIG. 19 illustrates an exemplary cross-sectional view of a first type of dummy sub-pixel 31A and a second type of dummy sub-pixel 31A'. As shown in FIG. 19, in the dummy sub-pixel, the pixel defining layer 400 may have no opening region. In the first type of dummy sub-pixel 31A, the second electrode 41A' is located at one side of the pixel defining layer 400 facing the base substrate 10, while the first dummy auxiliary light emitting layer 42A, the first dummy light emitting material layer 43A and the first electrode 24 are sequentially stacked at a side of the pixel defining layer 400 away from the base substrate 10.

It should be noted that, in the embodiment of the present disclosure, the pixel circuit can have a 7T1C structure (i.e., seven transistors and one capacitor) as shown in FIG. 15B, and can also have a structure including other numbers of transistors and capacitors, such as 7T2C structure, 6T1C structure, 6T2C structure or 9T2C structure, without being limited in the embodiment of the present disclosure. In the embodiment of the present disclosure, the pixels can adopt any arrangement manner, such as stripe arrangement, triangle arrangement, mosaic arrangement, etc. In the embodiment of the present disclosure, the number proportion of RGB in one pixel unit or repeating unit can be any one or a combination of two or more selected from the group consisting of 1:1:2, 1:2:1, 2:2:1, 1:1:1, 1:2:3, 3:3:2, 1:3:2, 2:3:1, 3:2:3, 2:3:3, etc. For example, RGB may be equal in size, or may not be equal in size. For example, the size of the opening in the pixel defining layer for defining the light emitting layer of B is greater than that of R, and the size of the opening in the pixel defining layer for defining the light emitting layer of B is greater than that of G. For example, the size of the opening in the pixel defining layer for defining the light emitting layer of B is greater than that of R, and the size of the opening in the pixel defining layer for defining the light emitting layer of R is greater than that of G. For example, the size of the opening in the pixel defining layer for defining the light emitting layer of B is greater than that of R, and the size of the opening in the pixel defining layer for defining the light emitting layer of R is equal to that of G. For example, the size of the opening in the pixel defining layer for defining the light emitting layer of B is equal to that of R, and the size of the opening in the pixel defining layer for defining the light emitting layer of R is greater than that of G. For example, the size of the opening in the pixel defining layer for defining the light emitting layer of R is greater than that of G. For example, the size of the opening in the pixel defining layer for defining the light emitting layer of G is greater than that of R. For example, the size of the opening in the pixel defining layer for defining the light emitting layer of G is greater than that of B. For example, the number of sub-pixels included in each repeating unit or pixel unit can be any one or a combination of two or more selected from the group consisting of 2, 3, 4, 5, 6, 7, 8, 9, 10, etc.

In some embodiments, some sub-pixels with the same color may have effective light emitting regions of different areas. For example, in some embodiments, sub-pixels included in one repeating unit or pixel unit include two green sub-pixels with the same color, two red sub-pixels with the same color, two blue sub-pixels with the same color, or two pairs of sub-pixels in which each pair of sub-pixels are of the same color (e.g., two green sub-pixels and two red sub-pixels), and the areas of the effective light emitting regions of the sub-pixels with the same color can be different. In some embodiments, in the case where sub-pixels with the same color are located at an edge position, at a special-shaped region or at a foldable region, etc., and the effective light emitting regions thereof can have different areas or shapes from the effective light emitting regions of sub-pixels with the same color in other regions.

In the above embodiments, the luminous color, size, shape and position distribution of each sub-pixel can be freely combined. For example, the size and shape of the sub-pixels can be partly the same and partly different; or totally the same; or completely different. For example, some sub-pixels have the same size but different shapes. For example, some sub-pixels have substantially the same shape outline, but different areas. For example, there may be different numbers of second color sub-pixels around different first color sub-pixels, and the number of second color sub-pixels may be 2, 3, 4, 5, 6, 7, 8, etc. These second color sub-pixels may have approximately the same distance from the first color sub-pixel, or some of these second color sub-pixels have the same distance from the first color sub-pixel and some of these second color sub-pixels have different distances from the first color sub-pixel. For example, there may be different numbers of third color sub-pixels around different second color sub-pixels, and the number of third color sub-pixels may be 2, 3, 4, 5, 6, 7, 8, etc. These third color sub-pixels may have approximately the same distance from the second color sub-pixel, or some of these third color sub-pixels have the same distance from the second color sub-pixel and some of these third color sub-pixels have different distances from the second color sub-pixel. For example, there may be different numbers of second color sub-pixels around different third color sub-pixels, and the number of second color sub-pixels may be 2, 3, 4, 5, 6, 7, 8, etc. These second color sub-pixels may have approximately the same distance from the third color sub-pixel, or some of these second color sub-pixels have the same distance from the third color sub-pixel and some of these second color sub-pixels have different distances from the third color sub-pixel.

In some embodiments, the display panel may have no touch function, that is, it does not include touch electrodes. In some embodiments, the touch electrodes of the display panel may not adopt the arrangement manner of touch electrode lines and bridge lines, and for example, they may be electrodes having a planar shape. In some embodiments, the material of the touch electrode of the display panel can be metal, or metal oxide, or any other conductive material.

For example, the transition region 13 at the outer side of the display region 11 can include two circles of dummy sub-pixels 31.

For example, in the transition region 13 at the outer side of the display region 11, the number of rows or columns of dummy sub-pixels is different at different positions, such as a rounded corner region, a notch region, and a perforated region, etc.

For example, an open mask is used to form a common layer on the integral display panel, that is, all sub-pixels adopt film layers with the same material and the same thickness, such as an electron injection layer, an electron transport layer, and the like. In addition to the organic functional layers between the cathode and the anode, the cathode and the optical functional layer located at one side of the cathode away from the anode, such as a light extraction layer (e.g., an organic layer), a transmission enhanced layer (e.g., an inorganic layer, such as LiF), etc., can also be formed by evaporation process, and for example, the open mask is used for evaporation.

For example, the distance between the boundary of the display region of the display panel and the boundary of the orthographic projection of the open mask on the display panel can be 0.3 mm.

For example, the distance between the light emitting layer at the edge of the display region and the boundary of the orthographic projection of the open mask on the display panel can be 0.01-0.02 mm.

For example, the distance between the boundary of the display region and the boundary of the first electrode of the organic light emitting element can be 0.3 mm.

The following statements should be noted:
(1) In the accompanying drawings of the embodiments of the present disclosure, the drawings involve only the structure(s) in connection with the embodiment(s) of the present disclosure, and other structure(s) can be referred to common design(s).
(2) In case of no conflict, features in one embodiment or in different embodiments can be combined.
(3) For the combination of different embodiments, some features in some embodiments can be combined with some features in other embodiments. The combination of technical features in each embodiment is added for the convenience of understanding the completeness description of the scheme, in which some features are not necessary in the embodiment in which they are located, and some features can be omitted in some cases.

What have been described above are only specific implementations of the present disclosure, the protection scope of the present disclosure is not limited thereto, and the protection scope of the present disclosure should be based on the protection scope of the claims.

What is claimed is:

1. A display panel, comprising:
a base substrate, comprising a display region and a peripheral region located at a periphery of the display region;
a plurality of first color sub-pixels, located in the display region, the plurality of first color sub-pixels being arranged along a first direction to form a plurality of first color sub-pixel rows, the plurality of first color sub-pixel rows being arranged along a second direction, and adjacent first color sub-pixel rows in the plurality of first color sub-pixel rows are shifted with each other along the first direction;
a plurality of second color sub-pixels, located in the display region, and arranged in an array along the first direction and the second direction, and four second color sub-pixels surrounding one first color sub-pixel;
a pixel defining layer, located in the display region and the peripheral region, the pixel defining layer comprising a plurality of openings to define effective light emitting regions of a plurality of sub-pixels, the plurality of first color sub-pixels comprising a plurality of first effective light emitting regions, the plurality of second color sub-pixels comprising a plurality of second effective light emitting regions, and an area of one of the plurality of second effective light emitting regions being smaller than an area of one of the plurality of first effective light emitting regions,
wherein the plurality of first color sub-pixels comprise a plurality of first color light emitting layers located in corresponding openings and on the pixel defining layer surrounding the corresponding openings, the plurality of second color sub-pixels comprise a plurality of second color light emitting layers located in corresponding openings and on the pixel defining layer surrounding the corresponding openings, the plurality of first color light emitting layers included in the plurality of first color sub-pixels are spaced apart from each other, and the plurality of second color light emitting layers included in the plurality of second color sub-pixels are spaced apart from each other;
an area ratio between orthographic projections of the first color light emitting layer and the first effective light emitting region corresponding to a same first color sub-pixel on the base substrate is a first area ratio, an area ratio between orthographic projections of the second color light emitting layer and the second effective light emitting region corresponding to a same second color sub-pixel on the base substrate is a second area ratio, and the first area ratio is less than the second area ratio;
at least part of the plurality of second effective light emitting regions have a length direction and a width direction, the length direction is an extending direction of a connecting line between two points farthest from each other in one of the plurality of second effective light emitting regions, and the width direction is substantially perpendicular to the length direction of the one of the plurality of second effective light emitting regions; for one second effective light emitting region, along the length direction, a ratio of a maximum size of the second color light emitting layer corresponding to the second effective light emitting region to a maximum size of the second effective light emitting region is a first ratio, and along the width direction, a ratio of a maximum size of the second color light emitting layer corresponding to the second effective light emitting region to a maximum size of the second effective light emitting region is a second ratio, and the first ratio is less than the second ratio;
for one second effective light emitting region, along the length direction, a difference between the maximum size of the second color light emitting layer and the maximum size of the second effective light emitting region is a first difference, and along the width direction, a difference between the maximum size of the second color light emitting layer and the maximum size of the second effective light emitting region is a second difference, and the first difference is less than the second difference.

2. The display panel according to claim 1, wherein the first area ratio and the second area ratio are in a range from 1 to 15.

3. The display panel according to claim 1, wherein the first area ratio is in a range from 2 to 6, and the second area ratio is in a range from 4 to 9.

4. The display panel according to claim 1, wherein a ratio of the maximum size of the second color light emitting layer along the length direction of the corresponding second effective light emitting region to the maximum size of the second color light emitting layer along the width direction of the corresponding second effective light emitting region is less than a ratio of the maximum size of the second effective light emitting region along the length direction thereof to the maximum size of the second effective light emitting region along the width direction thereof.

5. The display panel according to claim 1, further comprising:
a plurality of third color sub-pixels, located in the display region, the plurality of first color sub-pixels and the plurality of third color sub-pixels being alternately arranged along the first direction and the second direction, the plurality of first color sub-pixels and the plurality of second color sub-pixels being alternately arranged along a third direction as a first group, the plurality of third color sub-pixels and the plurality of second color sub-pixels being alternately arranged along the third direction as a second group, the first group and the second group being alternately arranged along a fourth direction, and the third direction and the fourth direction being intersected with both of the first direction and the second direction;
wherein the plurality of third color sub-pixels comprise a plurality of third light emitting regions, an area of one of the plurality of second effective light emitting regions being smaller than an area of one of the plurality of third effective light emitting regions, the plurality of third color sub-pixels comprise a plurality of third color light emitting layers located in corresponding openings and on the pixel defining layer surrounding the corresponding openings, and the plurality of third color light emitting layers included in the plurality of third color sub-pixels are spaced apart from each other,
an area ratio between orthographic projections of the third color light emitting layer and the third effective light emitting region corresponding to a same third color sub-pixel on the base substrate is a third area ratio, and the third area ratio is less than the second area ratio.

6. The display panel according to claim 5, wherein an area of the first effective light emitting region of one of the plurality of first color sub-pixels is smaller than an area of the third effective light emitting region of one of the plurality of third color sub-pixels, and the first area ratio is greater than the third area ratio.

7. The display panel according to claim 5, wherein the third area ratio is in a range from 1 to 15.

8. The display panel according to claim 5, wherein the third area ratio is in a range from 1.5 to 7.

9. The display panel according to claim 5, wherein each of the plurality of sub-pixels further comprises a first electrode and a second electrode of an organic light emitting element, the second electrode of the organic light emitting element is located at one side of a light emitting layer of the organic light emitting element and the pixel defining layer facing the base substrate, the second electrode of an organic light emitting element in each of the plurality of sub-pixels comprises a main body electrode, and in a direction from a center of an effective light emitting region to an edge of the effective light emitting region, a size of an overlapping part between the main body electrode and the pixel defining layer is not greater than a size of an overlapping part between the light emitting layer and the pixel defining layer.

10. The display panel according to claim 1, further comprising:

a plurality of third color sub-pixels, located in the display region, the plurality of first color sub-pixels and the plurality of third color sub-pixels being alternately arranged along the first direction and the second direction, the plurality of first color sub-pixels and the plurality of second color sub-pixels being alternately arranged along a third direction as a first group, the plurality of third color sub-pixels and the plurality of second color sub-pixels being alternately arranged along the third direction as a second group, the first group and the second group being alternately arranged along a fourth direction, and the third direction and the fourth direction being intersected with both of the first direction and the second direction;

wherein the plurality of third color sub-pixels comprise a plurality of third light emitting regions, the plurality of third color sub-pixels comprise a plurality of third color light emitting layers located in corresponding openings and on the pixel defining layer surrounding the corresponding openings, and the plurality of third color light emitting layers included in the plurality of third color sub-pixels are spaced apart from each other, the display panel further comprises:

an encapsulation layer, located in the display region and the peripheral region;

a first touch electrode layer, located at one side of the encapsulation layer away from the base substrate, the first touch electrode layer comprising a plurality of first touch electrodes extending along the first direction and a plurality of second touch electrodes extending along the second direction, each of the plurality of first touch electrodes comprising a plurality of first touch electrode units, each of the plurality of second touch electrodes comprising a plurality of second touch electrode units, the first touch electrode layer comprising a plurality of touch electrode lines, the plurality of touch electrode lines being intersected to form a plurality of first meshes, and both of each first touch electrode unit and each second touch electrode unit comprising a plurality of communicated first meshes;

a second touch electrode layer, comprising a plurality of connection bridges, the second touch electrode layer comprising a plurality of bridge lines, the plurality of bridge lines being intersected to form a plurality of second meshes, each of the plurality of connection bridges comprising a plurality of communicated second meshes, and adjacent second touch electrode units being electrically connected through at least one connection bridge;

a touch insulation layer, located between the first touch electrode layer and the second touch electrode layer, and the second touch electrode unit being electrically connected with the connection bridge through a via hole penetrating through the touch insulation layer, wherein an orthographic projection of the plurality of touch electrode lines in the display region on the base substrate is located within an orthographic projection of the pixel defining layer on the base substrate.

11. The display panel according to claim 10, wherein, in the display region, an orthographic projection of an effective light emitting region of each of the plurality of sub-pixels on the base substrate is within an orthographic projection of each of the plurality of first meshes on the base substrate; a ratio of an opening area of the first mesh corresponding to the first color sub-pixel to an area of the first effective light emitting region, and a ratio of an opening area of the first mesh corresponding to the third color sub-pixel to an area of the third effective light emitting region, are both less than a ratio of an opening area of the first mesh corresponding to the second color sub-pixel to an area of the second effective light emitting region.

12. The display panel according to claim 10, wherein each of the plurality of sub-pixels further comprises a first electrode and a second electrode of an organic light emitting element, the second electrode of the organic light emitting element is located at one side of a light emitting layer of the organic light emitting element and the pixel defining layer facing the base substrate, each of the plurality of sub-pixels further comprises a pixel circuit between the second electrode of the organic light emitting element and the base substrate, and the pixel circuit comprises a driving transistor;

at least one selected from the group consisting of the second electrode of the organic light emitting element of the first color sub-pixel, the second electrode of the organic light emitting element of the second color sub-pixel and the second electrode of the organic light emitting element of the third color sub-pixel, is overlapped with the touch electrode line; and/or the driving transistor of at least one selected from the group consisting of the first color sub-pixel, the second color sub-pixel and the third color sub-pixel, is overlapped with the touch electrode line.

13. The display panel according to claim 12, wherein the driving transistor in the second color sub-pixel is overlapped with the touch electrode line, and the second electrode of the organic light emitting element of the second color sub-pixel is substantially not overlapped with the touch electrode line;

in the first color sub-pixel, the driving transistor is overlapped with the second electrode of the organic light emitting element, but substantially not overlapped with the touch electrode line, and the second electrode of the organic light emitting element is overlapped with the touch electrode line;

in the third color sub-pixel, the driving transistor is overlapped with the second electrode of the organic light emitting element, but substantially not overlapped with the touch electrode line, and the second electrode of the organic light emitting element is overlapped with the touch electrode line.

14. The display panel according to claim 12, wherein, in the second color sub-pixel, both the second electrode of the organic light emitting element and the driving transistor are overlapped with the touch electrode line;

in the first color sub-pixel, both the second electrode of the organic light emitting element and the driving transistor are substantially not overlapped with the touch electrode line; and in the third color sub-pixel, both the second electrode of the organic light emitting element and the driving transistor are substantially not overlapped with the touch electrode line.

15. The display panel according to claim 12, wherein, in the second color sub-pixel, both the second electrode of the organic light emitting element and the driving transistor are substantially not overlapped with the touch electrode line;

in the first color sub-pixel, both the second electrode of the organic light emitting element and the driving transistor are overlapped with the touch electrode line; and in the third color sub-pixel, both the second electrode of the organic light emitting element and the driving transistor are overlapped with the touch electrode line.

16. The display panel according to claim 12, wherein, in the first color sub-pixel, the second electrode of the organic light emitting element is not overlapped with the driving transistor or the touch electrode line, and the driving transistor is overlapped with the touch electrode line; in the third color sub-pixel, the second electrode of the organic light emitting element is not overlapped with the driving transistor or the touch electrode line, and the driving transistor is overlapped with the touch electrode line; in the second color sub-pixel, the second electrode of the organic light emitting element is overlapped with the driving transistor and the touch electrode line, and the driving transistor is overlapped with the touch electrode line.

17. The display panel according to claim 12, wherein the pixel circuit of each of the plurality of sub-pixels further comprises a data writing transistor and a threshold compensation transistor;

a first electrode of the data writing transistor is electrically connected with a first electrode of the driving transistor, a second electrode of the data writing transistor is electrically connected with a data line to receive a data signal, and a gate electrode of the data writing transistor is electrically connected with a scan signal line to receive a scan signal;

a first electrode of the threshold compensation transistor is electrically connected with a second electrode of the driving transistor, a second electrode of the threshold compensation transistor is electrically connected with a gate electrode of the driving transistor, and a gate electrode of the threshold compensation transistor is electrically connected with the scan signal line to receive a compensation control signal;

the driving transistor and the threshold compensation transistor of the pixel circuit of the second color sub-pixel are both overlapped with the touch electrode line.

18. The display panel according to claim 17, wherein, in the first color sub-pixel, the second electrode of the organic light emitting element is overlapped with at least one of the threshold compensation transistor and the data writing transistor, and neither of threshold compensation transistor and the data writing transistor is overlapped with the touch electrode line; in the third color sub-pixel, the second electrode of the organic light emitting element is overlapped with at least one of the threshold compensation transistor and the data writing transistor, and neither of threshold compensation transistor and the data writing transistor is overlapped with the touch electrode line; and in the second color sub-pixel, the second electrode of the organic light emitting element is not overlapped with the threshold compensation transistor or the data writing transistor.

19. The display panel according to claim 17, wherein, in the first color sub-pixel, the second electrode of the organic light emitting element is overlapped with at least one of the threshold compensation transistor and the data writing transistor; in the third color sub-pixel, the second electrode of the organic light emitting element is overlapped with at least one of the threshold compensation transistor and the data writing transistor; and in the second color sub-pixel, the second electrode of the organic light emitting element is overlapped with the threshold compensation transistor, and the data writing transistor is overlapped with the touch electrode line.

20. A display device, comprising the display panel according to claim 1.

* * * * *